United States Patent [19]
Tukahara et al.

[11] Patent Number: 5,934,191
[45] Date of Patent: Aug. 10, 1999

[54] ELECTRONIC APPARATUS

[75] Inventors: Eiji Tukahara; Hiroshi Kuriyama; Kenichi Nakajima; Hideki Oikawa, all of Nagano; Kenji Watanabe, Tokyo; Takanobu Kameda, Tokyo; Tomoyuki Shimmura, Tokyo, all of Japan

[73] Assignees: Seiko Epson Corporation; King Jim Co., Ltd., both of Tokyo, Japan

[21] Appl. No.: 08/769,496

[22] Filed: Dec. 18, 1996

[30] Foreign Application Priority Data

Dec. 18, 1995 [JP] Japan ................................. 7-329343
Dec. 18, 1995 [JP] Japan ................................. 7-329344
Dec. 28, 1995 [JP] Japan ................................. 7-341993

[51] Int. Cl.$^6$ ........................................................ B41C 1/14
[52] U.S. Cl. ........................................ 101/128.4; 101/126
[58] Field of Search ............................... 101/128.4, 114, 101/121, 123, 126, 368, 401.1, 483, 163, 333, 334; 400/208

[56] References Cited

U.S. PATENT DOCUMENTS

| | | |
|---|---|---|
| 3,189,732 | 6/1965 | Russell . |
| 3,360,173 | 12/1967 | Miller . |
| 3,776,442 | 12/1973 | Ridley . |
| 3,881,414 | 5/1975 | D'Amato et al. . |
| 4,605,327 | 8/1986 | Ueki et al. . |
| 4,714,957 | 12/1987 | Takano . |
| 4,922,373 | 5/1990 | Ekowicki . |
| 4,960,337 | 10/1990 | Kato et al. . |
| 4,986,679 | 1/1991 | Kawaura ................................. 400/208 |
| 5,223,041 | 6/1993 | Cerney . |
| 5,252,428 | 10/1993 | Kawamoto et al. . |
| 5,333,959 | 8/1994 | Yamaguchi et al. ..................... 400/613 |
| 5,342,672 | 8/1994 | Killey . |
| 5,551,337 | 9/1996 | Miki et al. ........................... 101/128.4 |
| 5,582,105 | 12/1996 | Miki et al. ........................... 101/128.4 |
| 5,669,304 | 9/1997 | Kuriyama et al. ................... 101/404.1 |

FOREIGN PATENT DOCUMENTS 0644059  3/1995  European Pat. Off. .

*Primary Examiner*—John Hilten
*Attorney, Agent, or Firm*—Loeb & Loeb LLP

[57] ABSTRACT

An electronic apparatus has a body formed with a pocket for mounting a plurality of types of access objects each having an end surface for being accessed, therein from above. The body has an access block arranged therein for accessing the end surface of each of the plurality of types of access objects. Main support bosses are provided in the pocket in a manner extending upward for having each of the access objects being fitted thereon. The access object is comprised of a receiving member having an access surface (the end surface) for being accessed by the access block, a receiving member-attaching portion to which the receiving member is attached, and a receiving member-holding part for holding the receiving member-attaching portion. A cap is removably fitted on the access object in a manner such that the receiving member thereof is covered by the cap. The electronic apparatus is provided with an inhibiting mechanism for inhibiting a lid for closing the pocket from being closed when the access object with the cap fitted thereon is mounted in the pocket.

21 Claims, 38 Drawing Sheets

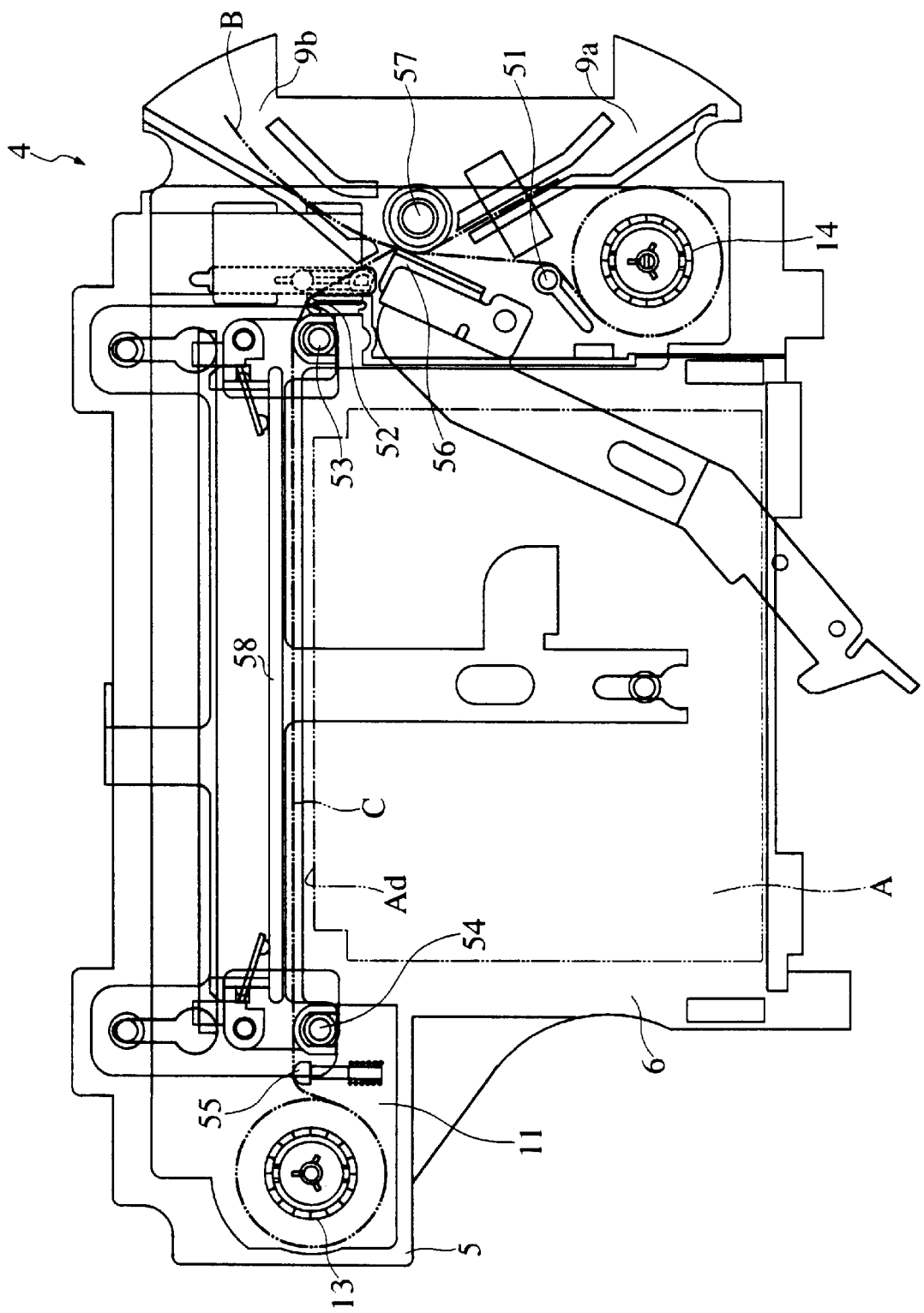

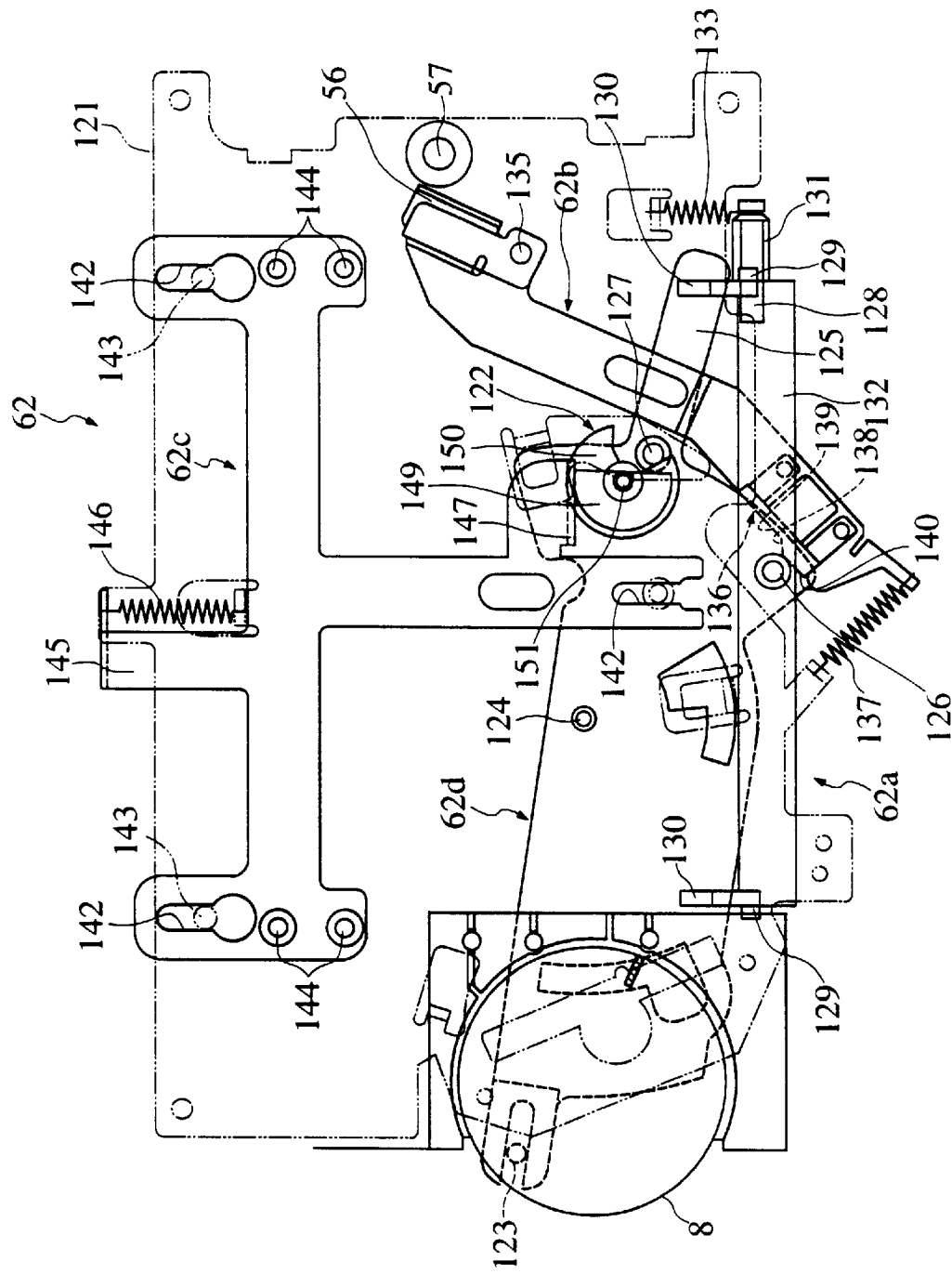
F I G. 5

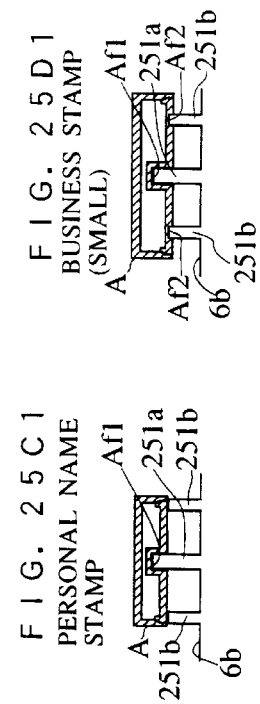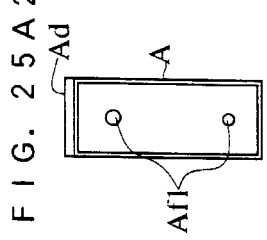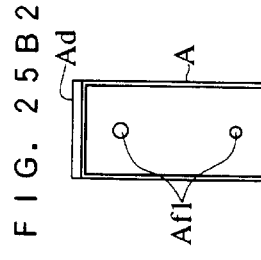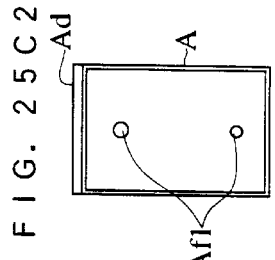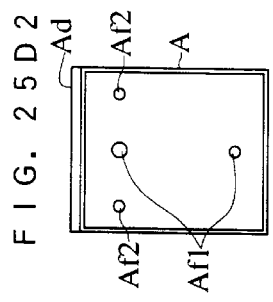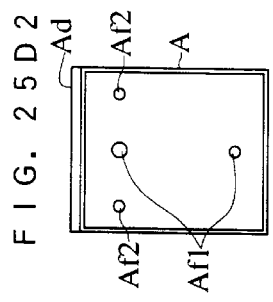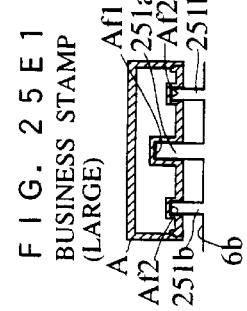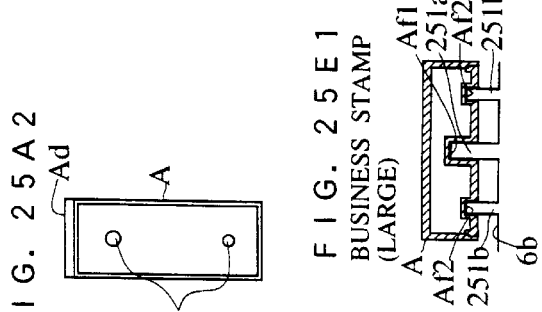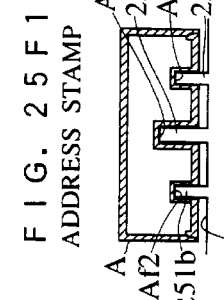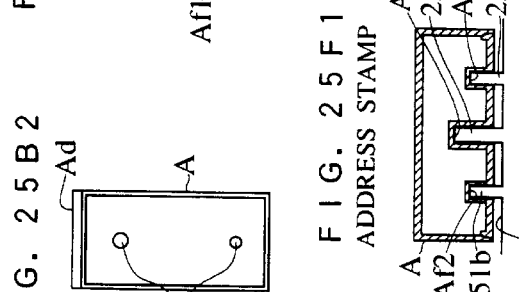

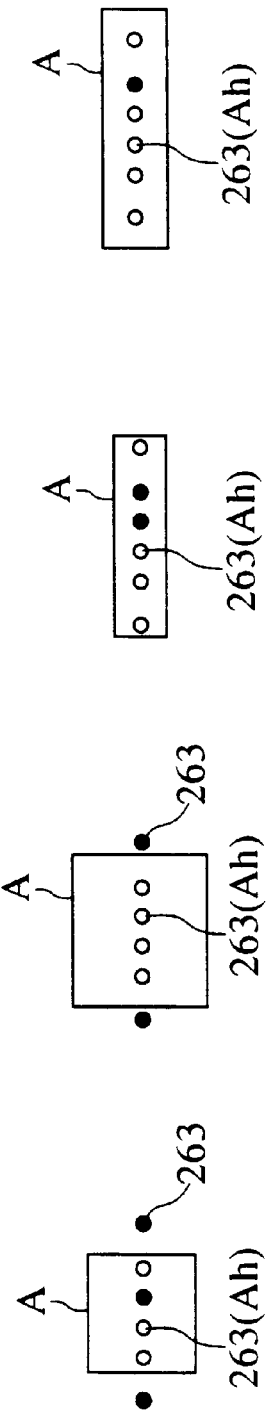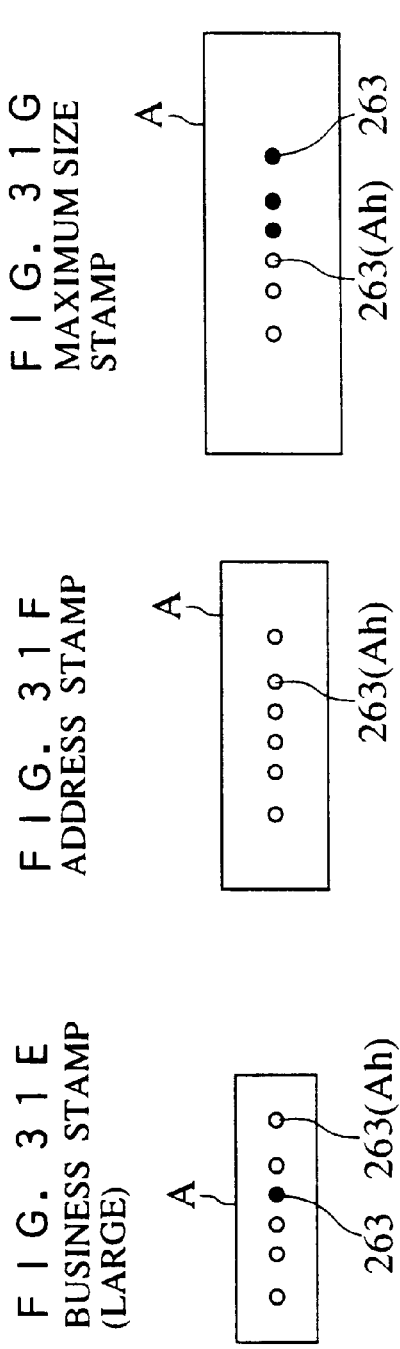

FIG. 37A  FIG. 37B  FIG. 37C
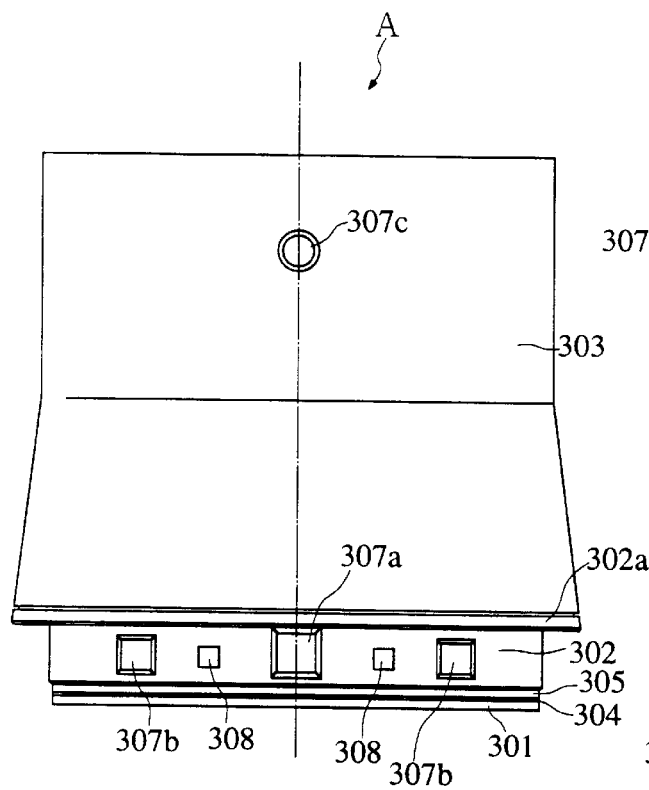
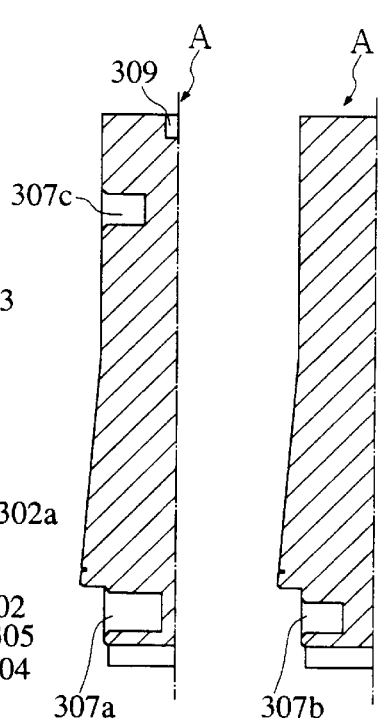
FIG. 37D  FIG. 37E
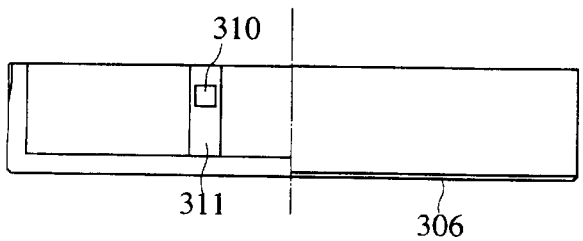

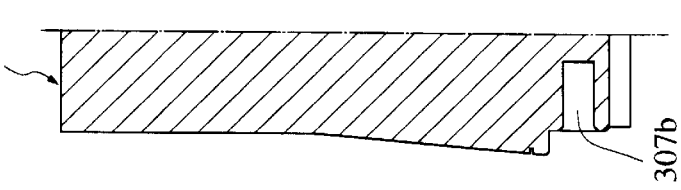
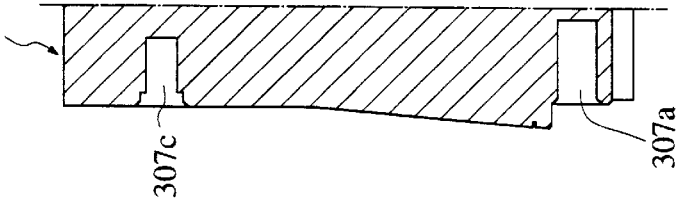
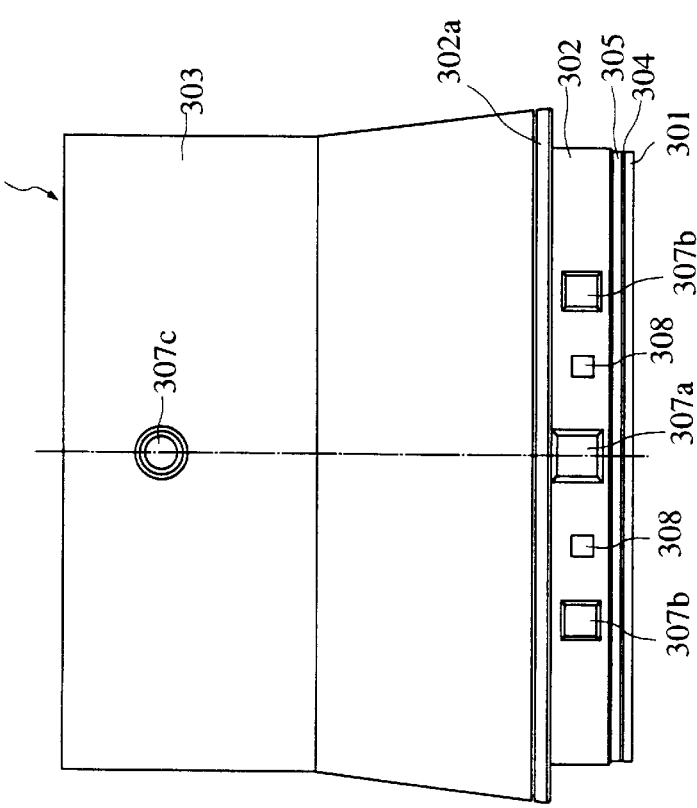
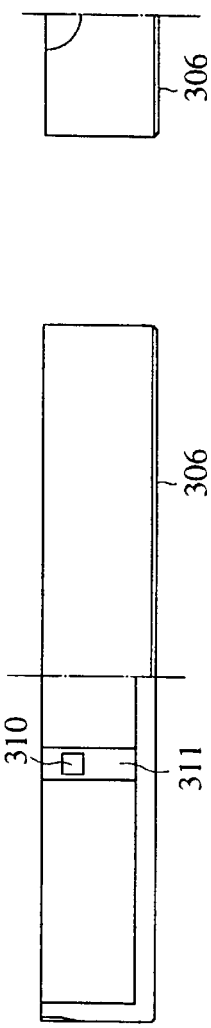

ELECTRONIC APPARATUS

BACKGROUND OF THE INVENTION

1. Field of the Invention

This invention relates to an electronic apparatus, such as a stamp-making apparatus in which an access object, such as a stamp body as a stamp-making object material, is removably mounted.

2. Prior Art

Conventionally, an electronic apparatus (stamp-making apparatus) of the above-mentioned kind uses e.g. a ribbon cartridge formed with a fitting groove in which a stamp body is fitted, and the ribbon cartridge is mounted in a pocket formed in the stamp-making apparatus. There are provided a plurality of kinds of ribbon cartridges each formed with a fitting groove which is varied in shape as viewed in plan view and depth, in a manner corresponding to a plurality of kinds of stamp bodies which are different in shape (mainly in width and thickness). Each stamp body mounted in the stamp-making apparatus by way of its ribbon cartridge is positioned such that a vertical and longitudinal center of a stamp surface of the stamp body in its mounted position is always brought to an identical position. Further, the ink ribbon carried by the ribbon cartridge has a width corresponding to the size of a stamp body, and when the ribbon cartridge is mounted in the stamp-making apparatus, the ink ribbon has to be positioned such that a vertical center, i.e. a center with respect to the width of the ink ribbon, is always brought to an identical position with respect to a print block of the stamp-making apparatus.

As can be understood from the above, in the conventional electronic apparatus (stamp-making apparatus), a stamp body and an ink ribbon therefor are arranged within a ribbon cartridge in such a manner that they are properly positioned when the ribbon cartridge is mounted in the pocket of the stamp-making apparatus. Therefore, if the ribbon cartridge is not accurately set in the pocket of the stamp-making apparatus, the stamp body and the ink ribbon are deviated from their proper positions with respect to an exposure block and the print block of the stamp-making apparatus. Further, it is required to provide as many kinds of ribbon cartridges as the kinds of stamp bodies, so that the number of associated devices or component parts to be provided is increased. Moreover, the mounting procedure is troublesome since the stamp body is first mounted in the ribbon cartridge, and then the ribbon cartridge is mounted in the pocket of the stamp body-making apparatus.

Although construction of the ribbon cartridge becomes complicated, if the fitting groove of the ribbon cartridge is formed in a manner corresponding to the size of the maximum-size stamp body of all kinds of stamp bodies so as to enable each kind of stamp body to be properly positioned within the fitting groove, it is at least possible to dispense with provision of as many kinds of ribbon cartridge as kinds of stamp bodies. However, this brings about an undesired possibility of a stamp body equipped with a cap for protection of its stamp surface being mounted in the fitting groove in its capped state. If exposure of the stamp body is carried out in this state, the stamp surface is not formed or engraved, i.e. the exposure is in vain. Provision of a sensor for detecting improper mounting of a ribbon cartridge having the stamp body mounted in its capped state will solve this problem. However, the provision of such a sensor makes the stamp-making apparatus complicated not only in construction but also in a manner of control.

SUMMARY OF THE INVENTION

It is a first object of the invention to provide an electronic apparatus which is simple in construction and permits access objects different in shape to be easily and accurately mounted in a body thereof.

It is a second object of the invention to provide an electronic apparatus which is simple in construction and prevents an access object from being accessed with a cap fitted thereon.

To attain the first object, according to a first aspect of the invention, there is provided an electronic apparatus, comprising a body formed with a pocket for mounting a plurality of types of access objects therein from above, each of the plurality of types of access objects having an end surface for being accessed, the pocket having a bottom, access means arranged on the body for accessing the end surface of the each of the plurality of types of access objects, and a plurality of main support bosses provided on the bottom of the pocket in a manner extending upward, the each of the plurality of types of access objects being fitted on the plurality of main support bosses.

According to the electronic apparatus of the first aspect of the invention, each access object is mounted in the pocket by being fitted on the plurality of main support bossed provided on the bottom of the body of the electronic apparatus. Therefore, it is not required to provide as many kinds of component parts on which a corresponding access object is mounted, and which is mounted in the body in a state having the access object mounted thereon, separately, as the plurality of types of access objects. Further, mounting of the access object on the body of the electronic apparatus can be effected only by one step with ease.

In a preferred embodiment, the end surface of the each of the plurality of types of access objects is different in length of a side thereof parallel, in a mounted state, to the bottom of the pocket, and the plurality of main support bosses are arranged on an imaginary line on the bottom of the pocket which is central with respect to width of the pocket.

According to this preferred embodiment, the plurality of main support bosses are arranged on the imaginary line on the bottom of the pocket which is central with respect to width of the pocket, and the access object is fitted thereon. Therefore, even if access objects different in shape are mounted in the pocket, each of them can be mounted in a stable manner such that a center of the access object which is central with respect to the width of the access surface is always brought to an identical position.

To this end, it is preferred that the each of the plurality of types of access objects is in the form of a prism and formed with a plurality of boss holes on an imaginary perpendicular line which is perpendicular to the end surface and central with respect to the side of the end surface parallel, in a mounted state, to the bottom of the pocket, in a manner corresponding to the plurality of main support bosses arranged on the bottom of the pocket.

According to this preferred embodiment, the access object is mounted in the pocket of the electronic apparatus such that the plurality of boss holes formed in the bottom thereof are fitted on the plurality of main support bosses provided on the bottom of the pocket in a manner extending upward. Therefore, even if there is room between the pocket and each access object, the access object can be accurately set to a desired or predetermined position with ease.

Preferably, the electronic apparatus includes at least one pair of auxiliary support bosses arranged on the bottom of the pocket at locations axisymmetric with respect to the imaginary line on the bottom of the pocket.

According to this preferred embodiment, the plurality of main support bosses and the at least one pair of auxiliary support bosses enable an access object which is large in width to be set in the pocket in a stable manner.

Further preferably, the at least one pair of auxiliary support bosses are arranged such that the at least one pair of auxiliary support bosses are positioned outside one of the plurality of types of access objects which is small in width, when the one of the plurality of types of access objects which is small in width is mounted in the pocket.

According to this preferred embodiment, it is not required to form auxiliary boss holes in an access object which is small in width. Further, this makes it possible to provide the pair of auxiliary support bosses at locations sufficiently spaced from each other. Therefore, it is possible to set the access object which is large in width in the pocket in a stable manner.

Preferably, the plurality of boss holes are formed to respective depths in a manner such that the access surface of the each of the plurality of types of access objects mounted in the pocket is at an identical level.

According to this preferred embodiment, it is possible to set various kinds of access objects such that each access object is always brought to an identical position not only with respect to width of the access object (or in a longitudinal direction), but also with respect to thickness of the same (or in a vertical direction), only by varying the depth of each boss hole.

Preferably, the access means is an exposure system, and the each of the plurality of types of access objects is a stamp body having the access surface which is exposed to light by the exposure system to form a stamp surface.

According to this preferred embodiment, the stamp surface of each of stamp bodies having different shapes can be accurately exposed to light without suffering from an error in positioning, whereby stamp characters can be formed in the stamp surface with accuracy.

In another preferred embodiment, the plurality of types of access objects have thicknesses different from each other, and each of the plurality of types of access objects has a plurality of boss holes formed in a bottom thereof in a manner corresponding to the plurality of the main support bosses, and the plurality of boss holes are formed to different depths between the plurality of types of access objects in a manner such that a center of the each of the plurality of types of access objects which is central with respect to a thickness thereof becomes identical in level with respect to the access means.

According to this preferred embodiment, the access object is mounted in the pocket of the electronic apparatus such that the plurality of boss holes formed in the bottom thereof are fitted on the plurality of main support bossed provide on the bottom of the pocket in a manner extending upward. Therefore, the access object can be directly mounted in the pocket, and stably in a state lifted above the bottom of the pocket. Further, by merely forming each boss hole to a varied depth such that the center of each access object which is central with respect to the thickness thereof is brought to an identical level with respect to the electronic apparatus, it is possible to set each of various types of access objects, particularly an access surface thereof, to the identical level with respect to the electronic apparatus.

Preferably, the plurality of main support bosses are arranged on an imaginary line on the bottom of the pocket which is central with respect to width of the pocket, and the plurality of boss holes are formed on an imaginary perpendicular line which is perpendicular to the end surface and central with respect to the side of the end surface parallel, in a mounted state, to the bottom of the pocket, in a manner corresponding to the plurality of main support bosses arranged on the bottom of the pocket.

According to this preferred embodiment, since each of various types of access objects can be supported within the pocket at a longitudinally-balanced position, the access object can be supported in a stable manner. Further, the each of various types of access objects can be set in the pocket such that each access object, particularly an access surface thereof, is always brought to an identical position with respect to the electronic apparatus.

Preferably, at least a pair of auxiliary support bosses are arranged at axisymmetric locations with respect to the imaginary line on the bottom of the pocket.

According to this preferred embodiment, the plurality of main support bosses and the at least one pair of auxiliary support bosses enable an access object which is large in width to be set in the pocket in a stable manner.

To attain the second object, according to a second aspect of the invention, there is provided an electronic apparatus including a body, and access means arranged in the body, the body being formed with a pocket in which an access object is mounted, the access object including a receiving member having an access surface for being accessed by the access means, a receiving member-attaching portion to which the receiving member is attached, and a receiving member-holding part for holding the receiving member-attaching portion, the access object having a cap removably fitted thereon in a manner such that the receiving member thereof is covered by the cap.

The electronic apparatus according to the second aspect of the invention is characterized by comprising a lid for opening and closing the pocket, and inhibiting means for inhibiting the lid from being closed when the access object with the cap fitted thereon is mounted in the pocket.

According to the electronic apparatus of the second aspect of the invention, the inhibiting means is provided for inhibiting the lid from being closed when the access object with the cap fitted thereon is mounted in the pocket. Therefore, the user notices abnormality in mounting of the access object, since he cannot close the lid, and then find that the cap is fitted on the access object. Therefore, it is impossible for the access object to be set in the pocket with its cap fitted thereon, as if properly set.

Preferably, the inhibiting means comprises a projection formed on an inner side of the lid for abutting on the cap fitted on the access object in the course of closing operation of the lid.

Alternatively, the inhibiting means comprises a projection formed on a wall forming the pocket for abutting on the cap fitted on the access object to thereby hold the access object lifted from the pocket.

According to these preferred embodiments, the inhibiting means can be formed by a simple construction of a projection formed on the lid or the wall forming the pocket.

More preferably, the wall forming the pocket is a bottom wall, the bottom wall having a first support boss provided thereon in a manner extending upward for positioning the access object mounted in the pocket, the receiving member-attaching portion of the access object being formed with a first boss hole in a manner corresponding to the first support boss such that the first support boss is fitted therein, and the projection is the first support boss, the cap being fitted on the receiving member-attaching portion in a manner such that the cap closes the first boss hole.

According to this preferred embodiment, the first support boss for positioning the access object within the pocket can be utilized for the projection of the inhibiting means. Further, in this case, the access object with its cap fitted thereon is mounted in the pocket in a lifted state. Therefore, before closing of the lid is tried in vain, the abnormality in the mounting of the access object can be recognized. Further, the boss hole in the access object is concealed by the cap fitted thereon. This is also preferable from a viewpoint of design.

Preferably, the first support boss has a columnar shape, and the first boss hole has an interior in the form of a prism.

According to this preferred embodiment, the first support boss fitted in the first boss hole is in line contact with peripheral walls defining the first boss hole. Therefore, without spoiling the accuracy of positioning of the access object, it is possible to mount or remove the access object more easily than when the first boss is in surface contact with the peripheral walls defining the first boss hole. Particularly, it is possible to compensate for variations in dimensions and location of the first boss hole caused by the manufacturing process.

Further preferably, the wall forming the pocket is formed with a second support boss for positioning the access object mounted in the pocket, the receiving member-holding portion of the access object being formed with a second boss hole in a manner corresponding to the second support boss such that the second support boss is fitted therein, and the second boss hole is formed such that the second boss hole has a shape which provides clearance with respect to the second boss in a direction of alignment of the first support boss and the second support boss.

According to this preferred embodiment, the second boss and the second boss hole function as a stop of rotation of the access object in effecting positioning of the same, and compensate for variations in distances between the first boss hole and the second boss hole caused by the manufacturing process. Further, since the first boss hole is fixed, and the second boss hole plays the role of compensating for or absorbing the above-mentioned variations, by clearance provided by its shape, the receiving member of the access object which is close to the first boss hole can be accurately positioned.

Preferably, the body of the electronic apparatus comprises an exposure system, the access object being a stamp body having the access surface of the receiving member for being exposed to light by the exposure system to form a stamp surface.

According to this preferred embodiment, the stamp body with its cap fitted thereon cannot be set in the pocket as if properly, e.g. in a manner permitting opening and closing of the lid, and the exposure of the stamp body cannot be effected in the capped state of the stamp body. Therefore, an error in mounting the stamp body and an error in the exposure resulting therefrom can be effectively prevented.

The above and other objects, features, and advantages of the invention will become more apparent from the following detailed description taken in conjunction with the accompanying drawings.

BRIEF DESCRIPTION OF THE DRAWINGS

FIG. 2 is a plan view showing an internal construction of a mechanical block of the stamp-making apparatus;

FIG. 5 is a plan view showing the function link mechanism in its "OPEN" position;

FIGS. 25A1 and 25A2 are diagrams which are useful for explaining construction of a stamp body of a small square stamp, FIG. 25A1 showing the stamp body in a state mounted in the pocket;

FIGS. 25B1 and 25B2 are diagrams which are useful for explaining construction of a stamp body of a large square stamp, FIG. 25B1 showing the stamp body in a state mounted in the pocket;

FIGS. 25C1 and 25C2 are diagrams which are useful for explaining construction of a stamp body of a personal name stamp, FIG. 25C1 showing the stamp body in a state mounted in the pocket;

FIGS. 25D1 and 25D2 are diagrams which are useful for explaining construction of a stamp body of a small business stamp, FIG. 25D1 showing the stamp body in a state mounted in the pocket;

FIGS. 25E1 and 25E2 are diagrams which are useful for explaining construction of a stamp body of a large business stamp, FIG. 25E1 showing the stamp body in a state mounted in the pocket;

FIGS. 25F1 and 25F2 are diagrams which are useful for explaining construction of a stamp body of an address stamp, FIG. 25F1 showing the stamp body in a state mounted in the pocket;

FIGS. 25G1 and 25G2 are diagrams which are useful for explaining construction of a stamp body of a maximum-size stamp, FIG. 25G1 showing the stamp body in a state mounted in the pocket;

FIG. 31A is a diagram showing a pattern for discriminating a stamp body of a small square stamp;

FIG. 31B is a diagram showing a pattern for discriminating a stamp body of a large square stamp;

FIG. 31C is a diagram showing a pattern for discriminating a stamp body of a personal name stamp;

FIG. 31D is a diagram showing a pattern for discriminating a stamp body of a small business stamp;

FIG. 31E is a diagram showing a pattern for discriminating a stamp body of a large business stamp;

FIG. 31F is a diagram showing a pattern for discriminating a stamp body of an address stamp;

FIG. 31G is a diagram showing a pattern for discriminating a maximum size stamp body;

FIG. 37A is a diagram showing a surface of the stamp body of the large business stamp via which the stamp body is mounted on the bottom of the pocket;

FIG. 37B is a partial cross-sectional view of the FIG. 37A stamp body taken along a line extending through a main boss hole in the direction of length of the stamp body;

FIG. 37C is a partial cross-sectional view of the FIG. 37A stamp body taken along a line extending through an auxiliary boss hole in the direction of length of the stamp body;

FIG. 37D is a partially cutout view of the inside and outside of a cap for being fitted on the FIG. 37A stamp body;

FIG. 37E is a partial side elevation of the FIG. 37D cap;

FIG. 38A is a diagram showing a surface of the stamp body of the address name stamp via which the stamp body is mounted on the bottom of the pocket;

FIG. 38B is a partial cross-sectional view of the FIG. 38A stamp body taken along a line extending through a main boss hole in the direction of length of the stamp body;

FIG. 38C is a partial cross-sectional view of the FIG. 38A stamp body taken along a line extending through an auxiliary boss hole in the direction of length of the stamp body;

FIG. 38D is a partially cutout view of the inside and outside of a cap for being fitted on the FIG. 38A stamp body;

FIG. 38E is a partial side elevation of the FIG. 38D cap; and

DETAILED DESCRIPTION

The invention will now be described in detail with reference to the drawings showing embodiments thereof.

Figure 1A:
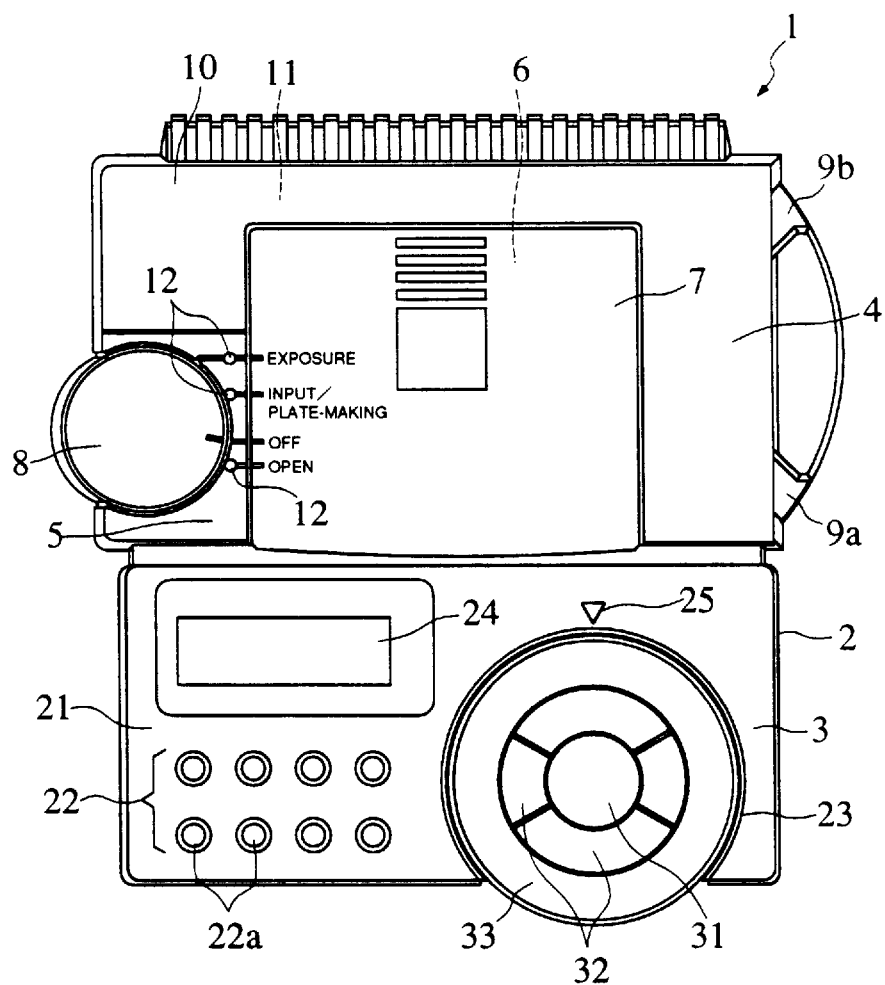
FIG. 1A is a plan view showing an appearance of a stamp-making apparatus as an electronic apparatus according to an embodiment of the invention.
Figure 1B:
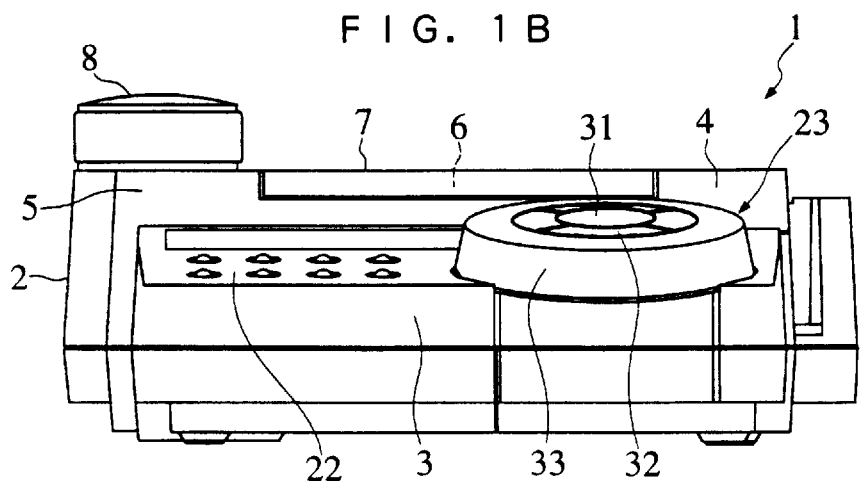
FIG. 1B is a front view of an appearance of the stamp-making apparatus.

Referring first to FIGS. 1A and 1B, there is shown a stamp-making apparatus 1 for making a stamp body, as an embodiment of an electronic apparatus of the present invention. The stamp-making apparatus makes a desired stamp by exposing a stamp body having a stamp surface made of ultraviolet-curing resin to ultraviolet rays via a mask of an ink ribbon printed with a stamp image including images of characters and pictures. FIG. 1A is a plan view of the apparatus, while FIG. 1B is a front elevation of the same.

As shown in these figures, the stamp-making apparatus 1 includes a casing 2 having upper and lower divisional portions, an electronic block 3 arranged in a front part of the casing 2, and a mechanical block 4 arranged in a rear part of the same. The mechanical block 4 is comprised of a mechanical block body 5, a pocket 6 formed in a central area of the mechanical block for receiving therein a stamp body A as a stamping-making object material from which a stamp is made, and a lid 7 for opening and closing the pocket 6, which is formed with a window. In a left side portion of the mechanical block 4 as viewed in the figures, a function switch (operating knob) 8 is provided for switching the operation of the stamp-making apparatus 1 e.g. to printing or exposure, as well as for permitting the lid 7 to be opened. In a right side portion of the mechanical block 4, an inserting slot 9a for feeding a plate-making sheet B from which a stamp character label, referred to hereinafter, is made, and a take-out slot 9b for delivering the plate-making sheet B. Further, the mechanical block 4 has a maintenance cover 10 removably mounted on part thereof outside the pocket 6, and an ink ribbon cartridge 11 carrying an ink ribbon C is mounted under the maintenance cover 10.

The electronic block 3 has an operating block 21 arranged in a top thereof and contains an information processing system therein. The operating block 21 includes a push button group 22 and an operating dial 23 which form an input block of the information processing system, and an indicator 24 which forms an output block of the same. The operating dial 23 has a trial structure of an execution key 31 having a circular shape and arranged in the center thereof, a cursor/conversion key 32 having four divisional blocks arranged along the periphery of the execution key 31 to form a annular shape, and a character entry key 33 having an annular shape and arranged along the outer periphery of the cursor/conversion key 32. On the surface of the character entry key 33, hirakana characters representative of the Japanese syllabary, not shown, are printed. The entry of stamp characters is carried out by first setting each of desired hirakana characters to a triangle mark 25 by turning the character entry key 33, and pushing the execution key 31 whenever each of the desired hirakana characters is set to the triangle mark 25, followed by converting desired ones of the entered hirakana characters to kanji characters by operating the cursor/conversion key 32. When desired stamp characters are formed on the display 24, a predetermined button 22a of the push button group 22 is pushed to settle the inputting of the desired characters. The operating dial 23 is constructed such that the character entry key 33 alone can rotate in both directions.

Now, a sequence of operations for making a stamp will be briefly described with reference to FIGS. 1A and 1B, and 2. First, the function switch 8 is operated to open the lid 7, and a stamp body A is set in the pocket 6. As the stamp body A is set, a type or kind thereof is detected by a detecting device 66, described in detail hereinafter, and based on results of the detection, the information processing system controls the input block and the output block thereof. Then, the function switch 8 is operated to shift the function of the apparatus to plate-making, and the push button group 22 and the operating dial 23 are operated to enter stamp characters. When the entry of stamp characters is completed, the plate-making sheet B on which a stamp character label is provided is set by inserting the same into the inserting slot 9a.

Then, a predetermined button 22a of the push button group 22 is operated to cause the apparatus to execute the plate-making operation, i.e. printing of the stamp characters. The printing is effected simultaneously on the ink ribbon C and the plate-making sheet B. When the printing is completed, the ink ribbon C is fed or advanced to set a portion thereof printed with the stamp characters for exposure to ultraviolet rays, and at the same time plate-making sheet B is discharged from the take-out slot 9b. When it is confirmed by the plate-making sheet B that there is no error in the printed stamp characters, the function switch 8 is operated to shift the function of the apparatus to exposure, thereby causing the same to perform exposure of the stamp body to ultraviolet rays. The apparatus may be configured such that after operating the function switch 8, a predetermined button 22a is operated to cause the apparatus to start the exposure.

When the exposure is completed, the function switch 8 is operated to open the lid 7, and then the stamp body A is removed from the pocket 6 for washing. The washing completes the stamp. Before or after completion of the stamp, the stamp character label is peeled off the plate-making sheet B to attach the same to the back of the stamp.

Next, the component devices of the stamp-making apparatus 1 will be described, one by one.

The function switch 8 arranged in the mechanical block 4 can be turned clockwise from an "OFF" position in which the apparatus is set on stand-by to an "OPEN" position, or anticlockwise from the "OFF" position to an "INPUT/PLATE-MAKING" position, and further to an "EXPOSURE" position (see FIG. 1A). In the "OPEN" position, the lid 7 provided on the pocket 6 is popped up to open, and in the "INPUT/PLATE-MAKING" position and the "EXPOSURE" position, mechanical operations of a printing block and a stamp body A, referred to hereinafter, are carried out. The function switch 8 also serves as a switch for switching between electrical modes of the apparatus. By an electrical mode-switching operation of the function switch 8, a corresponding one of lamps 12 (no lamp for the "OFF" position) provided adjacent to the function switch 8 is lighted to indicate the selected position.

The ribbon cartridge 11 is constructed such that it is removable from the mechanical block body 5, and it is replaceable together with a casing thereof when the ink ribbon C is used up. As shown in FIG. 2, the ribbon cartridge 11 has a take-up reel 13 arranged at one end thereof and a supply reel 14 arranged at the other end thereof. The ink ribbon C is rolled out from the supply reel 14, fed along a feed path in the form of a rotation of an inverted-L shape as viewed in FIG. 2, and taken up by the take-up reel 13. The feed path in the form of a rotation of an inverted-L shape has a shorter side portion which the printing block faces and a longer side portion which the exposure block faces. The printing block faces the ink ribbon C and the plate-making sheet B simultaneously, and the exposure block faces the ink ribbon C printed with the image of the stamp characters.

The ink ribbon C is comprised of a transparent ribbon tape and ink coated thereon. In the present embodiment, it has a thickness of 6 μm. When the printing block of the apparatus carries out printing on the ink ribbon C, a portion of ink coated on the ink ribbon, which defines a character, is transferred to the plate-making sheet B, whereby the ribbon tape of the ink ribbon C is formed with a negative image by a transparent portion from which the portion of ink defining the character has been transferred, while the plate-making sheet B is formed with a positive image by the transferred portion of ink defining the character. The ink ribbon C is sent forward to the exposure block, where the negative image-formed portion thereof is used as a mask in carrying out the exposure, while the plate-making sheet B is delivered from the apparatus for a user to confirm the stamp characters and affix part (label) of the plate-making sheet B to the stamp thus made.

Figure 33:
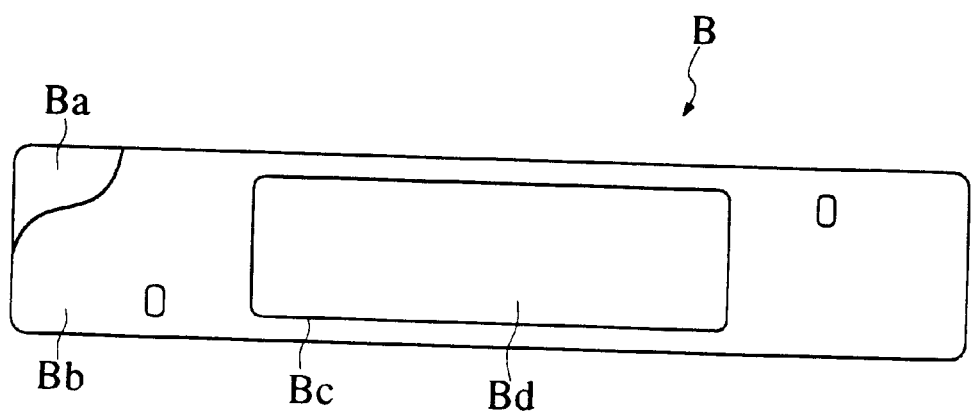
FIG. 33 is a diagram showing a structure of a plate-making sheet.

As shown in FIG. 33, the plate-making sheet B is a laminate of a base sheet B*a* and an adhesive sheet B*b*, generally in the form of a strip. The adhesive sheet B*b* is formed with cutting lines B*c* defining a rectangular area. The rectangular area of the adhesive sheet B*b* is peeled off the base sheet B*a* along the cutting lines B*c* to form the stamp character label B*d* to be affixed to the back of the stamp. There are provided several types of the stamp body A which are different in shape from each other so as to meet needs of stamps, and there are also provided respective corresponding types of plate-making sheets which are different in the shape of an area of the stamp character label B*d* (shape and size of an area defined by cutting lines). The plate-making sheet B is color-coded or specified by color for easy discrimination according to the type thereof.

Figure 32:
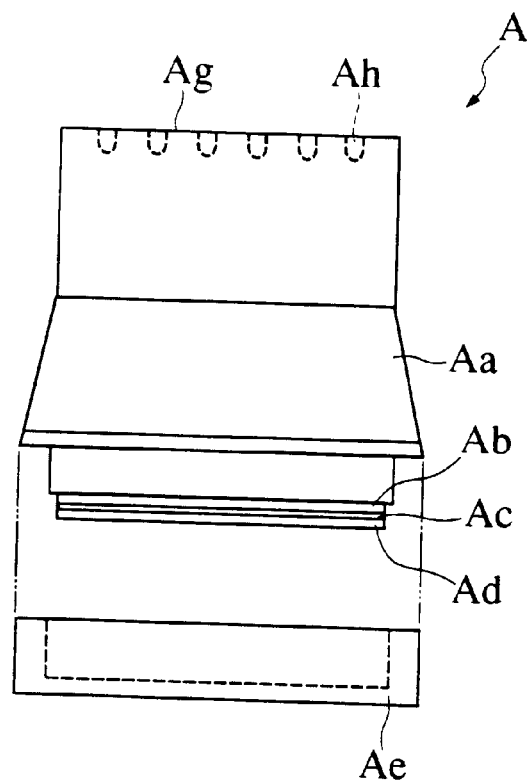
FIG. 32 is a diagram showing a structure of a stamp body.

On the other hand, as shown in FIG. 32, the stamp body A is comprised of a stock A*a* (formed of a resin in the present embodiment), a thin sponge A*b* (foamed urethane) affixed to a front end of the stock A*a*, a non-ultraviolet-curing resin base A*c* affixed to the sponge A*b*, and an ultraviolet-curing resin affixed to the resin base A*c* for forming a stamp surface A*d*. The ultraviolet-curing resin portion (stamp surface A*d*) of the stamp body A is exposed to ultraviolet rays with the ink ribbon C as a mask, whereby portions of the stamp surface A*d* corresponding to the stamp characters are cured. In this state, the stamp body A is taken out of the pocket 6, and washed with water to remove uncured portions of the stamp surface, which are soluble in water, from the stamp surface A*d*. Thus the stamp is completed. Symbol A*e* in the figure designates a cap made of resin. In stead of the ultraviolet-curing resin, ultraviolet-softening resin may be used. In such a case, the reversed relationship of the ink ribbon C and the plate-making sheet B in respect of positiveness and negativeness makes it possible to make the same stamp as made in the present embodiment.

As shown in FIG. 2, in the stamp-making apparatus 1, the ink ribbon C wound around the supply reel 14 is rolled out therefrom, and fed via a first path-setting pin 51 to the printing block, and further via a second path-setting pin 52 and a first guide pin 53 to the exposure block. From the exposure block, the ink ribbon C is advanced to the take-up reel 13 via a second guide pin 54 and a tension pin 55 to be taken up by the take-up reel 13. In the printing block, a print head 56 and a platen roller 57 arranged in a manner sandwiching the ink ribbon C operates to push the ink ribbon C forward while printing a character on the ink ribbon C. In the exposure block, a presser plate 58 holds the ink ribbon C between the stamp body A and itself to carry out the exposure of the stamp body to ultraviolet rays.

Figure 3:
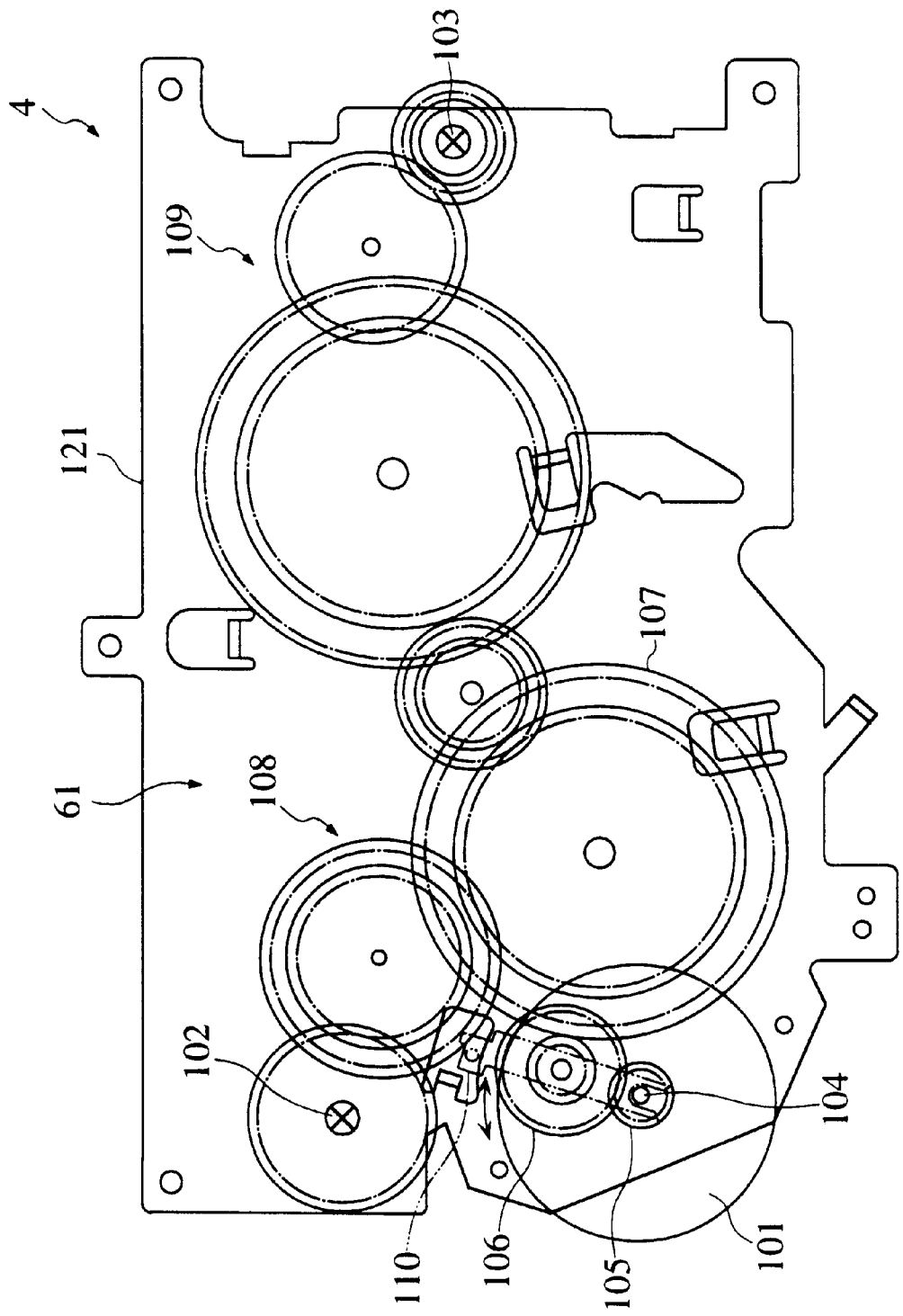
FIG. 3 is a schematic plan view showing a ribbon feeder provided in the mechanical block.
Figure 4:
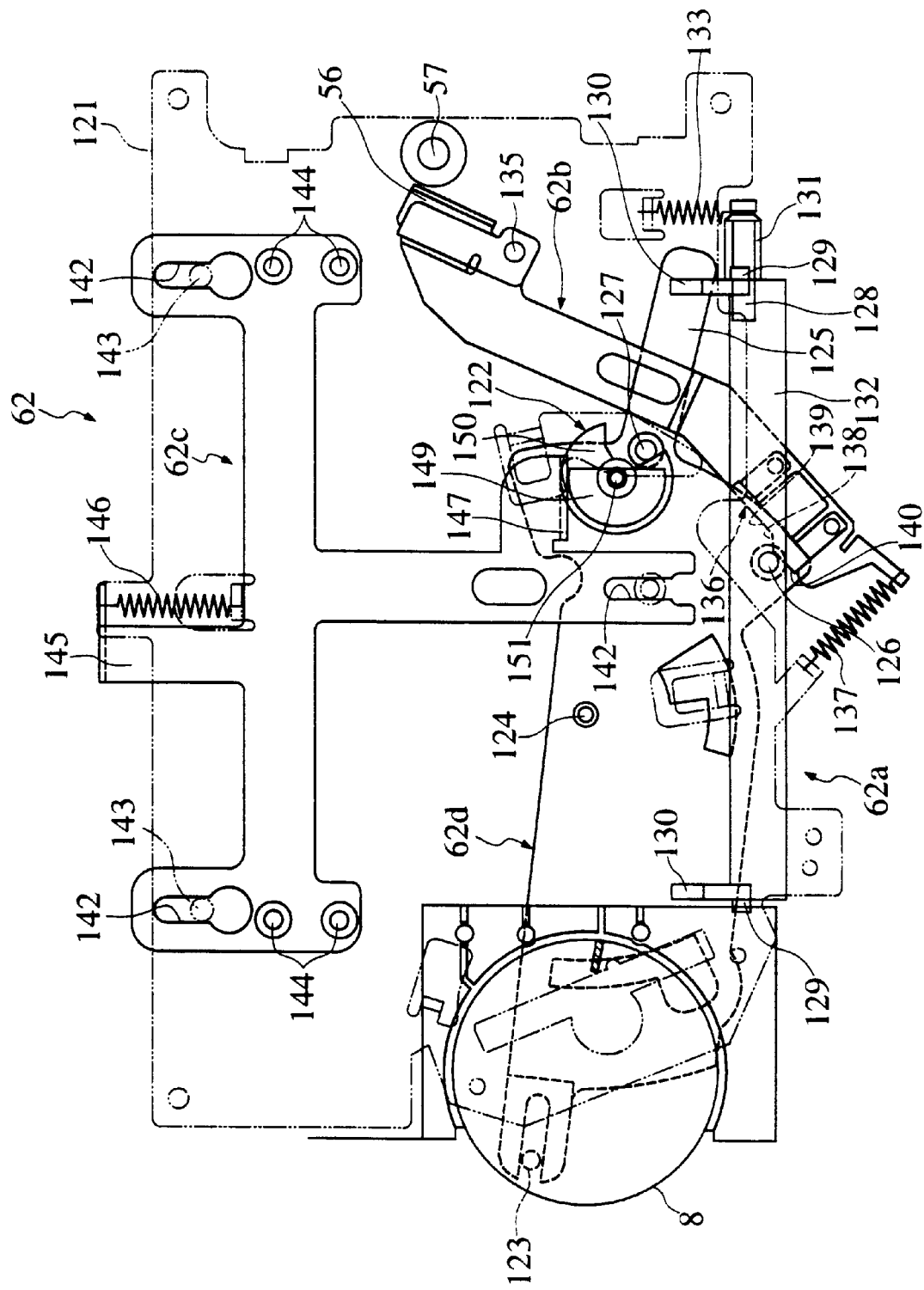
FIG. 4 is a plan view showing a function link mechanism provided in the mechanical block, in its "OFF" position.

As shown in FIG. 3, the mechanical block 4 incorporates a ribbon feeder 61 which rotates the take-up reel 13 and the platen roller 57 to feed the ink ribbon C. Further, as shown in FIG. 4, the mechanical block 4 incorporates a function link mechanism 62 comprised of a lid-opening link 62*a* for locking/unlocking the lid 7, a head-moving link 62*b* for moving the print head 56 of the printing block to and from the platen roller 57, a ribbon-holding link 62*c* for moving the presser plate 58 of the exposure block forward or backward, and a main link 62*d* for actuating the lid-opening link 62*a*, the head-moving link 62*b* and the ribbon-holding link 62*c*.

First, the ribbon feeder 61 will be described in detail with reference to FIG. 3. The ribbon feeder 61 has a drive motor 101 arranged below the bottom of the function switch 8 as a driving force source, and a reel shaft 102 fitted on the take-up reel 13 and a roller shaft 103 having the platen roller 57 fitted thereon are driven for rotation by the drive motor 101. The drive motor 101 has an output shaft 104 on which an output gear 105 is rigidly fitted. The output gear 105 is mated with a driving force-transmitting gear 106, which in turn is mated with a main gear 107. The main gear 107 transmits part of the driving force via a reel reduction gear train 108 to the reel shaft 102 for one route of transmission, and the rest of the driving force via a roller reduction gear train 109 to the roller shaft 103 for the route of transmission.

The output shaft 104 of the drive motor 101 has a clutch arm 110 rotatably supported thereon, and the driving force-transmitting gear 106 is rotatably supported on the clutch arm 110. The clutch arm 110 rotates with rotation of the output shaft 104 in a free-running manner, thereby causing the driving force-transmitting gear 106 to be mated with the main gear 107 in a disengageable manner. That is, when the driving motor 101 rotates, the clutch arm 110 rotates to cause the driving force-transmitting gear 106 to mate with the main gear 107, thereby causing the driving force of the drive motor 101 to be transmitted to the take-up reel 13 and the platen roller 57. Inversely, when the drive motor 101 is not in operation, if torque is input from the take-up reel 13 or the platen roller 57, the driving force-transmission gear 106 is moved away from the main gear 107 to be disengaged therefrom.

This makes it possible to easily pull the plate-making sheet B alone from the apparatus since the platen roller 57 readily rotates (reversely) without receiving any load of the drive motor 10, when the plate-making sheet B is erroneously inserted into the stamp-making apparatus. Alternatively, the clutch 110 may be rotated in a manner linked to the switching operation of the function switch 8. It should be noted that the reel shaft 102 is a slide shaft which absorbs a change in the circumferential speed of the taken-up reel 13 in an increasing direction as the ink ribbon C is taken up by the take-up reel 13 by occurrence of sliding.

Next, with reference to FIGS. 4 to 8, the function link mechanism 62 will be described in detail. The function link mechanism 62 is comprised of a frame 121, the lid-opening link 62*a* rotatably supported by the frame 121 in a state extending perpendicular to the frame 121, the head-moving link 62*b* in the form of a plate rotatably supported on the frame 121, the ribbon-holding link 62*c* in the form of a plate supported on the frame 121 in a manner movable forward and backward, the main link 62*d* in the form of a plate rotatably supported on the frame 121, and a ribbon-holding cam 122 interposed between the main link 62*d* and the ribbon-holding link 62*c*. Various kinds of gears of the ribbon feeder 61 are arranged between the frame 121 and the ribbon-holding link 62*c*, and the main link 62*d* is arranged below the frame 121 in a manner extending along therewith.

The main link 62*d* is engaged with an eccentric pin 123 of the function switch 8 on an input side, and is rotated about a support shaft 124 by rotation of the function switch 8 in a normal or reverse direction. The main link 62*d* has a tongue 125 integrally formed therewith at an extreme end on an output side, with a first pin 126 provided at a forward end, and a second pin 127 provided at a root of the tongue 125. The tongue 125 is engaged with a lower portion of the lid-opening link 62*a*, the first pin 126 is engaged with the head-moving link 62*b*, and further, the second pin 127 is engaged with the ribbon-holding link 62*c* via the ribbon-holding cam 122.

Figure 8:
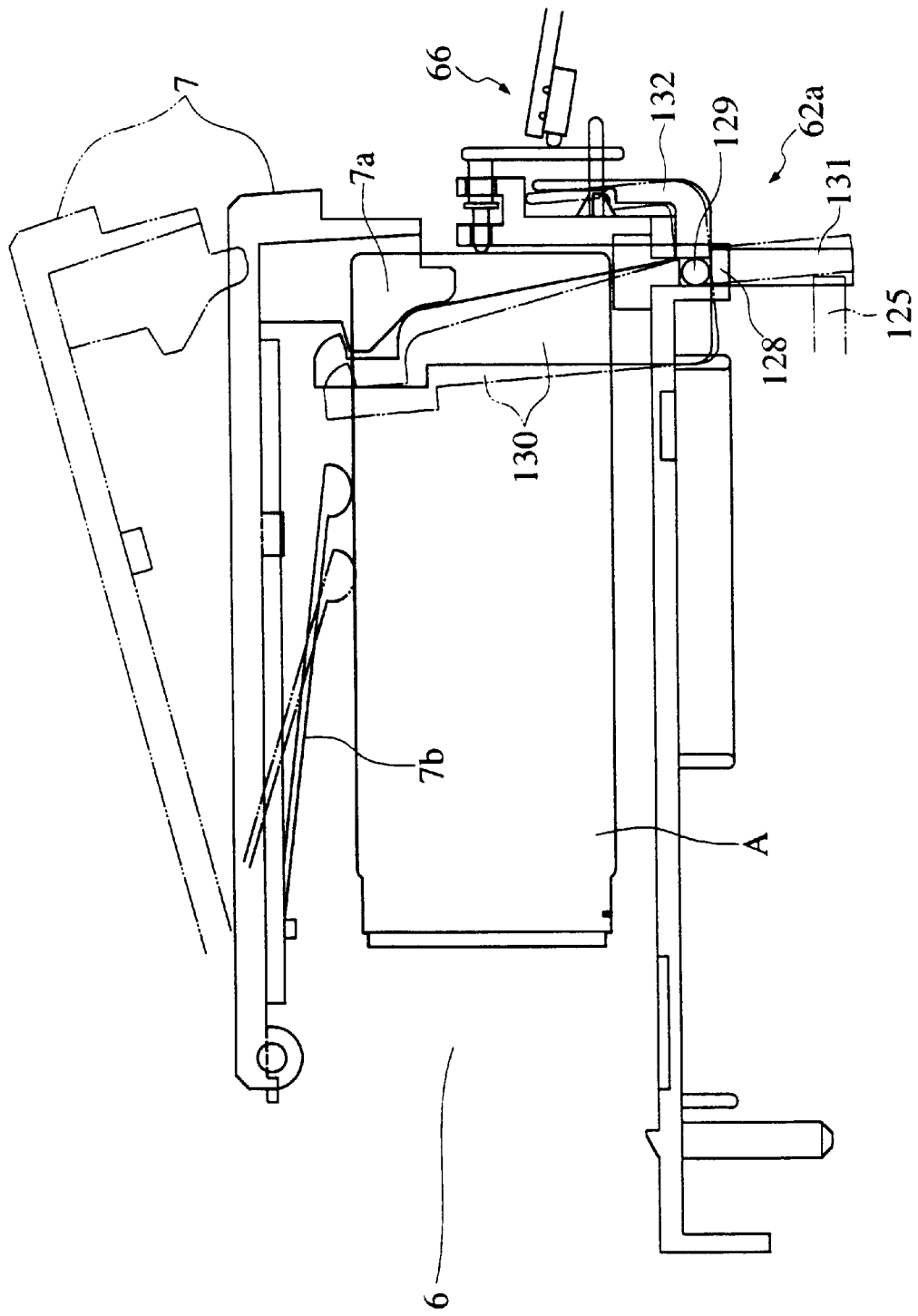
FIG. 8 is a side elevation showing a lid-opening link of the function link mechanism and component parts associated therewith.

The lid-opening link 62*a* is a unitary member comprised of an opening link body 128, a pair of support shafts 129, 129 formed at opposite longitudinal ends of the opening link body 128 in a manner projecting therefrom, a pair of hooks 130, 130 extending from the opposite ends of the opening link body 128 toward the lid 7, a lever 131 extending downward from the opening link body 128 in a manner corresponding to the tongue of the main link 62d, and a switching operation portion 132 which extends forward from the opening link body 128 in a bending manner (see FIG. 8). A coiled spring 133 is stretched between the lever 131 and the frame 121 whereby the lid-opening link 62a is urged for rotation in such a direction that the tip of a hook 130 thereof is hooked on a hook catch 7a of the lid 7.

When the function switch 8 is rotated from the "OFF" position to the "OPEN" position, the tongue 125 of the main link 62d is rotated forward to push the lever 131 of the lid-opening link 62a against the pulling force of the coiled spring 133 whereby the hook 130 is disengaged from the hook catch 7a. The underside of the lid 7 has a plate spring 7b mounted thereon for stably retaining the stamp body A received in the pocket 6. When the hook 130 is disengaged, the lid 7 is popped upward by a reactionary force of the urging force of the plate spring 7b acting on the stamp body A (see FIGS. 5 and 8). Even when no stamp body A is received within the pocket 6, the lid 7 is popped upward by the action of a lock member 171 of a lock mechanism 63 described hereinafter (see FIG. 10) when the function switch 8 is turned to the "OPEN" position.

When the lid-opening link 62a is disengaged from the lid 7, the switching operation portion 132 causes detecting ends of the detecting device 66 to project into the pocket 6. Then, when the function switch 8 rotated to the "OPEN" position is released, the coiled spring 133 acts by way of the lid-opening link 62a and the main link 62d such that the function switch 8 automatically returns from the "OPEN" position to the "OFF" position. On the other hand, when the lid 7 is closed, it is pushed toward the pocket 6 against the urging force of the plate spring 7b, whereby the hook 130 of the lid-opening link 62a climbs on the hook catch 7a to be hooked thereon.

The head-moving link 62b incorporates the print head 56 at one end thereof, and arranged such that it is rotated about a support shaft 135 provided at a holding portion of the print head 56. The head-moving link 62b is formed with an engaging surface 136 at a tail end thereof, which is brought into contact with the first pin 126 of the main link 62d, and a coiled spring 137 is stretched between the tail end of the head-moving link 62b and the frame 121. The coiled spring 137 urges the one end of the head-moving link 62b for rotation about the support shaft 135 toward the platen roller 57, and at the same time rotationally urges the engaging surface 136 against the first pin 126. The engaging surface 136 includes a sloped surface 138, a first stationary surface 139 provided on the one end side of the sloped surface 138 in a manner forming an arcuate surface concentric with the support shaft 124 of the main link 62d and a second stationary surface 140 provided on the tail end side of the sloped surface 138. When the first pin 126 is brought into contact with the second stationary surface 140 through rotation of the main link 62d, the print head 56 is away from the platen roller 57, whereas when the first pin 126 faces the first stationary surface 139, the print head 56 is in contact with the platen roller 57. When the ribbon cartridge 11 is mounted or removed, the head-moving link 62b is further rotated by means of a jig, not shown in the figure, in such a direction that the print head 56 is moved away from the platen roller 57.

Figure 6:
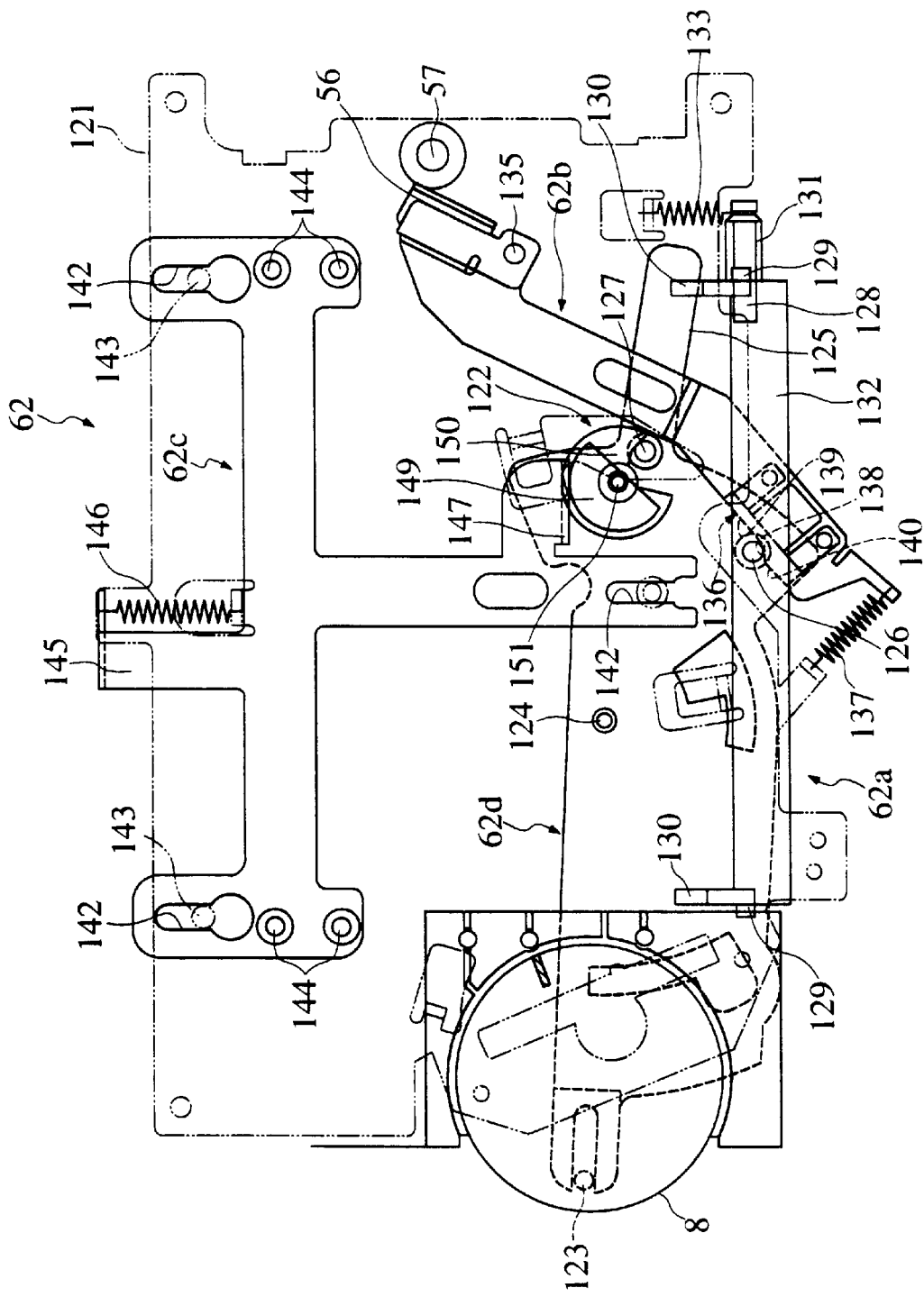
FIG. 6 is a plan view showing the function link mechanism in its "INPUT/PLATE-MAKING" position.

When the function switch 8 is rotated from the "OFF" position to the "INPUT/PLATE-MAKING" position as shown in FIG. 6, the first pin 126 of the main link 62d is moved from the second stationary surface 140 down the sloped surface 138 to the first stationary surface 139, whereby the head-moving link 62b is moved by the pulling force of the coiled spring 137 to urge the print head 56 against the platen roller 57. Inversely, when the function switch 8 is rotated from the "INPUT/PLATE-MAKING" position to the "OFF" position, the first pin 126 is moved from the first stationary surface 139 up the sloped surface 138 to the second stationary surface 140, whereby the head-moving link 62b is rotated against the pulling force of the coiled spring 137 to move the print head 56 away from the platen roller 57.

Figure 7:
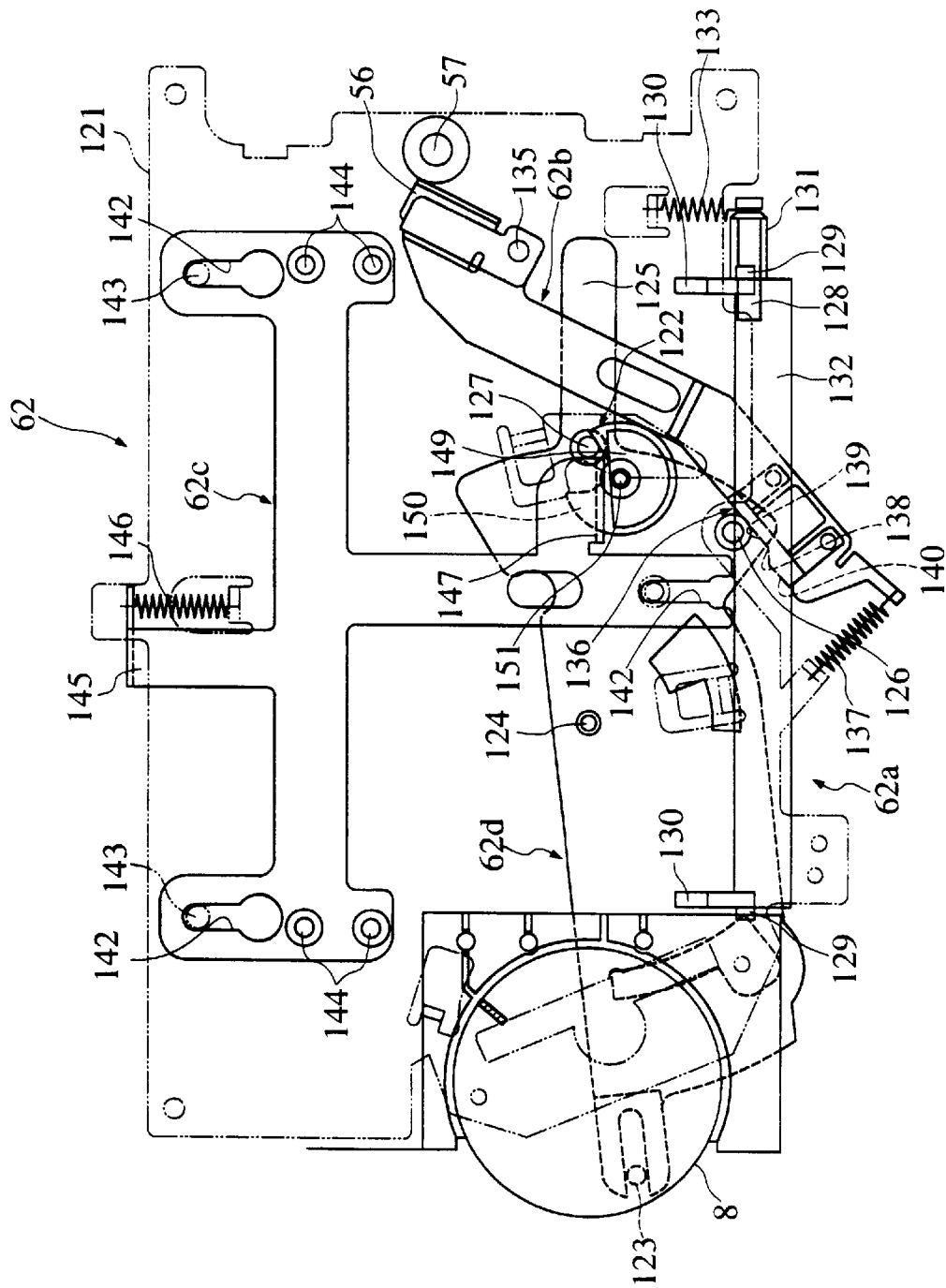
FIG. 7 is a plan view showing the function link mechanism in its "EXPOSURE" position.

When the function switch 8 is further rotated from the "INPUT/PLATE-MAKTNG" position to the "EXPOSURE" position, the first pin 126 is further moved on the first stationary surface, whereby the print head 56 remains in contact with the platen roller 57 (see FIG. 7). Similarly, when the function switch 8 is rotated from the "OFF" position to the "OPEN" position, the first pin 126 is moved further toward the front side on the second surface 140, whereby the print head 56 remains away from the platen roller 57 (see FIG. 5). When the coiled spring 137 has brought the print head 56 into contact with the platen roller 57, the first pin 126 is slightly away from the first stationary surface 139, whereby the print head 56 is positively held in contact with the platen roller 57.

The ribbon-holding link 62c is generally T-shaped, and has each of left, right, and forward end portions thereof formed with a guide slot 142. The guide slots 142 are respectively engaged with three projections 143 erected on the frame 121, whereby the ribbon-holding link 62c is mounted on the frame 121 in a state slightly floated on the frame 121 such that it can be moved forward and backward. Each guide slot 142 is in the form of a key hole, while the projection 143 is formed with a disk-shaped retaining portion, not shown, at an upper end thereof. The ribbon-holding link 62c is mounted in the frame 121 by positioning the retaining portion to a circular portion of the guide slot 142 and then pushing the former into the latter, whereby the ribbon-holding link 62c is guided forward and backward by the projections 143 of the frame 121 each sliding along an elongate slot portion of a corresponding one of the guide slots 142. Further, the ribbon-holding link 62c has two support pins 144, 144 erected on each of the right and left ends thereof outside the guide slots 142, and the presser plate 58 and the first and second guide pins 53, 54 are mounted on the support pins 144, 144 (see FIG. 13).

From an intermediate portion of the ribbon-holding link 62c, a spring-holding piece 145 having a bent end portion extends backward, and a coiled spring 146 is interposed between the spring-holding piece 145 and the frame 121. The coiled spring 146 urges the ribbon-holding link 62c in a forward direction, i.e. toward the front end of the stamp-making apparatus. From a front-side portion of the ribbon-holding link 62c branches an engaging portion 147 which the ribbon-holding cam 122 abuts.

The ribbon-holding cam 122 is a unitary member having an upper cam 149 and a lower cam 150 in the form of a laminate of two plate cams. The ribbon-holding cam 122 is rotatably mounted on the frame 21 via a support shaft 151. The lower cam 150 is in the shape of a circular disk from which a sector-shaped portion is cut out, while the upper cam 149 is in the shape of a semicircular disk. The engaging portion 147 of the ribbon-holding link 62c is in contact with the peripheral end of the upper cam 149, and the second pin 127 of the main link 62d is engaged with a cut-out portion of the lower cum 150 (see FIG. 6).

FIG. 6 shows the function switch 8 in the "INPUT/PLATE-MAKING" position. When the function switch 8 is rotated from this position to the "EXPOSURE" position, the second pin 127 of the main link 62d pushes one radial end wall of the cut-out portion of the lower cam 150 to move or rotate the ribbon-holding cam 122 in an anticlockwise direction. This rotation of the ribbon-holding cam 122 eventually causes the engaging portion 147 of the ribbon-holding link 62c to drop from a peripheral end portion of the upper cam 149 onto a chord portion of the same, whereby the ribbon-holding link 62c is displaced forward by the urging force of the coiled spring 146. Since the ribbon-holding cam 122 is constructed such that it is freely rotatable about its rotational axis, so that it is instantly rotated to a position in which the chord portion of the upper cam 149 and a contacting surface of the engaging portion 147 of the ribbon-holding link 62c entirely face each other. This rotation also brings the other radial end wall of the cut-out portion of the lower cam 150 to a position in substantial contact with the second pin 127 (see FIG. 7).

The guide slot 142 also serves as a stopper for restricting the forward movement of the ribbon-holding link 62c. That is, when an inner wall defining the rear end of the elongate slot of each guide slot 142 strikes the projection 143, the ribbon-holding link 62c is stopped in a forward extremity position. Therefore, when the engaging portion 147 of the ribbon-holding link 62c entirely faces the chord portion of the upper cam 149, the urging force of the coiled spring 146 does not actually act on the chord portion of the upper cam 149, so that the engaging surface of the engaging portion is slightly spaced from the chord portion of the upper cam 149.

On the other hand, when the function switch 8 is rotated from the "EXPOSURE" position through the "INPUT/PLATE-MAKING" position to the "OFF" position, the second pin 127 displaces the other radial end wall of the cut-out portion of the lower cam 150 to rotate the ribbon-holding cam 122 in a clockwise direction. This rotation of the ribbon-holding cam 122 causes the engaging portion 147 of the ribbon-holding link 62c to return from the chord portion of the upper cam 149 to the peripheral end portion of the same, whereby the ribbon-holding link 62c is moved backward against the urging force of the coiled spring 146. In this state, the ribbon-holding cam 122 which is freely rotatable supports the ribbon-holding link 62c urged by the coiled spring 146 to thereby hold the ribbon-holding link 62c in a backward position (see FIG. 4). When the function switch 8 is further moved from the "OFF" position to the "OPEN" position, the other radial end wall of the cut-out portion of the lower cam 150 is in contact with the second pin 127 become substantially parallel with a direction of movement of the second pin 127, so that the ribbon-holding cam 122 only rotates slightly in a clockwise direction, and the ribbon-holding link 62c remains held in the backward position (see FIG. 5).

Thus, when the function switch 8 is rotated from the "OFF" position to the "OPEN" position, the hook 130 is disengaged from the hook catch 7a of the lid 7 to permit the lid 7 to open, and when the same is rotated from the "OFF" position to the "INPUT/PLATE-MAKING" position, the print head 56 displaces the ink ribbon C to urge same against the platen roller 57 to permit printing. Further, when the function switch 8 is rotated from the "INPUT/PLATE-MAKING" position to the "EXPOSURE" position, the presser plate 58 displaces the ink ribbon C to urge the same against the stamp body A to permit exposure. If the lid 7 is carelessly opened during exposure to ultraviolet rays, or if the exposure is carried out with the lid 7 being open, ultraviolet rays undesirably leak out of the apparatus. To avoid this inconvenience, the stamp-making apparatus incorporates the lock mechanism 63 which locks the lid 7 in a closed state during printing and exposure, and inhibits the function of the apparatus from shifting to printing and exposure when the lid 7 is open.

Figure 9A:
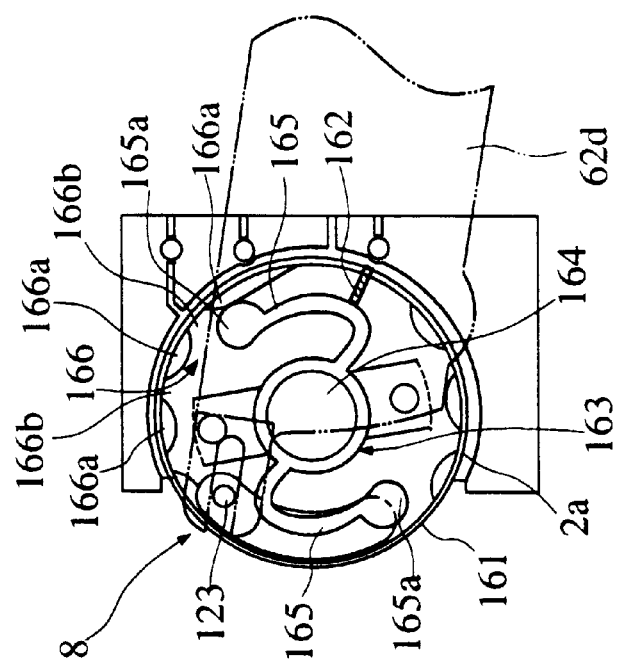
FIGS. 9A and 9B are views each showing an internal construction of a function switch, which are useful in explaining operations thereof.
Figure 9B:
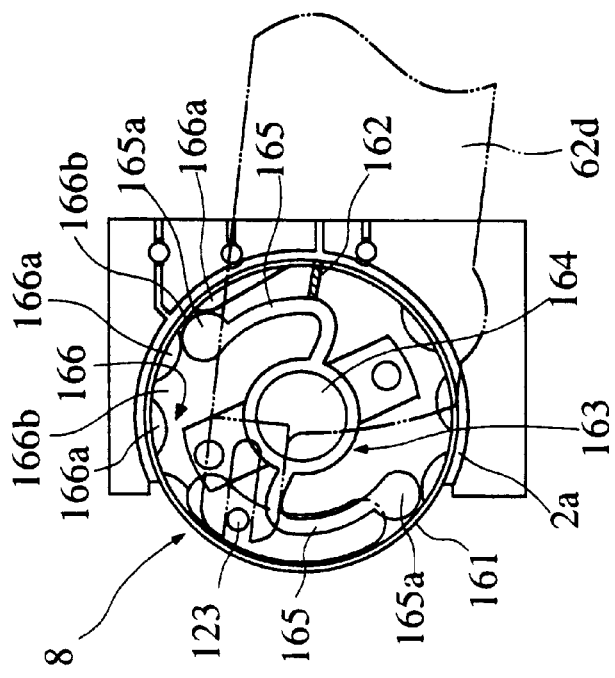

The lock mechanism 63 is arranged in the function switch 8. Now, for easy understanding purposes, description will be first made of the construction of the function switch 8. As shown in FIGS. 9A and 9B, the function switch 8 includes a dial 161 formed with a mark 162 on its top for indicating an active position of the switch, a click member 163 attached to the underside of the dial 161 and received in the space within the same, and an eccentric pin 123 in engagement with the main link 62d. The function switch 8 is rotatably-mounted on a seat plate 2a of the casing 2, via a shaft 164. The click member 163 has a pair of click arms 165, 165 extending radially in a winding manner, and positioned in centrosymmetry. The resilient properties of each click arm 165 urges a circular portion 165a at an end thereof against a corresponding one of click-engaging portions 166 formed on the seat plate 2a.

Each click-engaging portion 166 is a sequence of four convex portions 166a and three concave portions 166b each located between adjacent ones of the convex portions 166a. States of the circular portion 165a of each click arm dropped in or engaged with any of the three concave portions 166b of the corresponding click-engaging portion 166 correspond to the "OFF" position, the "INPUT/PLATE-MAKING" position, and the "EXPOSURE" position, respectively (see FIG. 9A). An intermediate portion of the outermost convex portion corresponds to the "OPEN" position, and in this position, no clicking engagement occurs between the click arms and the click-engaging portions (see FIG. 9B). This enables the function switch 8 to automatically smoothly return from the "OPEN" position to the "OFF" position. A rotational angle between the "OFF" position and the "OPEN" position through which the function switch 8 should rotate is set to 15 degrees, and a rotational angle between the "OFF" position and the "EXPOSURE" position is set to 30 degrees.

Figure 10:
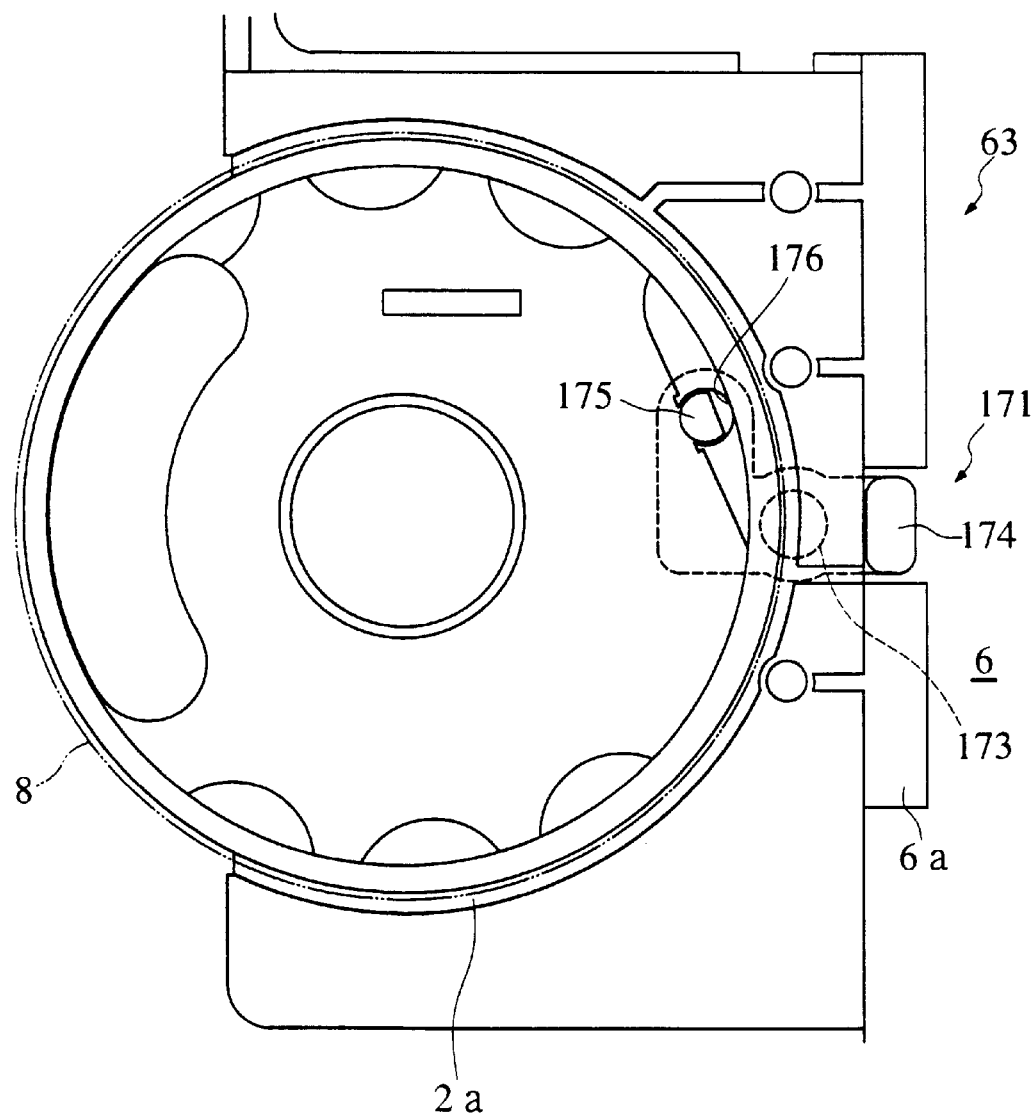
FIG. 10 is a plan view of a lock mechanism and component parts associated therewith from which a dial of the function switch is removed.
Figure 11:
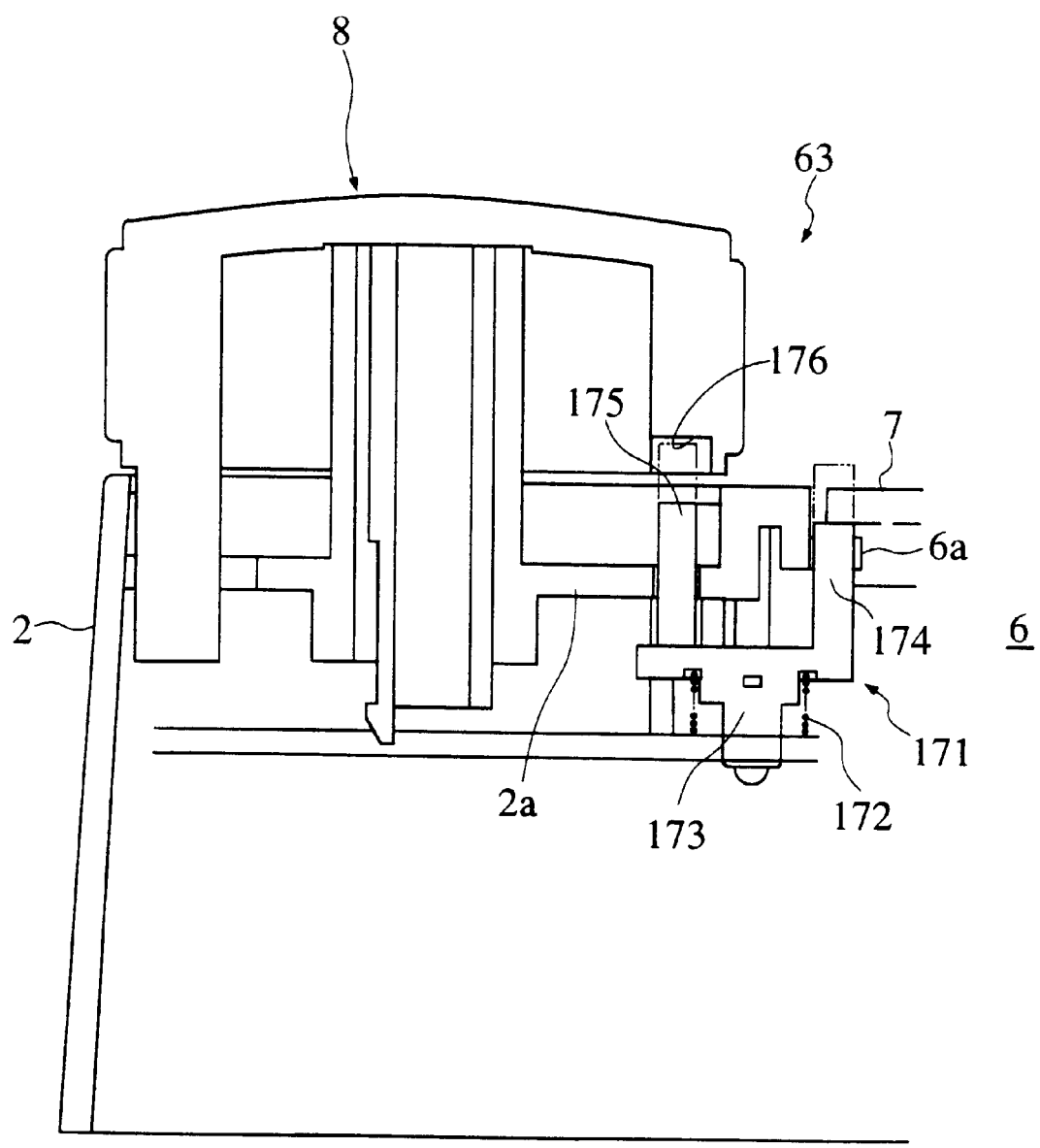
FIG. 11 is a cross-sectional view showing the function switch and the lock mechanism as well as component parts associated therewith.

On the other hand, as shown in FIGS. 10 and 11, the lock mechanism 63 includes the lock member 171 arranged in a boundary between the function switch 8 and the pocket 6. The lock member 171 is mounted on the seat plate 2a of the casing 2 such that it is urged upward by a lock spring 172 and is vertically movable. The lock member 171 is comprised of a body 173 guided by the seat plate 2a in a vertically movable manner, a push arm 174 which extends from the body 173 toward the pocket 6 and then bends upward, and a lock arm 175 which extends from the body 173 toward the function switch 8 and then bends upward.

The push arm 174 faces a lid-seating portion 6a of the pocket 6 from below, and when the lid 7 is opened, the push arm 174 projects out of the lid-seating portion 6a, whereas when the lid 7 is closed, the push arm 174 is pushed downward to be retracted into the lid-seating portion 6a. That is, when the lid 7 is opened, the lock member 171 is displaced upward by the lock spring 172, and when the lid 7 is closed, the lock member 171 is moved downward against the urging force of the lock spring 172. When the lock member 171 is moved upward, the lock arm 175 is engaged in an engaging groove 176 formed in a side wall of the function switch 8, to inhibit rotation of the function switch 8. Inversely, when the lock member 171 is moved downward, the lock arm 175 is disengaged from the engaging groove 176 of the function switch 8 to cancel the inhibition of rotation of the function switch 8.

The engaging groove 176 is an elongate groove which extends circumferentially, and when the function switch 8 is to be rotated between the "OFF" position and the "OPEN" position (normally, this operation is not carried out), the rotation of the function switch 8 is permitted. Inversely, when an attempt is made to rotate the function switch 8 from the "OFF" position to the "INPUT/PLATE-MAKING" position or the "EXPOSURE" position, the rotation of the function switch 8 is inhibited. This construction of the lock mechanism inhibits the rotation of the function switch 8 when the lid 7 is open, thereby making it impossible to start printing and exposure.

The mechanism of locking the lid in a closed state during printing and exposure by the stamp-making apparatus is achieved by the main link 62d and the lid-opening link 62a. That is, when the function switch 8 is in the "INPUT/PLATE-MAKING" position or the "EXPOSURE" position, the lid is locked in a closed state by the lid-opening link 62a. This prevents the exposure from being carried out when the lid 7 is open, and the lid from being opened during the exposure.

Figure 12:
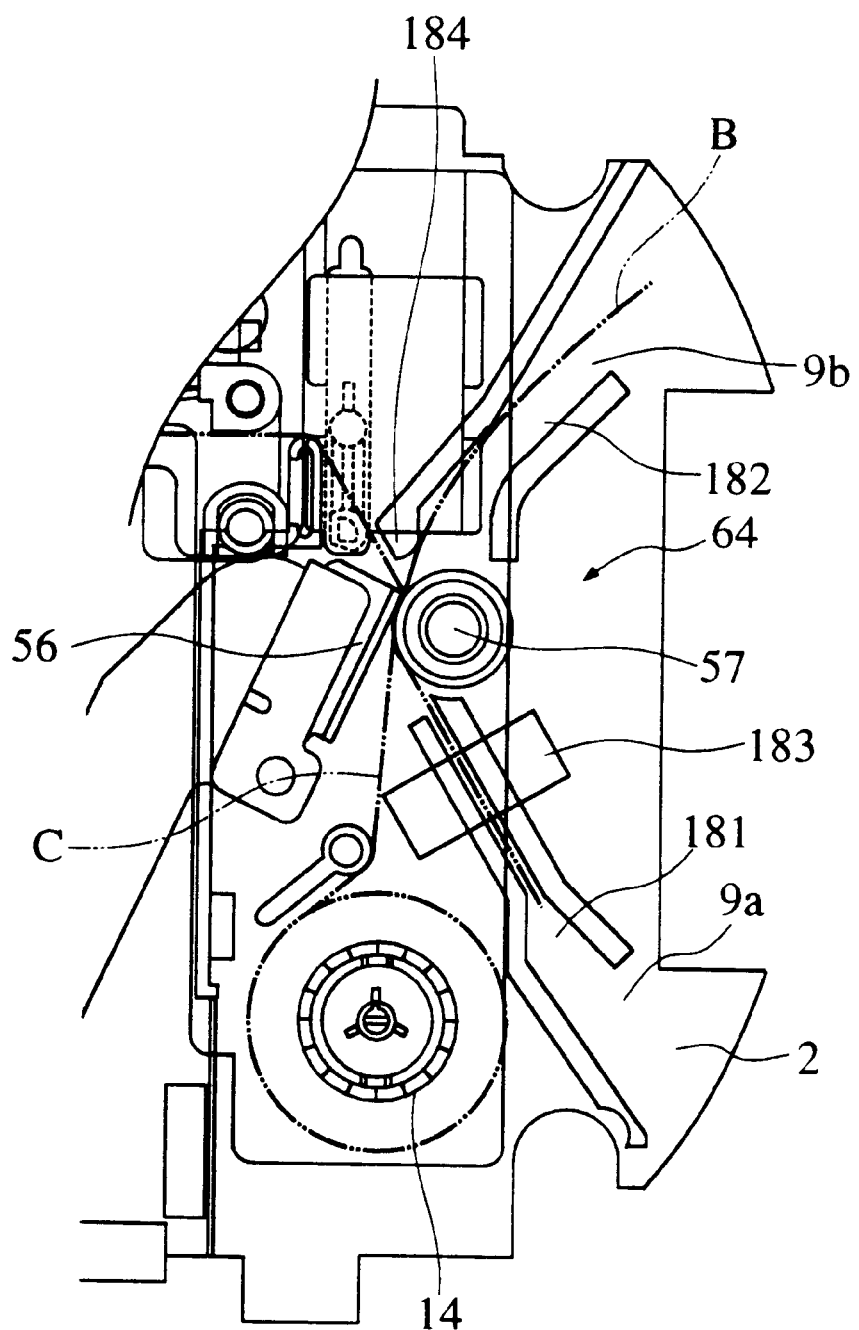
FIG. 12 is an enlarged plan view showing a printing device of the mechanical block and component parts associated therewith.

Next, a printing device 64 provided for the printing block will be described with reference to FIG. 12. The printing device 64 includes the print head 56 for printing stamp characters on the ink ribbon C, and the platen roller 57 for feeding the ink ribbon C in a manner timed to printing operations of the print head 56. Further, the casing 2 is formed with a feeding passage 181 through which the plate-making sheet B is fed to a contacting area between the print head 56 and the platen roller 57 and a delivery passage 182 through which the plate-making sheet B is delivered. The feeding passage 181 is formed with the inserting slot 9a which is open to the outside of the apparatus, at an upstream end thereof, and the delivery passage 182 is formed with the take-out slot 9b which is open to the outside of the apparatus, at a downstream end thereof.

The platen roller 57 is a drive roller as described hereinabove, and when the ink ribbon C is rolled out from the supply reel 14, it pulls in the plate-making sheet B between the print head 56 and itself to thereby bring a portion of the ink ribbon C and a portion of the plate-making sheet B, one upon the other, onto the print head 56. The print head 56 is a thermal head, and thermally transfer ink coated on the ribbon tape of the ink ribbon C to the plate-making sheet B. This transfer of the ink peels a portion of ink corresponding to a stamp character off the ink ribbon C to reveal a corresponding portion of the transparent base of the ribbon tape, while the peeled portion of the ink is attached to the plate-making sheet B as the stamp character.

On the feeding passage 181 faces a sensor 183 which detects insertion of the plate-making sheet B and a feeding reference position of the same. The plate-making sheet inserted into the feeding passage 181 is sent forward by the platen roller 57 in response to results of the detection of the sensor 183 whereby printing is started from one end of the stamp character label Bd on the plate-making sheet. One of walls defining the delivery passage 182 on a left-hand side, as viewed in FIG. 12, is formed with a separating nail 184 at an upstream end thereof, whereby the ink ribbon C and the plate-making sheet B fed one upon the other are separated from each other. Thereafter, the ink ribbon C is sent forward to the exposure block, while the plate-making sheet B is delivered via the delivery passage 182 out of the apparatus.

Next, the exposure system 65 provided for the exposure block will be described with reference to FIGS. 13 and 14. The exposure system 65 includes an ultraviolet ray source 191 arranged in a manner opposed to the stamp surface Ad of the stamp body A set in the pocket 6, and the presser plate 58, arranged between the ultraviolet ray source 191 and the stamp surface Ad of the stamp body A. The stamp surface Ad of the stamp body A set in the pocket 6, the presser plate 58, and the ultraviolet ray source 191 are arranged such that they are spaced from each other by a gap in a manner parallel to each other. The ink ribbon C is positioned between the stamp surface Ad and the presser plate 58. The presser plate 58 is formed of a transparent resin or the like and is caused to move forward to displace the ink ribbon C so as to urge the same against the stamp surface Ad of the stamp body A. That is, when the exposure is carried out, the presser plate 58 urges the ink ribbon C against the stamp surface Ad of the stamp body A, and then the ultraviolet ray source 191 is lighted to expose the stamp surface Ad to ultraviolet rays using the ink ribbon C as a mask (see FIG. 13).

Figure 15:
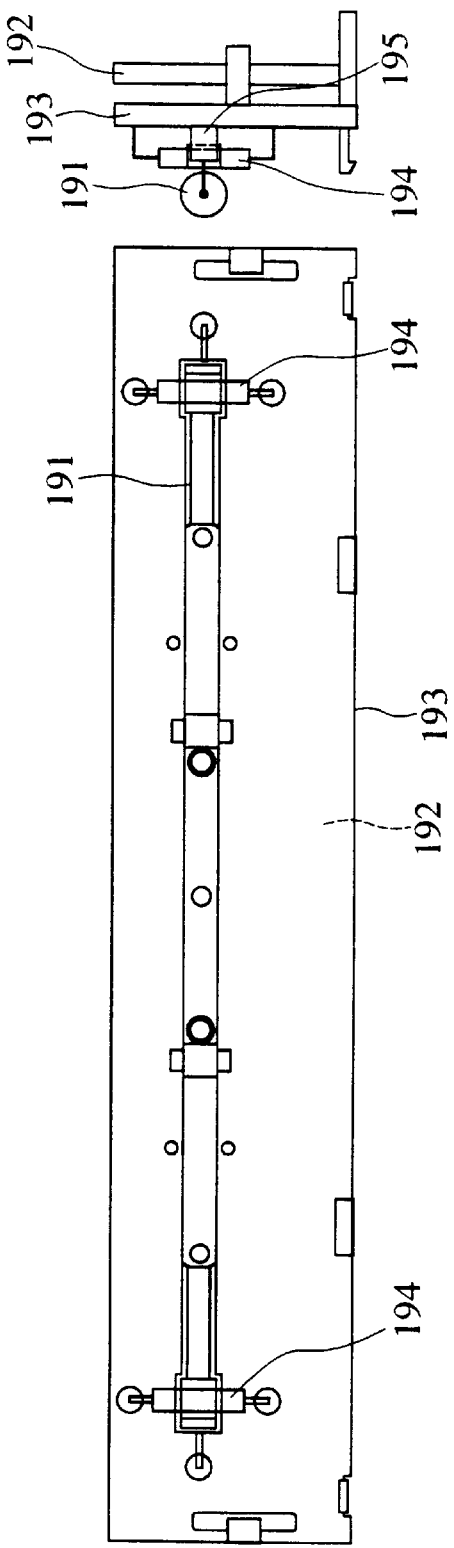
FIG. 15A is a front elevation showing an ultraviolet ray source of the exposure system and component parts associated therewith.
FIG. 15B is a side elevation showing the ultraviolet rays source of the exposure system and component parts associated therewith.
Figure 16:
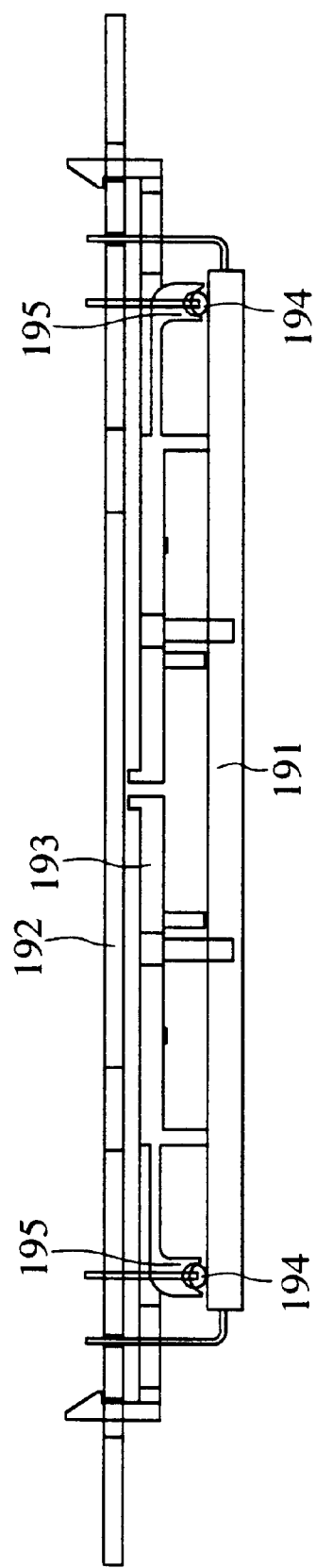
FIG. 16 is a plan view showing the ultraviolet ray source of the exposure system and component parts associated therewith.

The ultraviolet ray source 191 is a self-heating hot-cathode tube which is also called a semi-hot tube. As shown in FIG. 15A (front elevation), FIG. 15B (side elevation) and FIG. 16 (plan view), the ultraviolet ray source 191 is supported on a fluorescent tube holder 193 provided on a base plate 192. The ultraviolet ray source 191 has a pair of overtemperature cutouts 194, 194 arranged on longitudinal opposite ends thereof, for detecting expiration of the service life of the ultraviolet ray source 191 and failure of the same. Each overtemperature cutout 194 is constructed in the form of a hollow cylinder, and arranged such that it extends crosswise at right angles to the longitudinal axis of the ultraviolet ray source 191 and touches ultraviolet ray source 191 from underside thereof (i.e. from the holder side). Each overtemperature cutout 194 is held from underneath by a hold arm 194 extending from the fluorescent tube holder 193, and at the same time urged against the ultraviolet ray source 191 by the hold arm 195 having the resilient properties.

It is preferred that a reflector, not shown, is provided at the rear of the ultraviolet ray source 191 whereby the ultraviolet rays are caused to be emitted forward in a concentrated manner. Further, the overtemperature cutouts 194 may be provided in a manner spaced from the ultraviolet ray source 191 to thereby inhibit conduction of heat from the ultraviolet ray source 191 to the overtemperature cutouts 194. In this case, the rising of the amount of the ultraviolet rays emitted from the ultraviolet ray source 191 becomes better.

Figure 17:
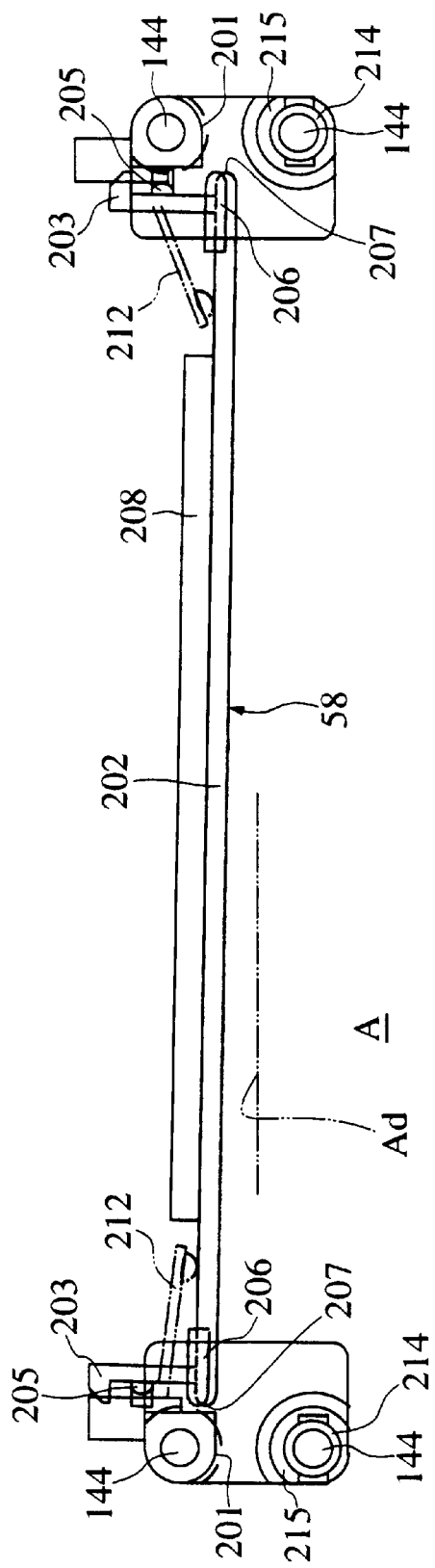
FIG. 17 is a plan view showing a presser plate of the exposure system and component parts associated therewith.
Figure 18:
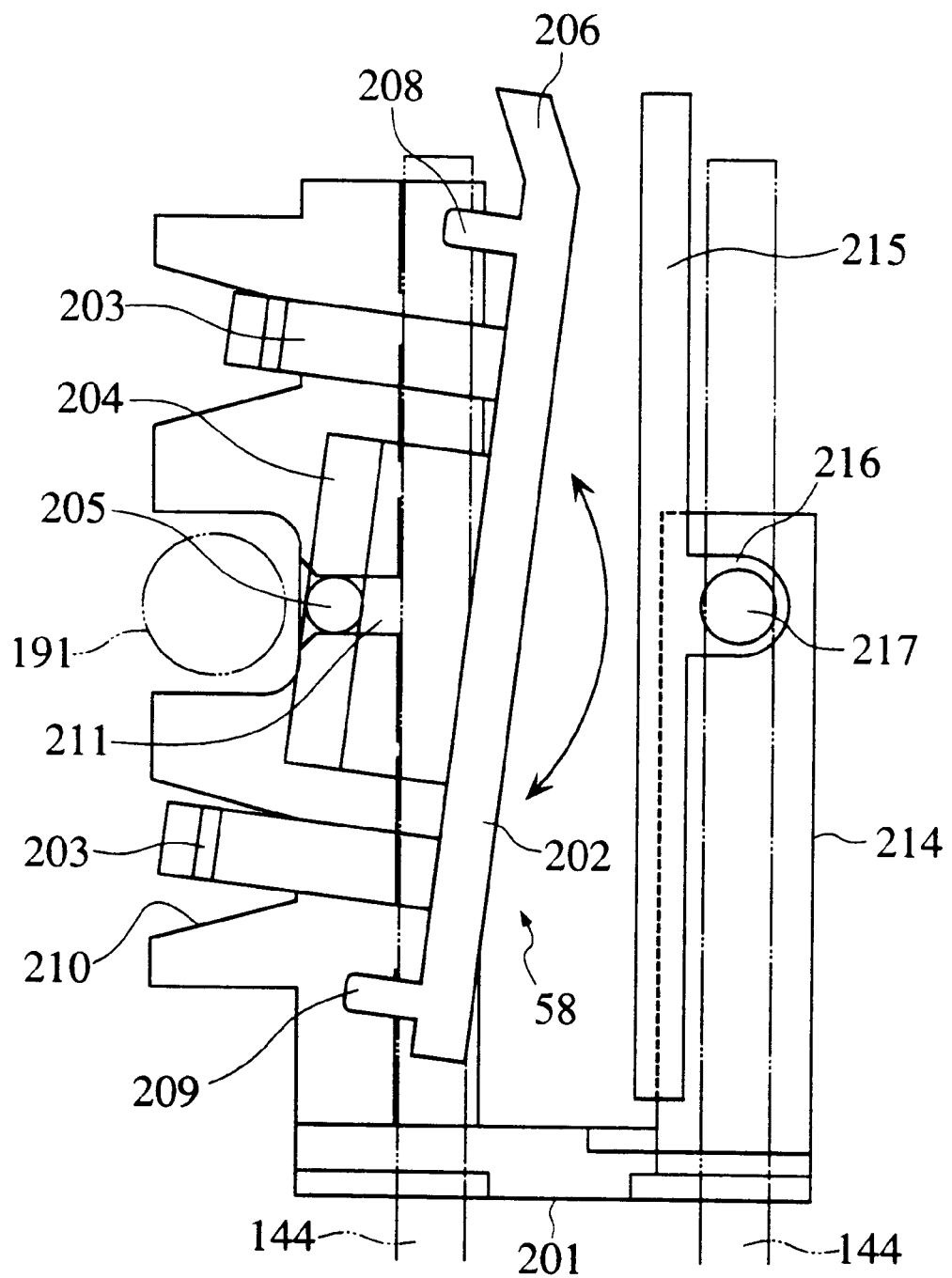
FIG. 18 is an enlarged side elevation showing the pressure plate and a presser plate holder of the exposure system.

The presser plate 58, as shown in FIGS. 17 and 18, is formed of a rectangular-shaped transparent resin or the like, and has longitudinal opposite ends thereof mounted on presser plate holders 201, 201. Each presser plate holder 201 is fitted on two support pins 144, 144 erected on each of the ends of the ribbon-holding link 62c (see FIG. 14). The presser plate 58 is comprised of a presser plate body 202, a pair of upper and lower guide nails 203, 203 extending backward from each of opposite ends of the presser plate body 202, and plates 204 each extending from the presser plate body 202 into space between the corresponding upper and lower guide nails 203, 203. Each plate 204 is formed with an outwardly projecting shaft portion 205 at a vertically intermediate location of the presser plate 58 for guiding the forward and backward swinging motion of the presser plate 58.

Although omitted in the figure, the presser plate body 202 is slightly bent in a direction away from the stamp body A, i.e. toward the ultraviolet ray source side along the longitudinal axis, whereby when the ink ribbon C is urged against the stamp surface Ad of the stamp body A by the presser plate 58, the ink ribbon C is outstretched or spread on the stamp surface A*d*. Further, the presser plate body 202 is formed with guide pieces 206, 206 which extend upward from the top of the longitudinal opposite ends thereof in a manner obliquely bent backward. They guide the ink ribbon C into space between the presser plate 58 and the stamp body A properly when the ink ribbon cartridge 11 is mounted in the stamp-making apparatus. Further, each of the longitudinal opposite ends of the presser plate body 202 is chamfered to form a chamfered portion having a segmental cross-section. When the exposure is carried out, the ink ribbon C is bent along the chamfered portions so that no wrinkles are formed (see FIG. 13). In FIG. 18, reference numerals 208, 209 designate ribs for increasing the rigidity of the presser plate body 202.

On the other hand, each presser plate holder 201 is formed with a pair of V-shaped grooves 210, 210 for guiding the pair of upper and lower guide nails 203, 203, transversely or forward and backward, and recesses 211 for respectively guiding the outwardly projecting shaft portions 205 such that they are rotatable about the longitudinal axis thereof. That is, the presser plate 58 is mounted on the presser plate holders 201, 201 at the longitudinal opposite ends thereof such that the guide nails 203 are respectively engaged with the V-shaped grooves 210, and the outwardly projecting shaft portions 205 are respectively engaged with the recesses 211 whereby the presser plate 58 is capable of moving forward and backward over a slight distance and swinging transversely. Further, in this state, a pair of spring pieces 212, 212 respectively extending from the presser plate holders 201 are urged against the outer or rear side of the opposite ends of the presser plate 58, whereby the presser plate 58 is urged toward the forward extremity position in which the nail portions of the guide nails 203 abut the bottoms of the V-shaped grooves 210, respectively.

Figure 13:
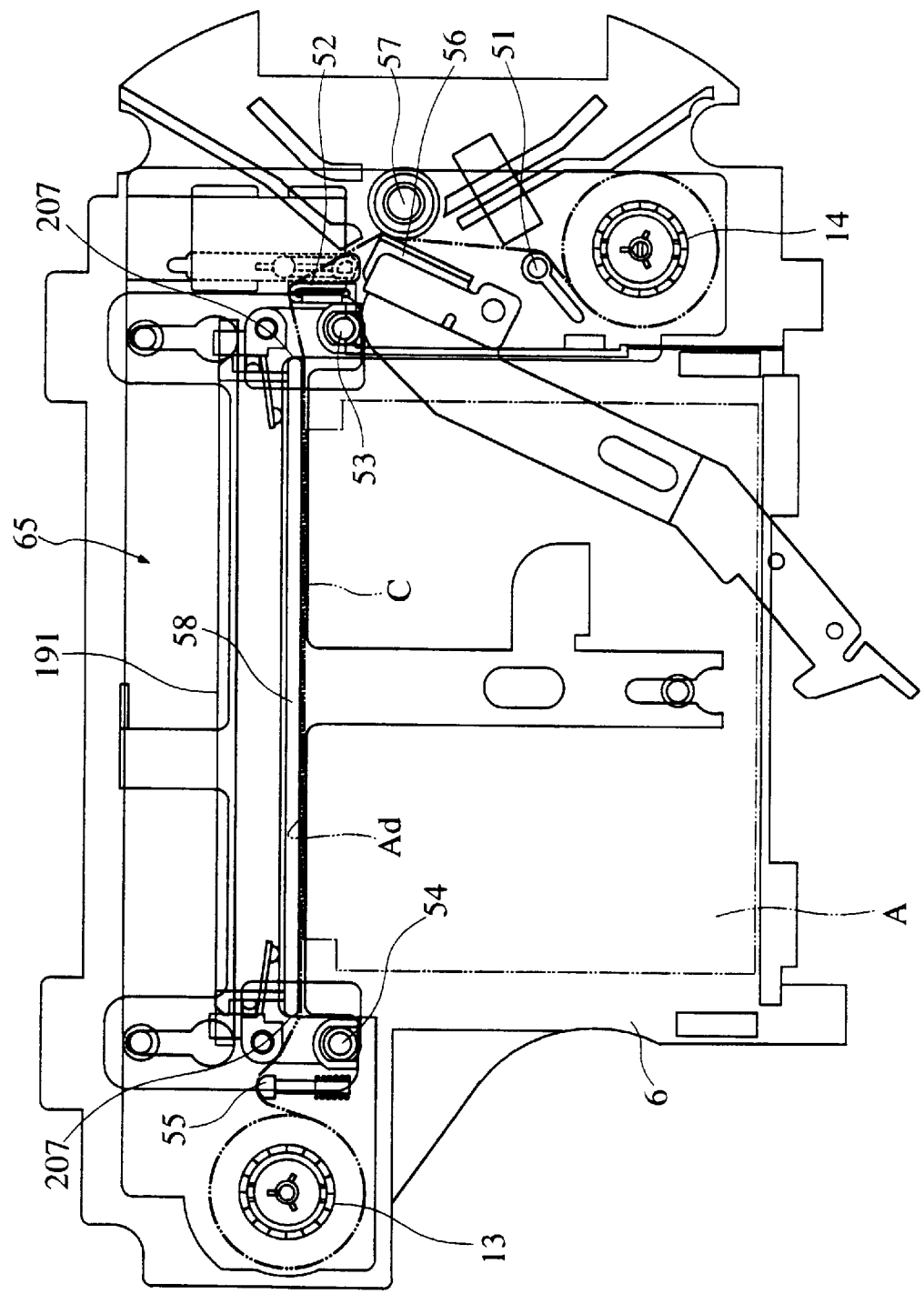
FIG. 13 is a plan view showing an exposure system of the mechanical block and component parts associated therewith.
Figure 14:
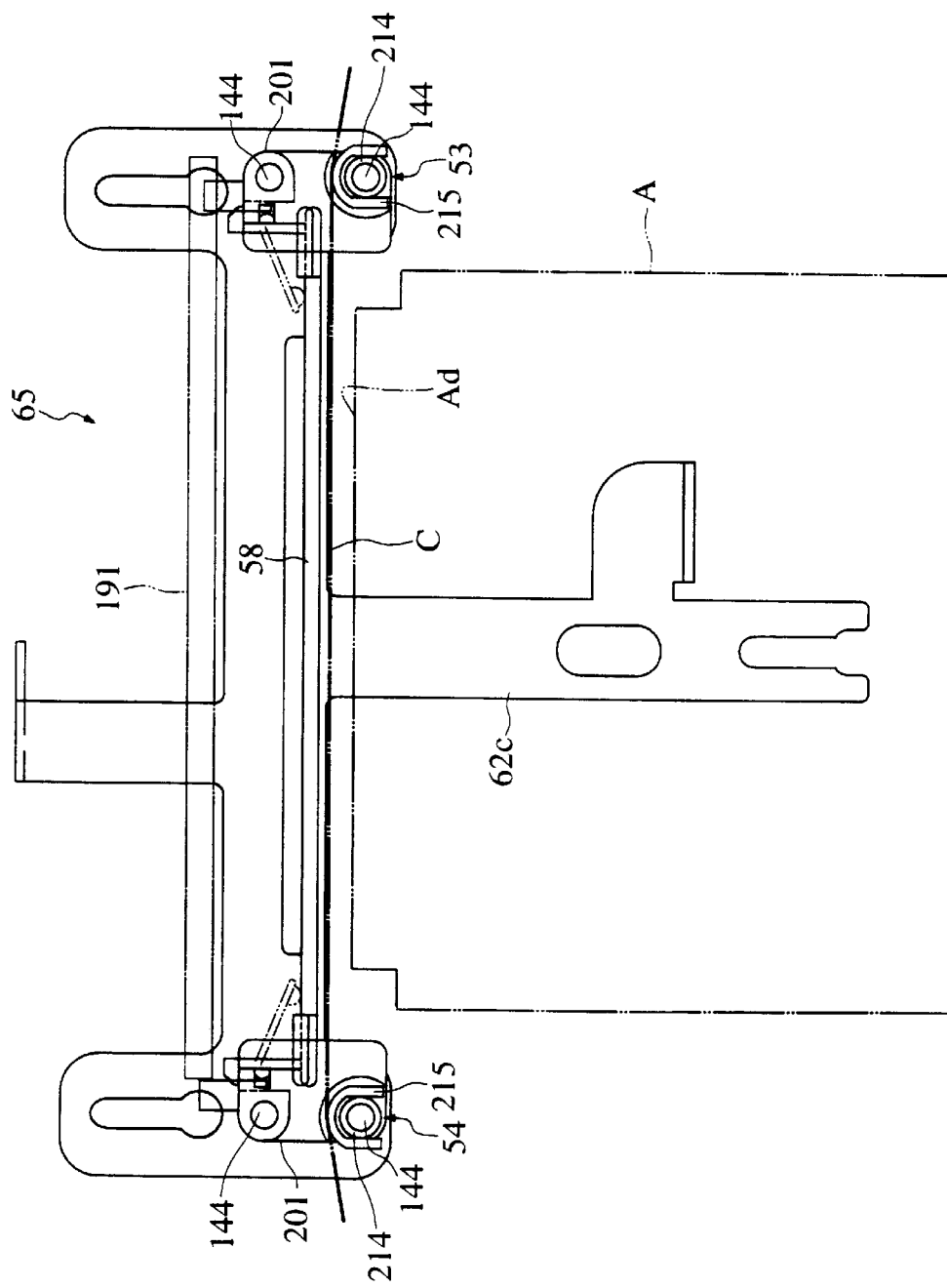
FIG. 14 is an enlarged plan view showing the exposure system of the mechanical block and component parts associated therewith.

As the ribbon-holding link 62c is moved forward from the state shown in FIG. 14 (or FIG. 2), the presser plate holders 201, 201 are moved forward, whereby the presser plate 58 makes a parallel translation toward the stamp surface A*d* of the stamp body A. The stroke of movement of the ribbon-holding link 62c is slightly longer than the distance between the presser plate 58 and the stamp surface A*d* of the stamp body A, and therefore, when the ribbon-holding link 62c reaches the forward extremity position, the presser plate 58 and the stamp surface A*d* of the stamp body A strikes or abuts each other, so that the presser plate 58 receives a reactionary force from the stamp surface A*d* to make a slight backward displacement with respect to the presser plate holders 201. Since the backward movement of the presser plate 58 is caused by the reactionary force from the stamp surface A*d*, this reactionary force and the urging forces applied on the presser plate 58 become balanced to bring the presser plate 58 into contact along the stamp surface A*d* of the stamp body A (see FIG. 13). That is, the presser plate 58 catches and brings the ink ribbon C into intimate contact with the stamp surface A*d* of the stamp body A without forming any gap.

Further, as shown in FIG. 18, each presser plate holder 201 has a guide pin-holding portion 214 integrally formed therewith, and a corresponding one of the support pins 144 extends through the guide pin-holding portion 214. The guide pin-holding portions 214 have respective ribbon-sliding members 215 mounted thereon. Each ribbon-sliding member 215 is segmental in cross-section, with an arcuate surface thereof facing toward the presser plate side. The ribbon-sliding member 215 is formed with a pair of holding pieces 216 at a vertically intermediate portion thereof, each projecting to the front side and having a round through hole extending in a longitudinal direction. The round through holes of the holding pieces 216 of the ribbon-sliding members 215 are fitted in a pair of shaft projections 217 formed on the guide pin-holding portion 214, respectively, such that the holding pieces 216 are fitted on the guide pin-holding portion 214 from the outside, whereby the ribbon-sliding member 215 is mounted on the guide pin-holding portion 214 in a manner swingable about the axis of the shaft projections 217.

The guide pin-holding portions 214 and the ribbon-sliding members 215 are arranged outside an area of the presser plate 58 and the stamp body A (see FIGS. 14 and 17), and the guide pin-holding portion 214 and the ribbon-sliding member 215 located on the right-hand side as viewed in the figures form the first guide pin 53, and the guide pin-holding portion 214 and the ribbon-sliding member 215 located on the left-hand side form the second guide pin 54. That is, the first guide pin 53 and the second guide pin 54 guide the ink ribbon C through space between the presser plate 58 and the stamp surface A*d* of the stamp body A such that the ink ribbon C is fed in parallel with the presser plate 58 and the stamp body A without interfering with any of them.

Although detailed description is made hereafter, since the guide pin-holding portions 214 form part of the presser plate holder 201, the first guide pin 53 and the second guide pin 54 are moved in the same direction as the presser plate 58 (driven by the ribbon-holding link 62c) is translated forward. This movement decreases the tension of the ink ribbon C stretched between the first and second guide pins 53, 54, whereby the ink ribbon C is urged against the stamp surface A*d* of the stamp body A with reduced tension, i.e. without forming any vertical wrinkles thereon.

Now, the above-mentioned state of the ink ribbon C is described in further detail with reference to FIGS. 2 and 13. Referring to FIG. 2, when the ink ribbon C is fed or advanced, the pulling force of the take-up reel 13 causes strong tension of the ink ribbon C, so that vertical wrinkles are formed on the ink ribbon C due to its very small thickness. Therefore, if the ink ribbon C is urged against the stamp surface A*d* of the stamp body A as it is, there remain the wrinkles formed on the ink ribbon C urged against the stamp surface A*d*, so that deformed images (negative) of the stamp characters on the ink ribbon C are used in carrying out the exposure of the stamp surface A*d* to the ultraviolet rays. On the other hand, if the ink ribbon C is loosened, the exposure can be carried out with the images of the stamp characters being out of position. To eliminate these inconveniences, as shown in FIG. 13, the first guide pin 53 and the second guide pin 54 are moved forward in accordance with the forward movement of the presser plate 58, whereby the tension of the ink ribbon C is reduced, and at the same time, a slight stretching force is applied to the ink ribbon C by the tension pin 55, which is moderate enough not to produce any wrinkles on the ink ribbon C.

Further, the ink ribbon C in the exposure position shown in FIG. 13 is bent backward at the longitudinal opposite ends of the presser plate 58 by the tension pin 55 and the second path-setting pin 52, and the chamfered portions formed at the longitudinal opposite ends of the presser plate 58 operate to prevent undesired wrinkles from being produced on the ink ribbon C.

Figure 19:
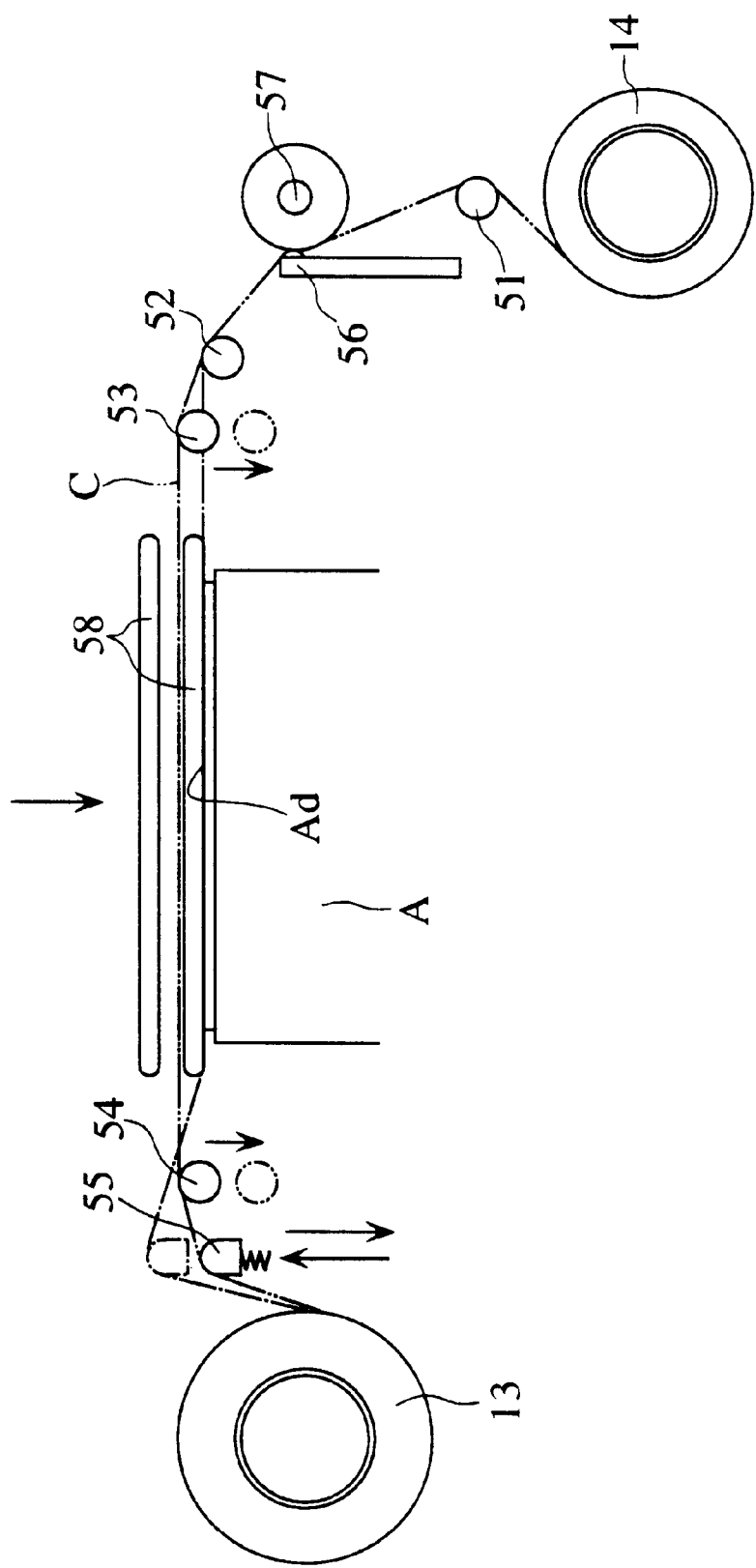
FIG. 19 is a diagram schematically showing a feed path of an ink ribbon.

Now, the feed path of the ink ribbon C will be described with reference to FIG. 19. The ink ribbon C rolled out from the supply reel 14 is properly guided by the first path-setting pin 51 to the printing device 64. From the printing device 64, the ink ribbon C is fed to the second path-setting pin 52, at which the ink ribbon C is largely bent. Then, it is properly guided by the first guide pin 53 and the second guide pin 54 to the exposure system 65 between them. Finally, the ink ribbon C is advanced via the tension pin 55, and taken up by the take-up reel 13. This feed path of the ink ribbon C is for feeding or advancing the ink ribbon C or for setting the same on standby for feeding. A feed path of the ink ribbon C during the exposure of the stamp body A to ultraviolet rays is different from the above feed path, as described hereinabove, and from a feed path of the same when the ribbon cartridge 11 is carried separately from the plate-making apparatus. Before describing the feed path of the ink ribbon C taken when the ribbon cartridge 11 is carried as an separate piece, the construction of the ribbon cartridge 11 per se including the reels and the pins will be described.

Figure 20:
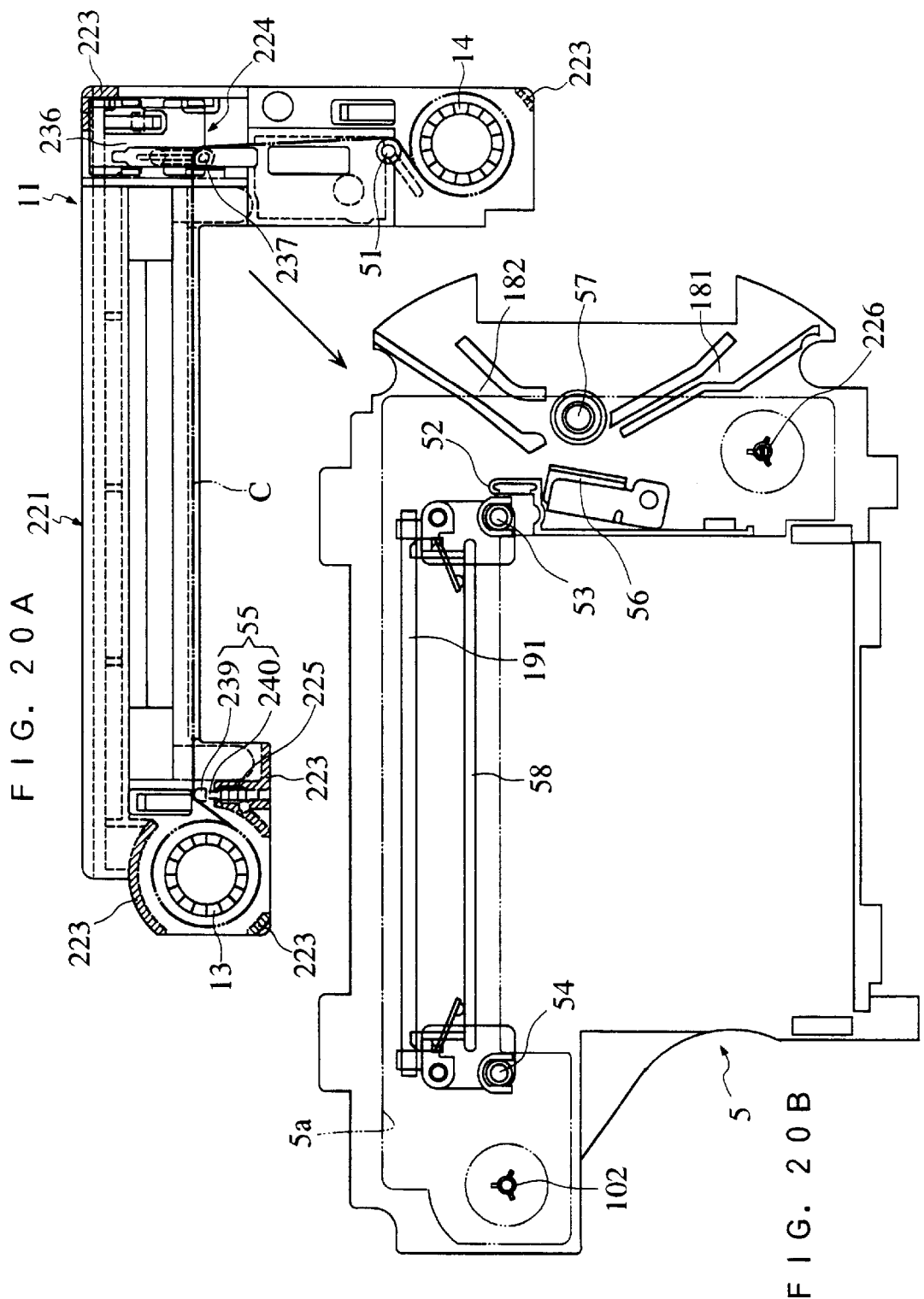
FIG. 20A is a plan view showing a ribbon cartridge.
FIG. 20B is a plan view showing a mechanical block body from which the FIG. 20A ribbon cartridge is removed.
Figure 21:
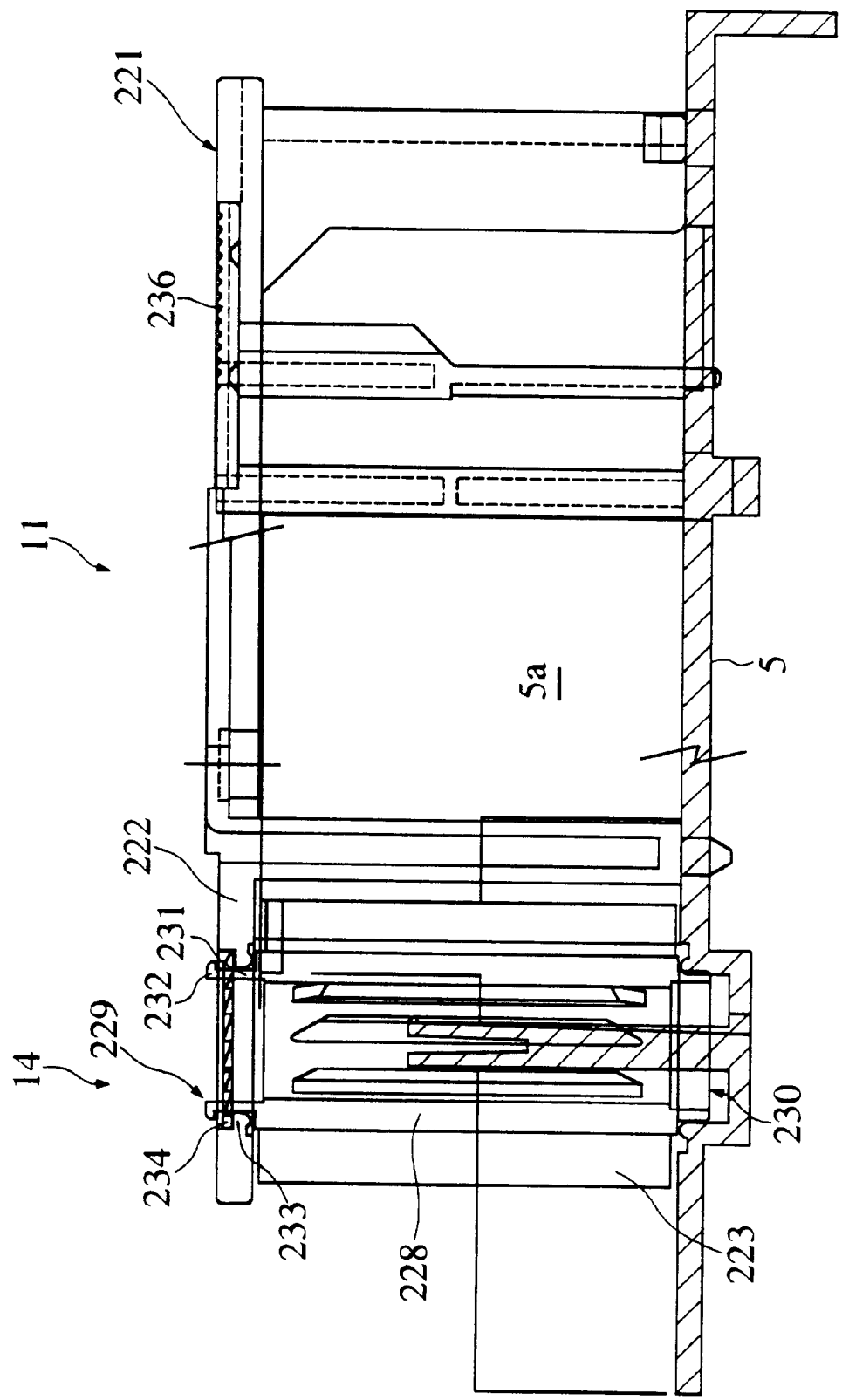
FIG. 21 is an enlarged side elevation showing the ribbon cartridge mounted in the mechanical block body.

As shown in FIGS. 20A and 21, the ribbon cartridge 11 includes a cartridge case 221 comprised of a base plate 222 in the form of an inverted L-shape, and a plurality of legs 223 extending from the base plate 222, as well as the reels and pins each attached to the cartridge case 221 in a cantilever manner. The ribbon cartridge 11 is mounted in the mechanical block body 5 by fitting the legs 223 in a receiving block 5a with the base plate 222 being positioned above. The legs 223 are arranged at corners of the inverted L-shaped cartridge case 221, as shown in FIG. 20A.

At an end of a shorter-side portion of the base plate 222, the supply reel 14 extends downward in a rotatable manner, and at an end of a longer-side of the base plate 222, the take-up reel 13 extends downward in a rotatable manner. Further, at a location downstream of the supply reel 14 along the feed path of the ink ribbon C, the first path-setting pin 51 reinforced with ribs extends downward from the base plate 222, and at a location downstream of the first path-setting pin 51, there is provided a path-changing member 224 constructed in a manner movable forward and backward. At a location upstream of the take-up reel 13, the tension pin 55 is provided in a manner urged by a coiled spring 225 such that it can be moved forward and backward on the base plate 222. As shown in FIG. 20B, arranged in the receiving block 5a of the mechanical block body 5 are the reel shaft 102 of the take-up reel 13, a reel shaft 226 of the supply reel 14, the print head 56, the platen roller 57, the feeding passage 181 and the delivery passage 182, the second path-setting pin 52, the first and second guide pins 53, 54, the presser plate 58, the ultraviolet ray source 191, etc.

As shown in FIG. 21, the supply reel 14 (identical with the take-up reel 13) has a shaft 228 in the form of a hollow cylinder around which the ink ribbon C is wound, an upper engaging portion 229 extending from an upper end of the shaft 228, and a lower engaging portion 230 extending from a lower end of the shaft 228, whereby the supply reel 14 is rotatably held on the base plate 222 by the upper engaging portion 229, and on the mechanical block body 5 by the lower engaging portion 230. The upper engaging portion 229 is comprised of a hollow cylindrical portion 231, and an flanged end portion 232 continuously extending from an upper end of the hollow cylindrical portion 231. In a manner corresponding to this construction of the upper engaging portion 229, the base plate 222 is formed with a shaft-holding portion 233 for sliding contact with the hollow cylindrical portion 231 such that the hollow cylindrical portion 231 can rotate in the shaft-holding portion 233, and a stepped portion 234 on which the bottom of the flange of the flanged end portion 232 is seated. The bottom of the flanged end portion 232 and the stepped portion 234 are each in the form of sawteeth, and the supply reel 14 is rotatable only in one direction when the flanged end portion 232 is brought into contact (engaged) with the stepped portion 234.

In this case, when the ribbon cartridge 11 is mounted in the mechanical block body 5, the supply reel 14 is slightly pushed upward, whereby the flanged end portion 232 is disengaged from the stepped portion 234 to permit free rotation of the supply reel 14. On the other hand, when the ribbon cartridge 11 is not mounted in the mechanical block body 5, the supply reel 14 is displaced downward by empty load to cause the flanged end portion 232 to engage with the stepped portion 234, to set or form a rotation-inhibiting stop. The rotation-inhibiting stop is provided for preventing the ink ribbon C from becoming loose In the case of the take-up reel 13, the rotation-inhibiting stop inhibits the ink ribbon from moving in a direction opposite to a feeding direction, and in the case of the supply reel 14, the rotation-inhibiting stop therefor inhibits the ink ribbon from moving in the feeding direction. It goes without saying that both the take-up reel 13 and the supply reel 14 are permitted to be rotated in respective directions in which the ink ribbon becomes tight. For a ribbon cartridge 11 provided for replacement, the base plate 222 is provided with a plate, not shown, on the top thereof for urging the flanged end portion 232 against the stepped portion 234, and the ribbon cartridge 11 is wrapped and provided in this state, i.e. with the flanged end portion 232 being urged on the stepped portion 234.

Figure 22:
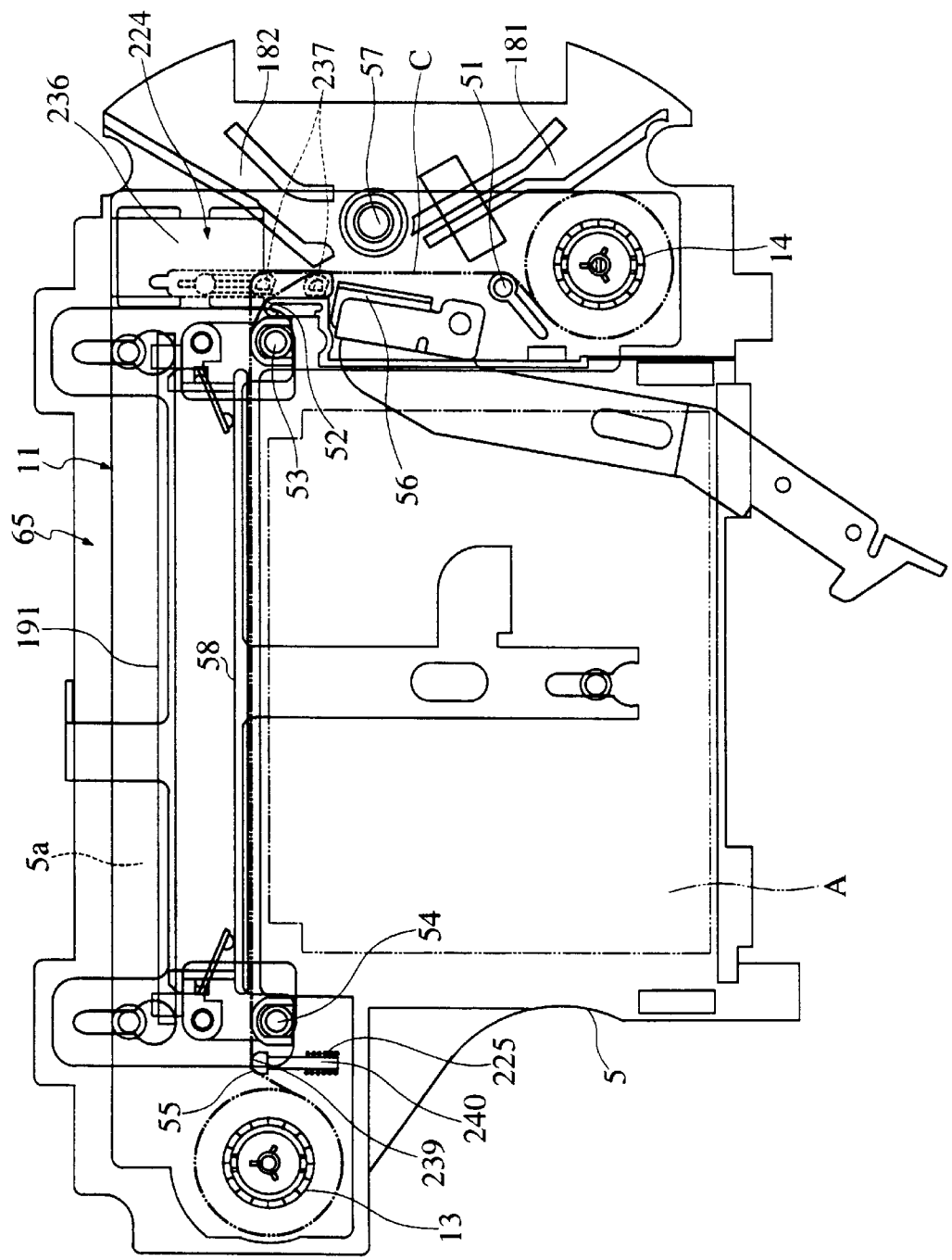
FIG. 22 is a plan view showing the mechanical block exclusive of the function switch, in which the ribbon cartridge has just been mounted.

As shown in FIGS. 20A and 21, the path-changing member 224 is comprised of a slider 236 slidably arranged at the corner of the base plate 222, and a path-changing pin 237 integrally formed with the slider 236. The slider is arranged such that the top thereof is exposed to the outside and at the same time flush with the top of the base plate 222. The path-changing pin 237 is moved transversely as the slider 236 slides, and stretches the ink ribbon between the take-up reel 13 and the supply reel 14 in a manner bent at right angles, when in the backward extremity position thereof. Before the ink ribbon cartridge 11 is mounted on the mechanical block body 5, the ink ribbon C is held in a state stretched to be bent at right angles, and after the ribbon cartridge 11 is mounted on the mechanical block body 5, the path-changing pin 237 is moved forward to the forward extremity position (see FIG. 22).

By the above arrangement, when the ribbon cartridge 11 is mounted, the path-changing pin 237 and the tension pin 55 cooperate to control the path of the ink ribbon C such that the ink ribbon C does not interfere with the presser plate 58, the stamp body A, the second path-setting pin 52, etc., and the path-changing pin 237 and the first path-setting pin 51 cooperate to control the path of the ink ribbon C such that the ink ribbon C does not interfere with the print head 56, the platen roller 57, etc. Then, after the ribbon cartridge 11 is mounted, the path-changing pin 237 is moved to thereby set the path of the ink ribbon C in position for feeding or for being on standby for feeding.

The tension pin 55 is comprised of a sliding contact portion 239 having a semicircular cross-section, and a support plate 240 supporting the sliding contact portion 239, and a coiled spring 225 arranged between the tension pin 55 and the base plate 222 urges the tension pin 55 in a direction for stretching the ink ribbon C. The urging force of the coiled spring 225 is moderate enough not to produce any wrinkles on the stretched ink ribbon C, and the tension pin 55 functions so as not to make the ink ribbon loose. That is, in a ribbon cartridge 11 for replacement, the take-up reel 13 and the supply reel 14 are in the rotation-inhibited state as described above, and the ink ribbon C is stretched between the take-up reel 13 and the supply reel 14. The tension pin 55 abutting the ink ribbon C prevents the ink ribbon C from becoming loose due to vibrations and the like.

Further, as described hereinbefore, when the presser plate 58 and the first and second guide pins 53, 54 are simultaneously moved forward toward the stamp body A to carry out the exposure, the tension pin 55 stretches the ink ribbon C to such a degree as will neither make the ink ribbon C loose nor produce any wrinkles on the ink ribbon C. If the tension pin 55 is not required to have the function described in the preceding paragraph, the tension pin 55 may be provided on the mechanical block body 5. This variation makes the tensioning function of the tension pin 55 more stable.

Figure 23A:
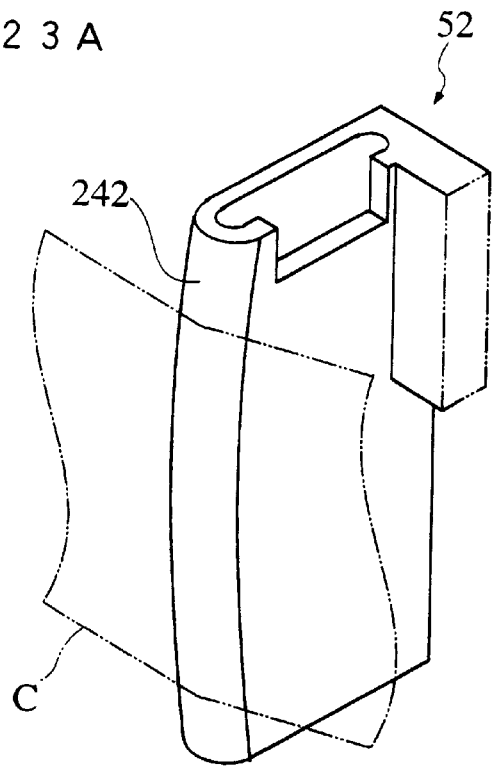
FIG. 23A is a partial perspective view showing a second path-setting pin.
Figure 23B:
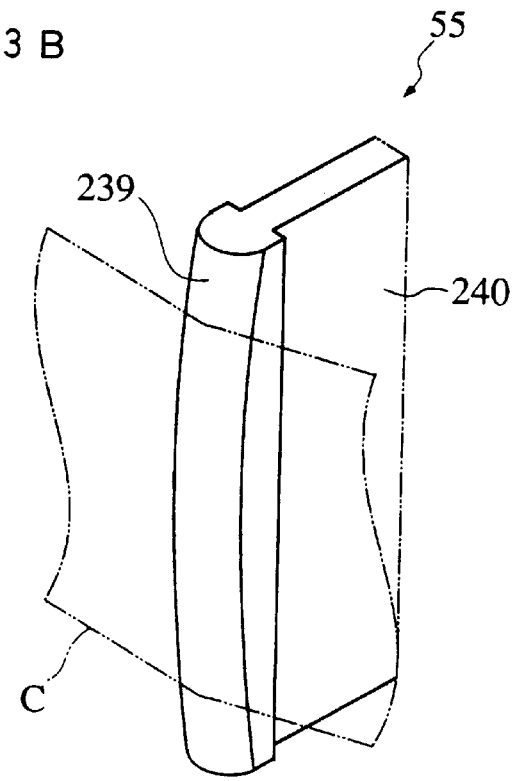
FIG. 23B is a partial perspective view showing a tension pin.

Further, as shown in FIGS. 23A and 23B, the sliding contact portion 242 of the second path-setting pin 52 and sliding contact portion 239 of the tension pin 55 are each formed such that it has a convex shape, similarly to a usual pulley, whereby the ink ribbon C is prevented from falling off the sliding contact portions 239, 242 when the ink ribbon C is fed in a state in which the width thereof extends vertically. This construction of the sliding contact portions 239, 242 also prevents the ink ribbon C from being fed in a state displaced laterally, i.e. in a state shifted to an upper or lower side of the feed path even if the ink ribbon C is not fed exactly perpendicularly to the sliding contact portions 239 and 242. That is, the ink ribbon C in sliding contact with the sliding contact portions 239 and 242 is fed along the path in a state such that the center of the width of the ink ribbon C expands slightly. The sliding contact portions 242, 239 of the second path-setting pin 52 and the tension pin 55, and the swingable ribbon-sliding members 215 of the first and second guide pins 53, 54 cooperate to hold the ink ribbon C at a fixed position in a vertical direction to thereby cause the ink ribbon C to face the exposure system 65 in parallel therewith.

Next, the detecting device 66, the operation of which is linked to the opening and closing of the lid 7, will be described. The detecting device 66 detects the mounting of the stamp body A in the pocket 6, and at the same time discriminates the type of the mounted stamp body A. The stamp body A includes various types having respective different shapes, e.g. ones for a square stamp, a personal name stamp, a business stamp, an address stamp, etc. The stamp bodies A for these different types of the stamp are identical in length, but different in width and thickness (see FIGS. 25A1 to 25G2). It should be noted that throughout the specification "length" of the stamp body A means a size of the stamp body A between the stamp surface A$d$ and the surface on an opposite side thereof, "width" of the same means a size of the stamp body A between the surfaces of opposite lateral ends thereof in its position mounted in the pocket 6, and "thickness" of the same means a size of the stamp body between an upper side surface and a lower side surface of the stamp body in its position mounted in the pocket 6. In detecting the type of the stamp body A by the detecting device 66, it is assumed that a stamp body A having any of the different shapes is properly set in the pocket 6. Further, to properly conduct the exposure on the stamp body A as well, it required that the stamp body A is properly set therein. Therefore, detailed description will be first made of construction of the stamp body A including a structure thereof adapted for mounting in the pocket 6.

The stamp body A is mounted in the pocket 6 such that an imaginary line (center) extending through the stamp body A which is central with respect to the width of the stamp body and an imaginary line (center) through the same which is central with respect to the thickness thereof are brought to identical positions within the pocket 6. The mounting of the stamp body A in the pocket 6 is effected by cooperation of a plurality of bosses 251$a$, 251$b$ arranged on the bottom 6$b$ of the pocket 6 in a manner projecting upward and a plurality of boss holes A$f$1, A$f$2 formed in the bottom of the stamp body A.

Figure 24:
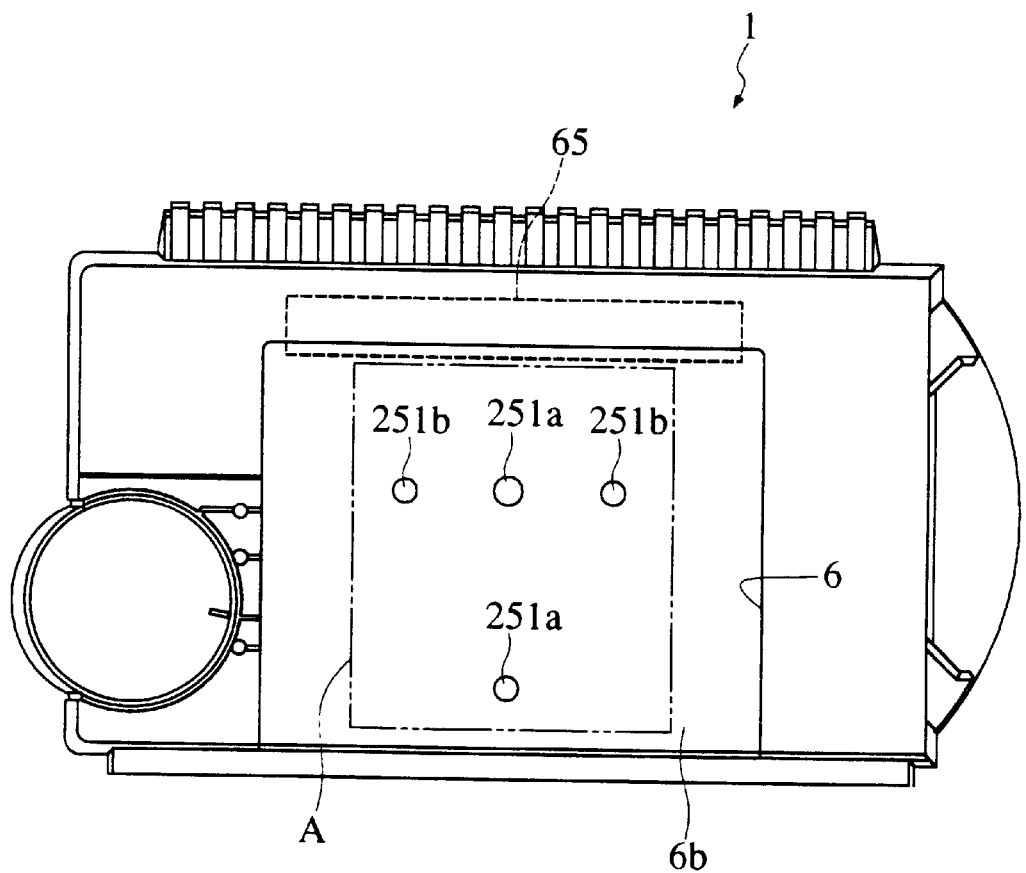
FIG. 24 is a plan view showing a pocket of the mechanical block from which a lid is removed and component parts associated with the pocket.

As shown in FIG. 24, on the bottom 6$b$ of the pocket 6, there are provided two main support bosses 251$a$, 251$a$ extending upward at respective locations on the imaginary line on the bottom 6$b$ of the pocket 6 which is substantially central with respect to the width of the pocket, and a pair of auxiliary support bosses 251$b$. 251$b$ extending upward at respective locations axisymmetric with respect to the imaginary line on opposite sides of the main support boss 251$a$ on the exposure block side. That is, the main and auxiliary support bosses, four in total, are generally in the T-shaped arrangement, and support the stamp body A in a manner properly positioned within the pocket 6. The main support bosses 251$a$, 251$a$ form main means for supporting the stamp body A. One 251$a$ on the front side or lower side as viewed in the figure and one 251$a$ on the exposure block side have respective diameters different from each other, whereby improper mounting of a stamp body in an inverted direction is prevented.

On the other had, as shown in FIGS. 25A1 to 25G2, there are different types of stamp bodies A, i.e. ones of a square stamp (small), a square stamp (large), a personal name stamp, a business stamp (small), a business stamp (large), an address stamp, a maximum size stamp, etc. Each stamp body of these types has main and auxiliary boss holes A$f$1, A$f$2 formed in the bottom thereof for having the main and auxiliary support bosses 251$a$, 251$b$. fitted therein, respectively. The two main boss holes A$f$1, A$f$1 are arranged on an imaginary line on the stamp body which is central with respect to the width of the stamp body A, and a pair of auxiliary boss holes A$f$2, A$f$2 are arranged at respective locations axisymmetric with respect to the imaginary line on the stamp body on opposite side of the main boss hole A$f$1 on the exposure block side in its mounted position. Further, the main and auxiliary boss holes A$f$1, A$f$2 are formed to respective depths such that when the stamp body A of any type is mounted in the pocket, an imaginary line through the stamp body A which is central with respective to the thickness thereof is at a level of an upper end of the main support boss A$f$1. Further, type-detecting holes A$h$ are formed in the back A$g$ of the stamp body A on the side opposite to the stamp surface A$d$.

More specifically, when the stamp body A is set in the pocket such that the main and auxiliary support bosses 251$a$, 251$b$ are fitted in the main and auxiliary boss holes A$f$1, A$f$2, the imaginary line on the stamp body which is central with respect to the width thereof is aligned to a position in the exposure system 65 which is central in the printing area with respect to the longitudinal direction (more strictly, a center of a printing area of the ink ribbon C fed to the exposure system 65, which is central with respect to the longitudinal direction i.e. direction of feed of the ink ribbon C before the exposure system), and at the same time the imaginary line through the stamp body which is central with respect to the thickness thereof is aligned to a central position in the exposure system 65 which is central with respect to the vertical direction (more strictly, a position of the printing area of the ink ribbon C fed to the exposure system 65 which is central in the printing area with respect to the vertical direction). This manner of mounting the stamp body A is capable of setting the stamp body A within the pocket 6 such that the center of the stamp surface of the stamp body A is in alignment with the position of a center of a printing area of the ink ribbon C, and the exposure is carried out in this state of the stamp body and each printing area of the ink ribbon C.

On the other hand, as shown in FIGS. 25A1 to 25G1, the auxiliary support bosses 251b are shorter in height than the main support bosses 251a, whereby the positioning or alignment of the stamp body A is effected by two steps, when the stamp body A is set in the pocket A, which facilitates accurate mounting of the stamp body A. The main support bosses 251a are set to such a height that when the stamp body A of the square stamp (large) or the maximum size stamp, which has the maximum thickness, is set in the pocket, the bottom of the stamp body A is properly brought into contact with the bottom 6b of the pocket 6. This minimizes the depth of the pocket 6. Further, the height of the auxiliary support bosses 251b is set to such a height that when the stamp body A of the personal name stamp, which has the minimum thickness, is set in the pocket, the bottom of the stamp body A abuts upper ends of the auxiliary support bosses 251b. This makes it unnecessary for a stamp body of the personal name stamp to be formed with auxiliary boss holes Af2 corresponding to the auxiliary support bosses 251b.

Further, the pair of auxiliary support bosses 251b, 251b are arranged at such respective locations that they are outside a stamp body A of the square stamp (small) or the square stamp (large) which is narrow in width, when the stamp body A is set in the pocket 6. The auxiliary support bosses 251b, 251b enables stamp bodies large in width to be supported in a stable manner. The locations of this pair of auxiliary support bosses 251b, 251b are set such that the auxiliary support bosses 251b hold the stamp body A of the square stamp (large) in a sandwiching manner when the stamp body A is properly set in the pocket 6. While the stamp body A of a stamp which is narrow in width can be supported by the main support bosses 251a alone, the provision of the auxiliary support bosses 251b enables the stamp body of the square stamp (large) which is slightly larger in width than the square stamp (small) to be set in the pocket in a more stable manner than without the auxiliary support bosses 251b. Therefore, stamp bodies of the personal name stamp, the square stamp (small), and the square stamp (large) are formed with the main support bosses alone, but without the auxiliary support bosses.

Thus, the mounting of the stamp body A in the pocket 6 is effected by cooperation of four bosses 251a, 251b projecting upward from the bottom 6b of the pocket 6, and two or four boss holes Af1, Af2 formed in the bottom of the stamp body A. Therefore, a stamp body A of any of the above-mentioned various types can be properly set in the pocket 6 with respect to the ink ribbon C with sufficient space formed between the inner side walls of the pocket 6 and the lateral sides of the stamp body A for fingers of the user to be inserted therein, thereby permitting the stamp body A to be easily mounted in the pocket or removed therefrom.

Figure 34A:
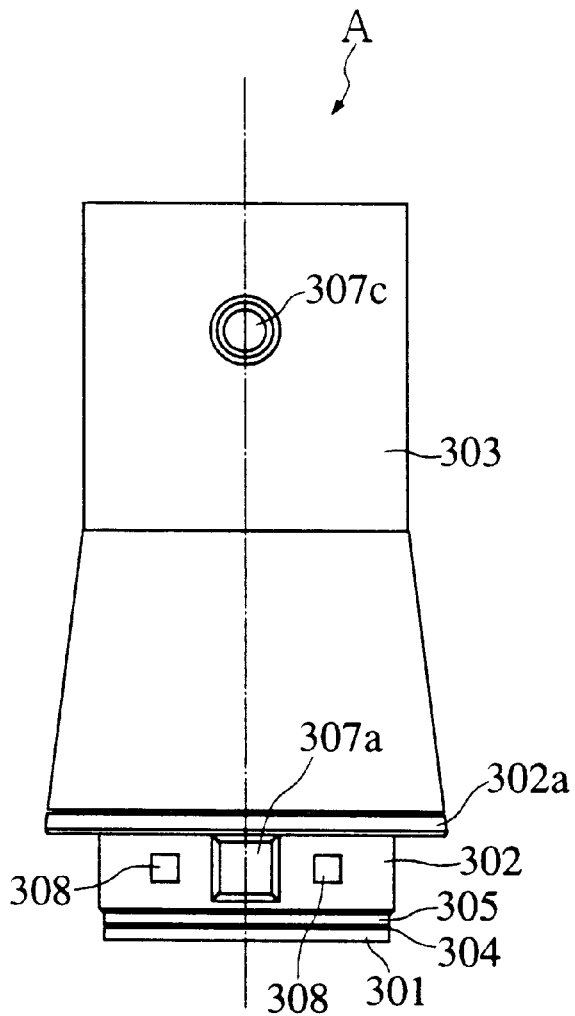
FIG. 34A is a diagram showing a surface of the stamp body of the square stamp via which the stamp body is mounted on the bottom of the pocket.
Figure 34B:
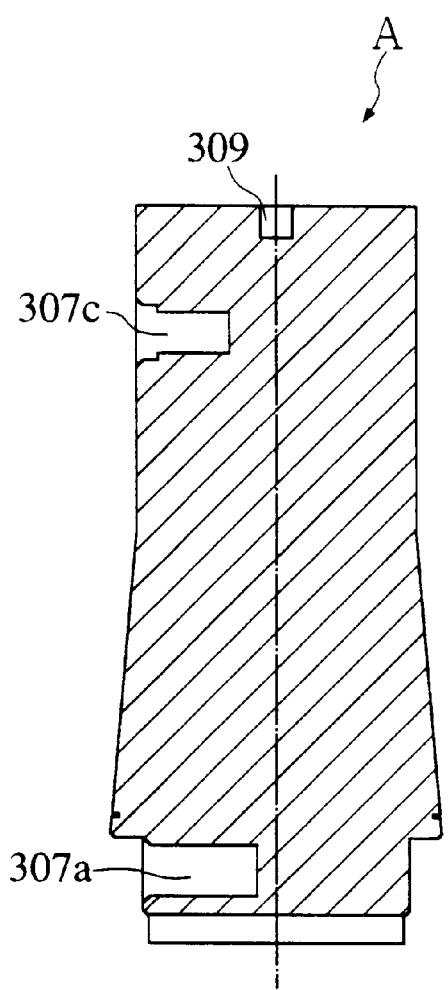
FIG. 34B is a cross-sectional view of the FIG. 34A stamp body.
Figure 34C:
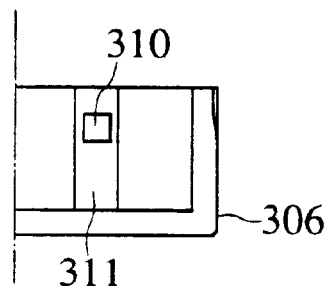
FIG. 34C is a partial view of the inside of a cap for being fitted on the FIG. 34A stamp body.
Figure 34D:
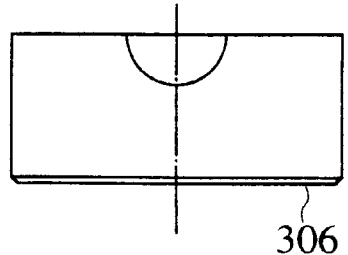
FIG. 34D is a side elevation of the FIG. 34C cap.
Figure 35A:
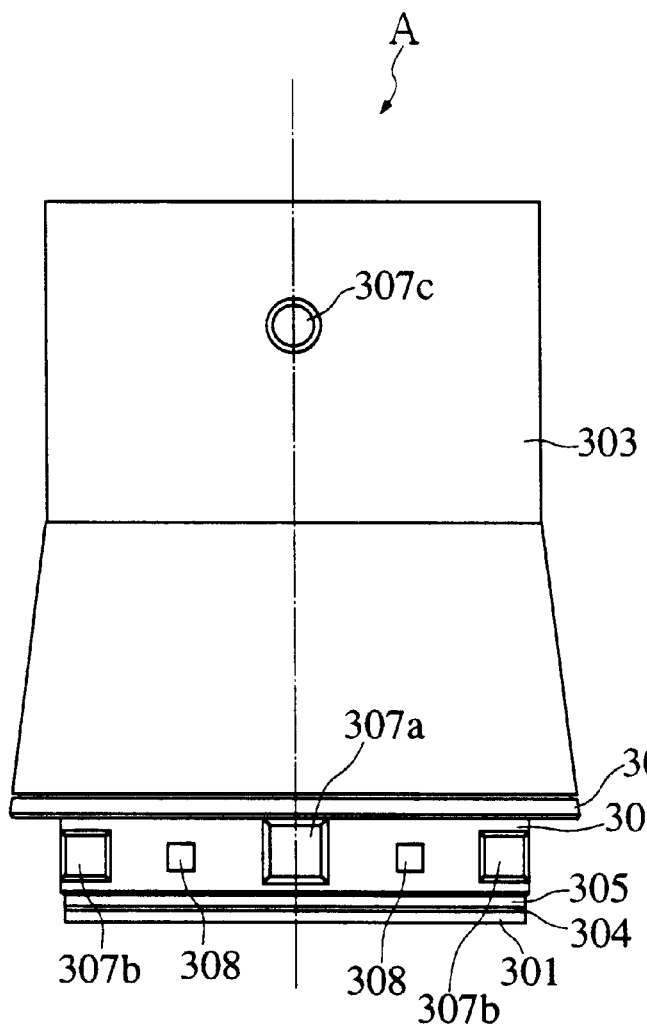
FIG. 35A is a diagram showing a surface of the stamp body of the personal name stamp via which the stamp body is mounted on the bottom of the pocket.
Figure 35B:
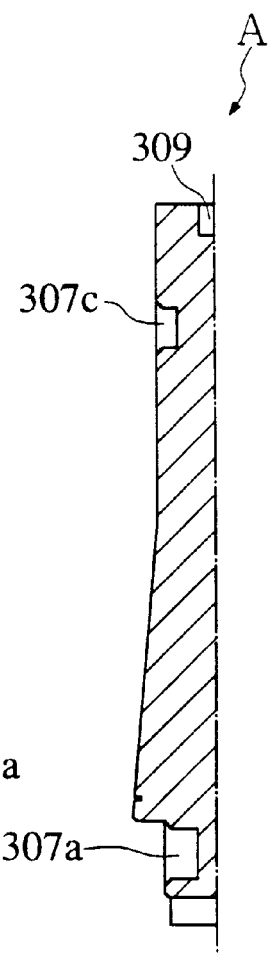
FIG. 35B is a partial cross-sectional view of the FIG. 35A stamp body.
Figure 35C:
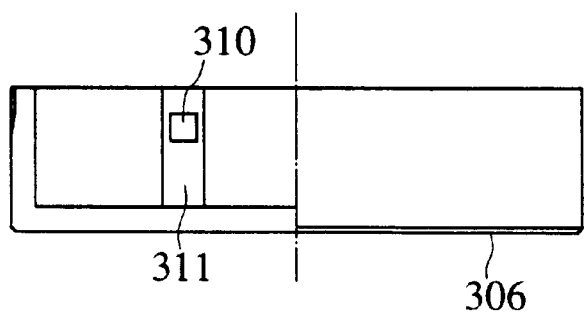
FIG. 35C is a cutout view of the inside and outside of a cap for being fitted on the FIG. 35A stamp body.
Figure 35D:
FIG. 35D is a partial side elevation of the FIG. 35C cap.
Figure 36A:
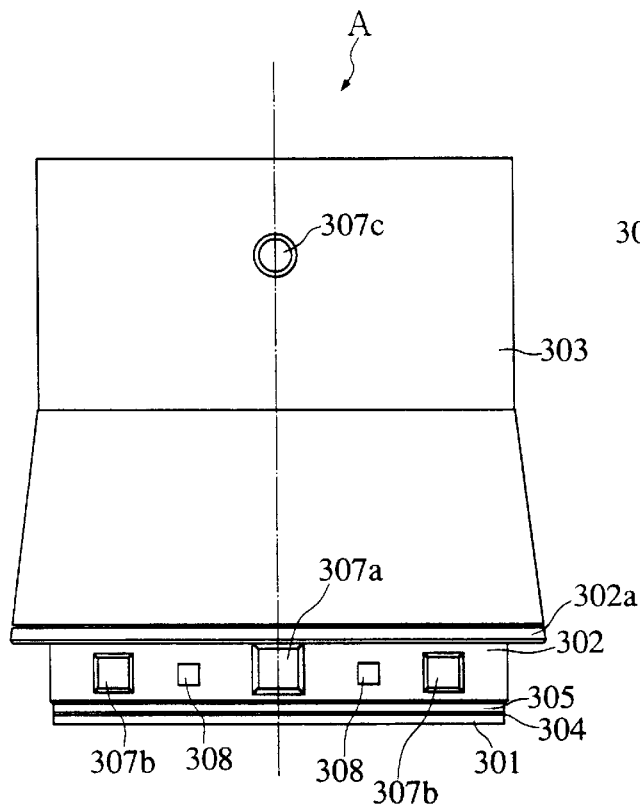
FIG. 36A is a diagram showing a surface of the stamp body of the small business stamp via which the stamp body is mounted on the bottom of the pocket.
Figures 36B, 36C:
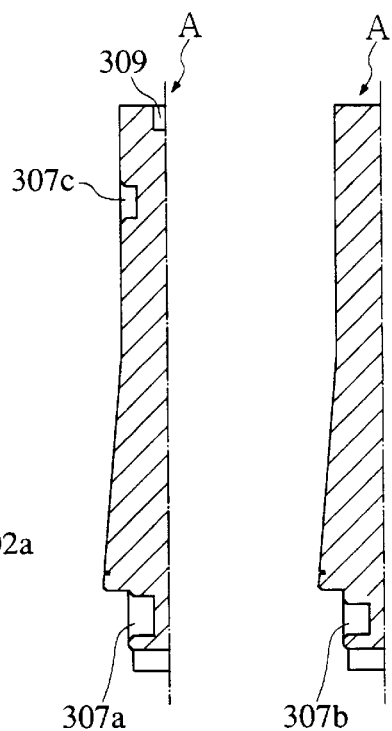
FIG. 36B is a partial cross-sectional view of the FIG. 36A stamp body taken along a line extending through a main boss hole in the direction of length of the stamp body.
FIG. 36C is a partial cross-sectional view of the FIG. 36A stamp body taken along a line extending through an auxiliary boss hole in the direction of length of the stamp body.
Figure 36D:
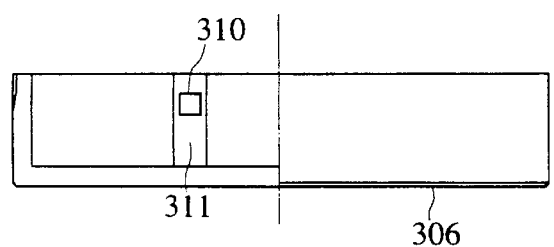
FIG. 36D is a partially cutout view of the inside and outside of a cap for being fitted on the FIG. 36A stamp body.
Figure 36E:
FIG. 36E is a partial side elevation of the FIG. 36D cap.

Next, another embodiment of the stamp body A will be described with reference to FIGS. 34A to 38E. As shown therein, the stamp body A is comprised of an ultraviolet-curing resin as a receiving member which is exposed to be exposed to ultraviolet rays, a holder 302 as a receiving member-attaching portion to which the receiving member is attached, and a stock 303 (formed of a resin in the present embodiment) as a receiving member-holding part for holding the receiving member, as well as a resin base 304 which is not curable by ultraviolet rays and a sponge 305 which are interposed between the ultraviolet-curing resin 301 and the holder 302 in the mentioned order. The ultraviolet-curing resin 301 forms an area on which stamp images are formed, and is exposed to ultraviolet rays for being cured to form shapes of characters. FIGS. 34A and 34B show a stamp body of a square stamp, while FIGS. 34C and 34D show a cap for the square stamp. FIGS. 35A and 35B show a stamp body of a personal name stamp, while FIGS. 35C and 35D show a cap for the personal name stamp. FIGS. 36A to 36C show a stamp body of a small business stamp, while FIGS. 36D and 36E show a cap for the small business stamp. FIGS. 37A to 37C show a stamp body of a large business stamp, while FIGS. 37D and 37E show a cap for the large business stamp. FIGS. 38A to 38C show a stamp body of an address stamp, while FIGS. 38D and 38E show a cap for the address stamp.

The holder 302 forms part of the stamp on which a cap 306 for protection of the ultraviolet-curing resin 301 is fitted, and has a main boss hole 307a and auxiliary boss holes 307b formed in portions to be covered by the cap, for respectively receiving the main support boss 251a and the auxiliary support bosses 251b. The main boss hole 307a and the auxiliary boss holes 307b are square holes, whereby the main support boss 251a and the auxiliary support bosses 251b each in a columnar form can be easily fitted therein without spoiling the accuracy of positioning or alignment of the stamp body A effected thereby. Since the main boss hole 307a and the auxiliary boss holes 307b are not formed in the stock 307 but in the holder 302, part for effecting positioning of the stamp body A is located at a position closest to the ultraviolet-curing resin 301. This ensures the accuracy of positioning effected by the use of these holes. Further, on opposite sides of the main boss hole 307a, there are formed a pair of projections 308, 308 (actually, another pair of projections 308, 308 are also formed on the reverse side which are hidden in the figure) for catching the cap 306. The stamp body for the square stamp shown in FIGS. 34A and 34B are not formed with the auxiliary boss holes 307b.

Further, the holder 302 has a flanged portion 302a at a root portion thereof, which forms a band exposed from between the stock 303 and the cap 306 when the cap 306 is fitted on the stamp body A. The holder 302 including the flanged portion 302a has a color specifically selected to a type of the stamp, similarly to the plate-making sheet B, which helps the user recognize the type of the stamp with ease. The color is uniformly used for the plate-making sheet B and the holder 302 for each type of stamp.

The sponge 305 is a thin member made of foamed urethane, and not only serves as an aide for proper stamping action by the user, but also has a function of bringing the ink ribbon C as a mask into intimate contact with the ultraviolet resin 301 with accuracy when the exposure is carried out.

The stock 303 is made of a resin, and is shaped such that a holder-side half portion thereof is expanded toward the holder 302. This shape of the stock 303 prevents slippage of the user's fingers when the user presses the stamp for imprinting, and also makes the stamp body A excellent in design. The stock 303 has a main boss hole 307c formed on an imaginary line (center) which is central with respect to the width of the stamp body A and extends along the length thereof for receiving the main support boss 251a. The main boss hole 307c has a shape which is slightly elliptic (though not recognized in the figure) i.e. elongated in cross-section in the direction of the length of the stamp body A, so as to provide ample clearance with respect to the main support boss 251a corresponding thereto for compensating for or absorbing variations in dimensions among individual stamp bodies A caused by manufacturing process. That is, the main and auxiliary boss holes 307a, 307b formed in the holder 302 mainly effects positioning of the stamp body A in the directions of the length and the width thereof, and the main boss hole 307a formed in the holder 302 and the main boss hole 307c formed in the stock 303 mainly effects positioning of the stamp body A in the direction of the thickness. A stamp type-detecting hole 309 is formed in the back of the stamp body A.

The cap 306, on the other hand, is made of a resin which is identical both in material and color to those of the stock 303. The inner surface of the cap 306 is formed with recesses 310 in a manner corresponding to the projections 308 formed on the holder 302. Each recess 310 is formed in a strip-shaped projection 311 provided on the inner surface of the cap 306. The strip-shaped projection 311 is brought into direct contact with the holder 302. This helps the cap 306 to be fitted on the holder 302 without looseness, and permits the cap 306 to be formed by a thin material. Further, since the recesses 310 are each formed in a manner making a depression in the surface of the strip-shaped projections 311, the ultraviolet-curing resin 301 is prevented from being caught therein.

When the stamp body A constructed as above is set in the pocket 6 after removing the cap 306 therefrom, similarly to the embodiment described hereinbefore, the main support bosses 251a and the auxiliary support bosses 251b are fitted in the main boss holes 307a, 307c and the auxiliary boss holes 307b of the stamp body A, whereby positioning of the stamp body A is effected in the directions of the length, width, and thickness thereof, to properly set the stamp body A in the pocket 6. More specifically, in the examples of stamp bodies of various types of stamps illustrated in FIGS. 34A to 38E, the main and auxiliary boss holes 307a, 307b, 307c are formed at respective identical locations, whereby a position in any stamp body set in the pocket which is central with respect to the direction of the width thereof is brought to an identical position in the pocket 6. Further, the main and auxiliary boss holes are formed to depths varied according to the thickness of each type of stamp body A, so that any type of stamp body mounted in the pocket has a point or portion thereof which is central with respect to the thickness thereof is brought to an identical position in the pocket 6.

Figure 39:
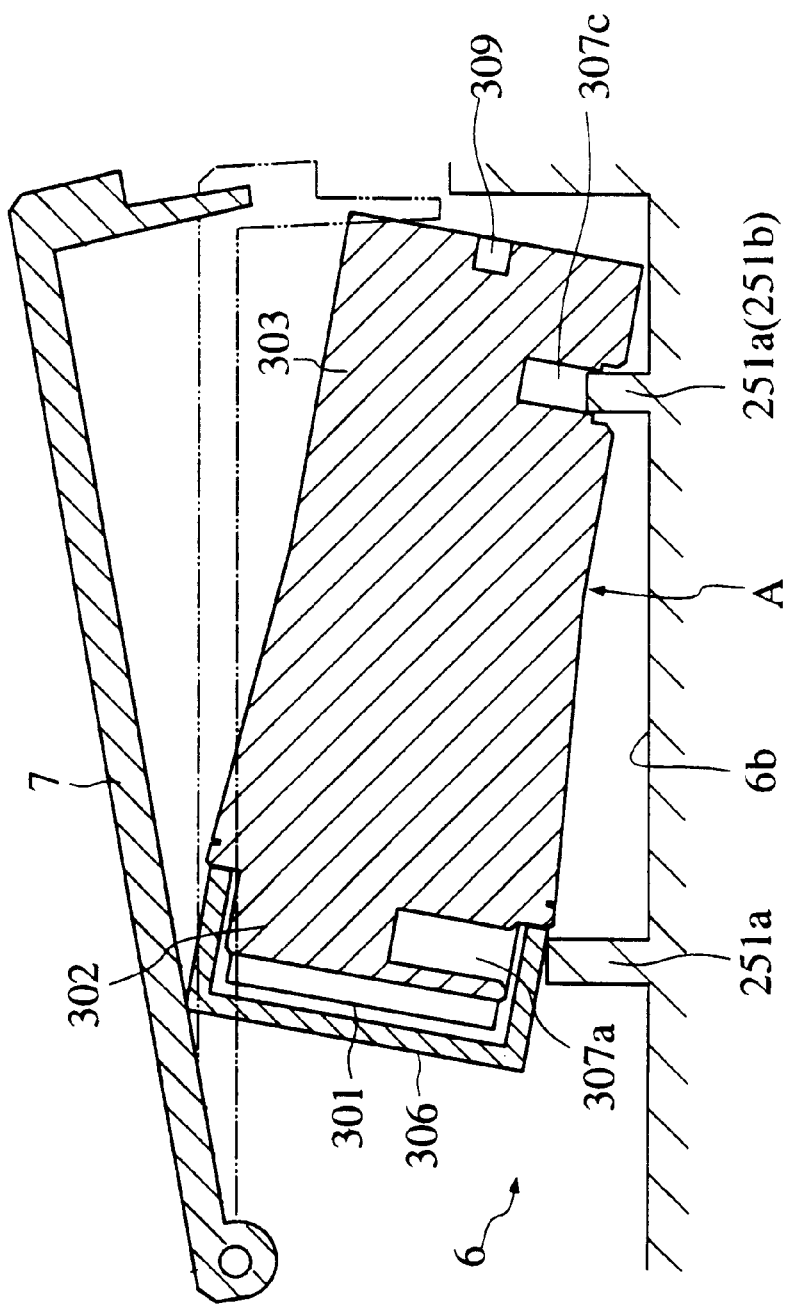
FIG. 39 is a cross-sectional view of a stamp body mounted in the pocket, with its cap fitted thereon.

On the other hand, as shown in FIG. 39, if the user carelessly attempts to set the stamp body A with its cap fitted thereon in the pocket 6, the main and auxiliary support bosses 251a, 251b are prevented from being fitted in the main and auxiliary boss holes 307a, 307b, since they are covered by the cap 306, so that the stamp body A is set in the pocket with its front end lifted. Therefore, the user readily notices an improper setting state of the stamp body having its cap 306 fitted thereon, and the lid 7 is also prevented from being closed. This prevents the stamp body A for being exposed to ultraviolet rays with its cap 306 fitted thereon, ensuring prevention of erroneous operation of the stamp-making apparatus.

Further, means for making the user aware of the improper setting state of the stamp body A in the pocket 6 with its cap 306 fitted thereon may be implemented by a projection formed on the lid 7 or the bottom 6b of the pocket 6 which abuts the cap 306, thereby preventing the lid 7 from being closed, if the above-described means is not employed.

Now, the detecting device 66 will be described in detail.

As described hereinabove, the back surface Ag, i.e. the surface on the side opposite to the stamp surface Ad (301 in the second-mentioned embodiment of the stamp body A) is formed with a plurality of small holes Ah (type-detecting holes) at respective central locations i.e. at locations intermediate along the thickness of the stamp body A, in a horizontal direction. The small holes Ah cooperate with a switch array 262 of the detecting device 66, described hereinafter, to detect the type of the stamp body A (see FIGS. 31A to 31G and 32). The stamp character label Bd of the plate-making sheet B printed with stamp characters and delivered to the outside of the apparatus separately from the ink ribbon C is affixed to the back surface Ag of the stamp body A, whereby the small holes Ah are concealed.

Figure 26:
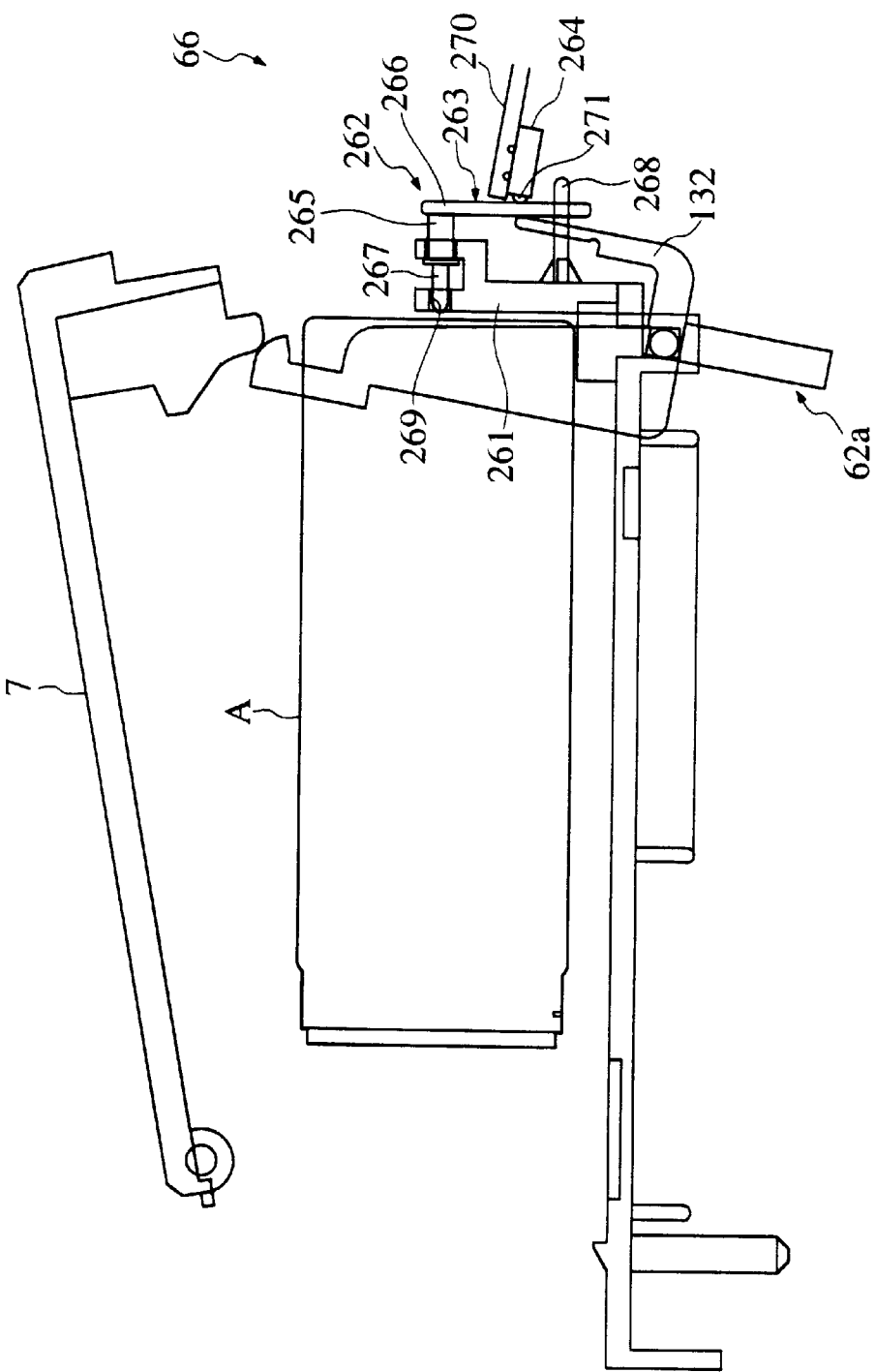
FIG. 26 is a cross-sectional view showing the pocket as well as a detecting device and component parts associated therewith.
Figure 27:
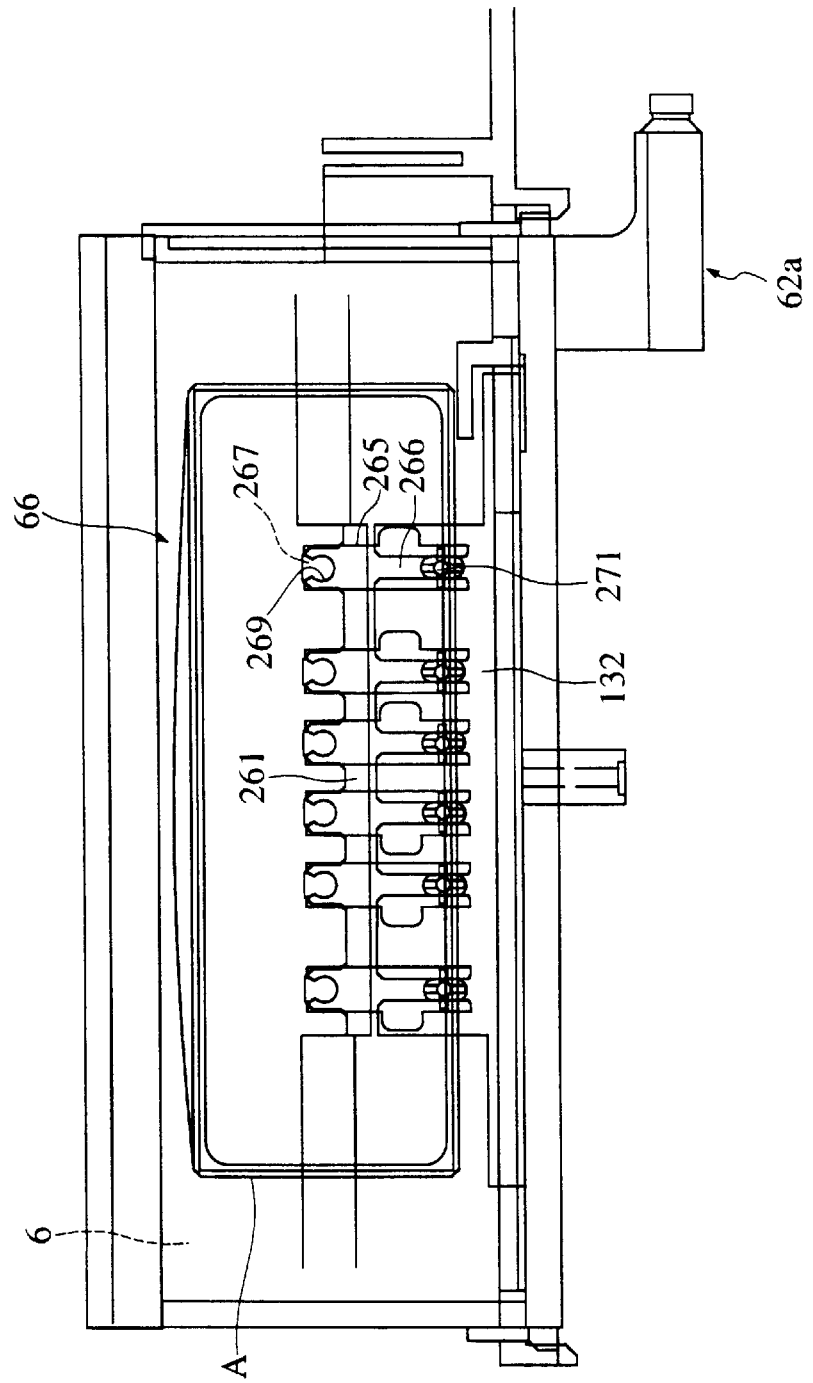
FIG. 27 is a front elevation showing the pocket as well as the detecting device and the component parts associated therewith.
Figure 28:
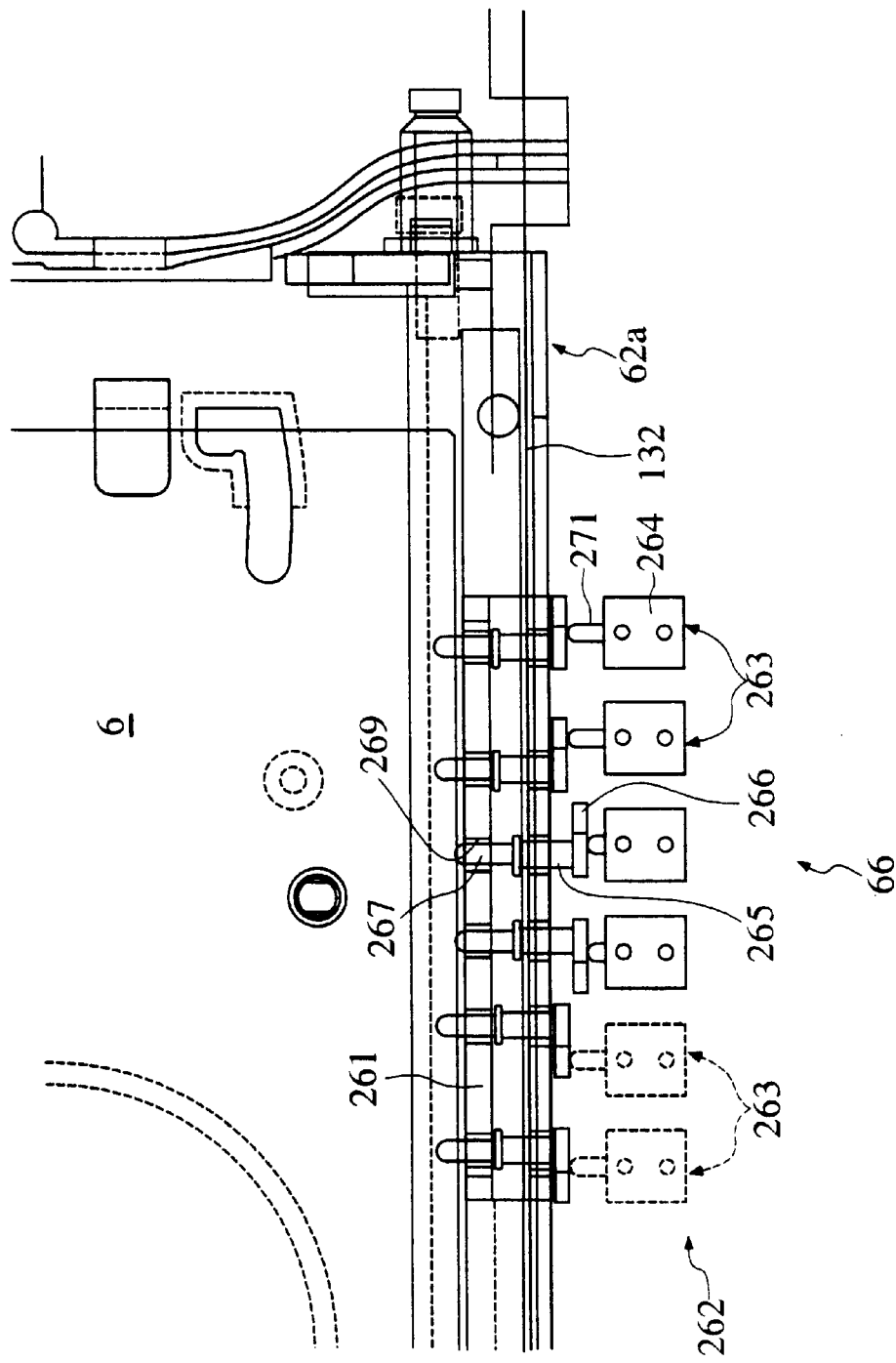
FIG. 28 is a partial plan view showing part of the pocket as well as the detecting device and the component parts associated therewith.

The detecting device 66, as shown in FIGS. 26 to 28, includes switch holders 261 (also serving as the walls of the pocket 6) arranged opposed to the back surface Ag of the stamp body A, and the switch array 262 formed of six detecting switches 263 supported on the switch holders. Each detecting switch 263 is comprised of a switch body 262 formed e.g. of a push switch, and a switch top 265 having one end for being projected into the pocket 6. The switch top 265 is formed by a plate portion 266 and a detecting projection including the one end 267 extending at right angles to the plate portion 266, with a lower part of the plate portion 266 being guided by a guide projection 268 formed in the switch holder 261 and the detecting projection 267 being guided by a guide hole 269 formed in the switch holder 261 for forward and backward motions thereof.

The switch body 264 is fixed to the reverse side surface of a base plate 270 such that a plunger 271 thereof abuts the plate portion 266 of the switch top 265. The plunger 271 urges the switch top 265 toward the pocket 6 by its urging force. A state of the one end of the detecting projection 267 projected into the pocket 6 via the guide hole 269 through the switch holder 261, and a state of the same being retracted against the urging force of the plunger 271 correspond to ON-OFF states of the detecting switch 263, respectively.

On the other hand, a switch-operating portion 132 of the lid-opening link 62a is caused to abut the plate portion 266 of the switch holder 261, thereby urging the plate portion 266 against the urging force of the plunger 271. With rotation of the lid-opening link 62a, all the switch tops 265 are moved forward or backward. The switch-operating portion 132 and the switch top 265 may be formed as a unitary member. Alternatively, the switch top 265 and the detecting switch 263 may be formed as a unitary member, and the switch-operating block 132 may move the base plate 270.

When the lid-opening link 62a rotates in a clockwise direction as viewed in FIG. 26 to hold the lid 7 open, the switch top 265 moves forward (toward the base plate 270 side) so that the detecting projection 267 is retracted from within the pocket 6. This cancels the detecting mode of the detecting device 66, and the stamp body A can be mounted or removed without interference to the detecting projection 267. On the other hand, when the lid-opening link 62a is rotated in an anticlockwise direction to hold the lid 7 closed, the switch top 265 moves backward (to the pocket 6 side) so that the detecting projection 267 projects into the pocket 6. This sets the detecting mode of the detecting device 66. In this mode of the detecting device, if the stamp body A is mounted in the pocket 6, the switch top 265 is brought into contact with the stamp body A to turn off the detecting switch 263 whereby the mounting of the stamp body A is detected (see FIG. 29). Inversely, if the stamp body A is not mounted, the switch top 265 projects to the maximum extent to turn on the detecting switch 263, whereby the removal of the stamp body A is detected.

Actually, when any of the detecting switches 263 of the switch array 262 is turned off, mounting of the stamp body A is detected, whereas when all of the detecting switches 263 are turned on, removal of the stamp body A is detected. Alternatively, instead of setting or canceling the detecting mode of the detecting device 66, opening of the lid 7 may be detected by detecting the retraction of the detecting projections 267 of the switch top 265 shown in FIG. 26 from within the pocket 6, or a priority detection signal for inhibiting the exposure may be generated by the detection of the retraction of the detecting projections 267.

Figure 29:
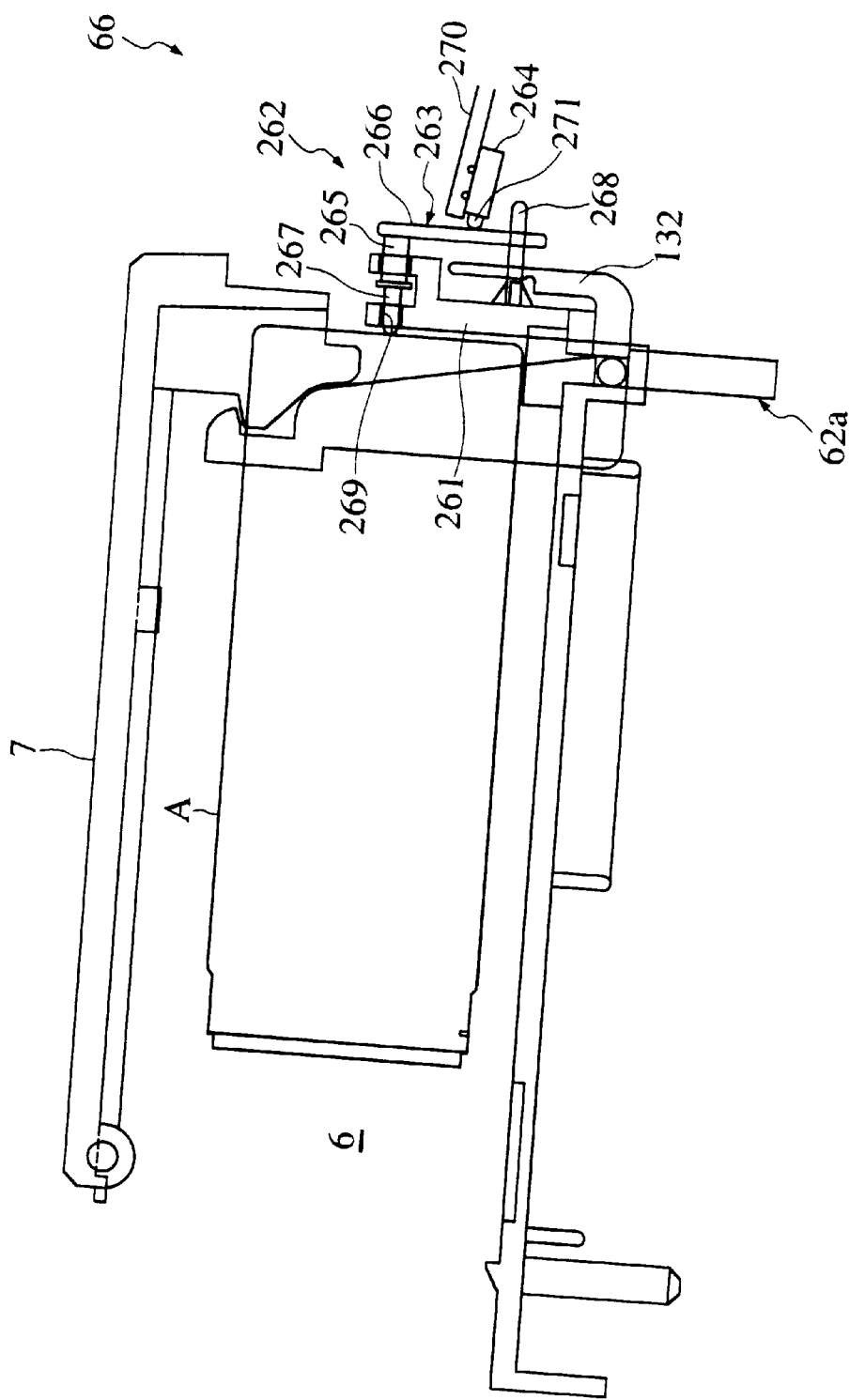
FIG. 29 is a cross-sectional view which is useful in explaining one of two states of detecting operation of the detecting device.
Figure 30:
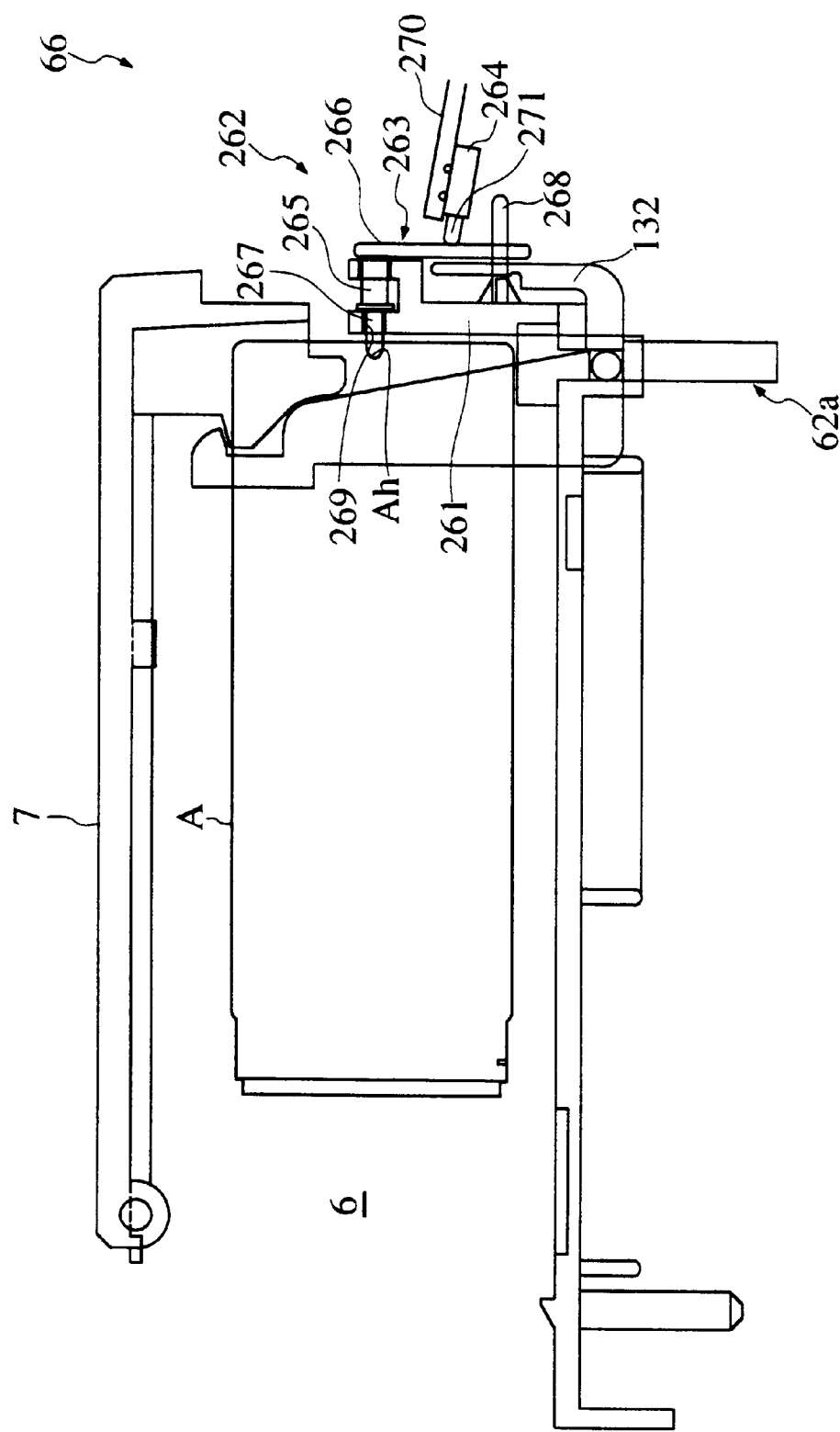
FIG. 30 is a cross-sectional view which is useful in explaining the other of two states of detecting operation of the detecting device.

Further, the detecting switches 263 of the switch array 262 are each in ON or OFF state depending on whether a corresponding small hole A$h$ exists in the stamp body A, as shown in FIG. 29 or 30. Therefore, the type of the stamp body A can be determined from a pattern of ON/OFF states of the six detecting switches 263.

FIGS. 31A to 31G show the relationship between small holes A$h$ in the stamp body A and the six detecting switches 263 (detecting projections 267). Provision of the six detecting switches 263 for detecting presence or absence of the small holes A$h$ makes it possible to detect $2^6-1$, i.e. 63 types of patterns. A stamp body A for a square stamp or the like, which is small in width, has no small holes A$h$ corresponding to two outermost detecting switches 263, 263 on respective opposite sides, and the two detecting switches 263, 263 project into space beside the stamp body A. That is, a stamp body having a small width, such as a stamp body for a square stamp, is recognized as a pattern for a stamp body having imaginary small holes A$h$ at outermost locations thereof.

In other words, out of the 63 types of patterns, ones having small holes A$h$ at outermost locations of the stamp body A are assigned to stamp bodies A for the square stamps and the like which have small widths, whereby stamp bodies which do not have a sufficient width for possible small holes A$h$ corresponding to all the detecting switches 263 can be discriminated, without decreasing the number of possible patterns of small holes. The six detecting switches 263 include spare switches, and in practice, four detecting switches 263 are sufficient.

Although in the above embodiments, description has been made of the stamp-making apparatus as the electronic apparatus and the access object as the stamp body, this is not limitative, but the invention can be applied to an electronic apparatus which deals with an access object in a rectangular form, such as a videocassette recorder in which a videocassette tape (provided in a plurality of types) is loaded.

It is further understood by those skilled in the art that the foregoing is preferred embodiments of the invention, and that various changes and modifications may be made without departing from the sprit and scope thereof.

What is claimed is:

1. A stamp making apparatus comprising:
   a body having a pocket with an open top and a closed bottom for receiving any one of a plurality of different types of access objects which are introduced into said pocket via said top and are mounted on said bottom, each of the access objects having an accessible end surface:
   access means arranged in said body for accessing the end surface of an object mounted on said bottom; and
   a plurality of main support bosses disposed on, and extending upwardly from, said bottom of said pocket for supporting an access object, said plurality of main support bosses extending along a line which is centered with respect to the width of said pocket.

2. A stamp making apparatus according to claim 1 wherein said pocket has a width, the end surface of each access object has a first side which is parallel to said pocket bottom when the access object is mounted in said pocket, the length of the first side being different for each different type of access object.

3. A stamp making apparatus according to claim 2, wherein each access object has the form of a prism and has a plurality of boss holes arranged on a line perpendicular to the end surface and centered with respect to the first side of the end surface in a manner such that the boss holes correspond in position to the plurality of main support bosses.

4. A stamp making apparatus according to claim 3, further comprising at least one pair of auxiliary support bosses disposed on, and extending upwardly from, said bottom of said pocket at locations axisymmetric with respect to the line which is centered with respect to the width of said pocket.

5. A stamp making apparatus according to claim 4, wherein said at least one pair of auxiliary support bosses are positioned outside one type of access object which is small in width, when an access object of that type is mounted in said pocket.

6. A stamp making apparatus according to claim 3 wherein the boss holes are dimensioned for causing the end surface of any type of access object mounted in said pocket to be at a given height relative to said bottom of said pocket.

7. A stamp making apparatus according to claim 3, wherein said access means is an exposure system, and each of the access objects is a stamp body whose end surface can be exposed to light by said exposure system to form a stamp surface.

8. A stamp making apparatus according to claim 1 wherein each access object has bottom and top surfaces which are opposite one another and extend perpendicularly to the end surface, and each access object has a plurality of boss holes formed in the bottom surface and dimensioned so that when any one of the access objects is supported in said pocket, a plane parallel to, and midway between, the bottom and top surfaces is at a predetermined level relative to said access means.

9. A stamp making apparatus according to claim 8 wherein the boss holes in one type of access object have dimensions different from those in another type of access object.

10. A stamp making apparatus according to claim 9 wherein: said pocket has a width; said plurality of main support bosses are arranged on a line which extends along said bottom of said pocket perpendicular to said width of said pocket; the end surface of each access object has a first side which is parallel to said pocket bottom when the access object is mounted in said pocket; and the plurality of boss holes in each access object are arranged on a line which is perpendicular to and midway between the ends of the first side of the end surface of that access object.

11. A stamp making apparatus according to claim 10, further comprising at least a pair of auxiliary support bosses arranged at axisymmetric locations with respect to the line which extends along said bottom of said pocket.

12. A stamp making apparatus according to claim 11, wherein said at least one pair of auxiliary support bosses are located to be positioned outside of one of the types of access objects which is small in width, when an access object of that type is mounted in said pocket.

13. A stamp making apparatus according to claim 12, wherein said access means is an exposure system, and each access object is a stamp body whose end surface is arranged to be exposed to light by said exposure system to form a stamp surface.

14. In a stamp making apparatus comprising: a body having a pocket for receiving an access object, the access object including a receiving member having an accessible end surface and a cap for covering the end surface; and access means in said body for accessing the end surface, the improvement comprising: a lid for closing said pocket; and inhibiting means for inhibiting closing of said lid by preventing the access object from being received in said pocket when the cap is covering the end surface.

15. A stamp making apparatus according to claim 14, wherein said inhibiting means comprises a projection formed on an inner side of said lid for abutting on the cap fitted on the end surface in the course of closing of said lid.

16. A stamp making apparatus according to claim 14, wherein said inhibiting means comprises a projection formed on a wall of said pocket for abutting on the cap fitted on the end surface to thereby hold the access object in a lifted position in said pocket.

17. A stamp making apparatus according to claim 16 wherein: said wall of said pocket is a bottom wall; said apparatus further comprises a first support boss disposed on, and extending upwardly from, said bottom wall of said pocket for positioning the access object; the access object has a receiving member attaching portion formed with a first boss hole located to receive said first support boss; said projection is constituted by said first support boss; and when the cap covers the end surface, the cap also covers the first boss hole.

18. A stamp making apparatus according to claim 17, wherein said first support boss has a columnar shape, and the first boss hole has an interior in the form of a prism.

19. A stamp making apparatus according to claim 18 further comprising a second support boss disposed on, and extending upwardly from, said bottom wall of said pocket for positioning the access object in cooperation with said first support boss, and wherein the receiving member attaching portion of the access object has a second boss hole located to receive said second support boss and said second support boss is shaped relative to the second boss hole to provide a clearance relative to the second boss hole in a direction between said first support boss and said second support boss.

20. A stamp making apparatus according to claim 17 further comprising a second support boss disposed on, and extending upwardly from, said bottom wall of said pocket for positioning the access object in cooperation with said first support boss, and wherein the receiving member attaching portion of the access object has a second boss hole located to receive said second support boss and said second support boss is shaped relative to the second boss hole to provide a clearance relative to the second boss hole in a direction between said first support boss and said second support boss.

21. A stamp making apparatus according to claim 14, wherein said body of said electronic apparatus comprises an exposure system, the access object is a stamp body, and the end surface of the receiving member is arranged to be exposed to light by said exposure system to form a stamp surface.

* * * * *